(12) United States Patent
Yamamoto

(10) Patent No.: US 10,903,373 B2
(45) Date of Patent: Jan. 26, 2021

(54) CHIP DIODE AND METHOD FOR MANUFACTURING SAME

(71) Applicant: ROHM CO., LTD., Kyoto (JP)

(72) Inventor: Hiroki Yamamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/488,145

(22) Filed: Apr. 14, 2017

(65) Prior Publication Data

US 2017/0222062 A1 Aug. 3, 2017

Related U.S. Application Data

(63) Continuation of application No. 14/430,174, filed as application No. PCT/JP2013/073166 on Aug. 29, 2013, now Pat. No. 9,653,619.

(30) Foreign Application Priority Data

| Sep. 27, 2012 | (JP) | 2012-215061 |
| Sep. 27, 2012 | (JP) | 2012-215063 |
| Sep. 27, 2012 | (JP) | 2012-215064 |

(51) Int. Cl.
*H01L 29/866* (2006.01)
*H01L 29/66* (2006.01)
(Continued)

(52) U.S. Cl.
CPC ........ *H01L 29/866* (2013.01); *H01L 23/4824* (2013.01); *H01L 29/0615* (2013.01);
(Continued)

(58) Field of Classification Search
CPC .......... H01L 29/66106; H01L 29/8611; H01L 29/862; H01L 29/866; H01L 23/544;
(Continued)

(56) References Cited

U.S. PATENT DOCUMENTS 3,396,317 A * 8/1968 Vendelin ............... H01L 23/485
257/654
4,119,440 A 10/1978 Hile
(Continued)

FOREIGN PATENT DOCUMENTS

| CN | 101095222 A | 12/2007 |
| JP | S57-071186 A | 5/1982 |

(Continued)

OTHER PUBLICATIONS

Machine translation of JP 2006179518 A.*
(Continued)

*Primary Examiner* — Bryan R Junge
(74) *Attorney, Agent, or Firm* — Gregory M. Howison

(57) ABSTRACT

The present invention is directed to a chip diode with a Zener voltage Vz of 4.0 V to 5.5 V, including a semiconductor substrate having a resistivity of 3 mΩ·cm to 5 mΩ·cm and a diffusion layer formed on a surface of the semiconductor substrate and defining a diode junction region with the semiconductor substrate therebetween, in which the diffusion layer has a depth of 0.01 μm to 0.2 μm from the surface of the semiconductor substrate.

18 Claims, 53 Drawing Sheets

(51) Int. Cl.
*H01L 29/06* (2006.01)
*H01L 23/482* (2006.01)
*H01L 29/45* (2006.01)

(52) U.S. Cl.
CPC ...... *H01L 29/0657* (2013.01); *H01L 29/0696* (2013.01); *H01L 29/456* (2013.01); *H01L 29/66106* (2013.01)

(58) Field of Classification Search
CPC ....... H01L 27/0814; H01L 2924/12035; H01L 27/1021; H01L 29/6609–66159; H01L 29/861–885
See application file for complete search history.

(56) References Cited

U.S. PATENT DOCUMENTS

| | | | |
|---|---|---|---|
| 4,429,324 A | | 1/1984 | Wilkens |
| 4,732,866 A | | 3/1988 | Chruma et al. |
| 5,232,861 A | * | 8/1993 | Miwa ................ H01L 29/41783 257/E21.375 |
| 5,597,758 A | * | 1/1997 | Heim ................. H01L 27/0255 257/E29.328 |
| 5,686,750 A | * | 11/1997 | Takahashi ........... H01L 29/7805 257/328 |
| 5,847,419 A | | 12/1998 | Imai et al. |
| 6,078,090 A | * | 6/2000 | Williams ............ H01L 27/0255 257/334 |
| 6,096,608 A | * | 8/2000 | Williams ............ H01L 29/1095 257/E29.027 |
| 6,278,193 B1 | | 8/2001 | Coico et al. |
| 6,388,308 B1 | | 5/2002 | Honda et al. |
| 6,867,436 B1 | * | 3/2005 | Matteson ........... H01L 27/0814 257/106 |
| 6,900,093 B2 | | 5/2005 | Janning |
| 8,203,183 B2 | | 6/2012 | Ryu et al. |
| 2001/0050374 A1 | * | 12/2001 | Yoshitake ........... H01L 27/0255 257/104 |
| 2004/0229439 A1 | * | 11/2004 | Janning ............. H01L 29/66106 438/380 |
| 2007/0019409 A1 | | 1/2007 | Nawashiro et al. |
| 2007/0190747 A1 | | 8/2007 | Humpston et al. |
| 2007/0235745 A1 | | 10/2007 | Hayashi et al. |
| 2008/0258263 A1 | | 10/2008 | Gee et al. |
| 2010/0244194 A1 | * | 9/2010 | Masada ................ H01L 29/0619 257/605 |
| 2012/0235117 A1 | | 9/2012 | Fukui et al. |

FOREIGN PATENT DOCUMENTS

| | | | | |
|---|---|---|---|---|
| JP | S62-097325 | A | | 5/1987 |
| JP | H01-199477 | A | | 8/1989 |
| JP | H04-112580 | A | | 4/1992 |
| JP | H04-373179 | A | | 12/1992 |
| JP | H05-243442 | A | | 9/1993 |
| JP | H06-232424 | A | | 8/1994 |
| JP | H07-007163 | A | | 1/1995 |
| JP | H07-153975 | A | | 6/1995 |
| JP | H10-189761 | A | | 7/1998 |
| JP | H11-251260 | A | | 9/1999 |
| JP | 2002-270858 | A | | 9/2002 |
| JP | 2004-103738 | A | | 4/2004 |
| JP | 2005-026434 | A | | 1/2005 |
| JP | 2006-120733 | A | | 5/2006 |
| JP | 2006179518 | A | * | 7/2006 |
| JP | 2006-344858 | A | | 12/2006 |
| JP | 2007-116058 | A | | 5/2007 |
| JP | 2007-305964 | A | | 11/2007 |
| JP | 2009-170731 | A | | 7/2009 |
| JP | 2012-054280 | A | | 3/2012 |
| JP | 2012-064656 | A | | 3/2012 |
| JP | 2012-124464 | A | | 6/2012 |
| TW | 200623220 | A | | 7/2006 |
| WO | WO 2006-085492 | A1 | | 8/2006 |
| WO | WO 2011-145309 | A1 | | 11/2011 |

OTHER PUBLICATIONS

Fair, R. B. et al., 'Zener and avalanche breakdown in As-implanted low-voltage Si n—p junctions,' 1976 IEEE Transactions on Electron Devices, vol. 23 No. 5 pp. 512-518.
CN: Office Action of 201810070728.X (related application); Jul. 23, 2020; 17 pages.

* cited by examiner

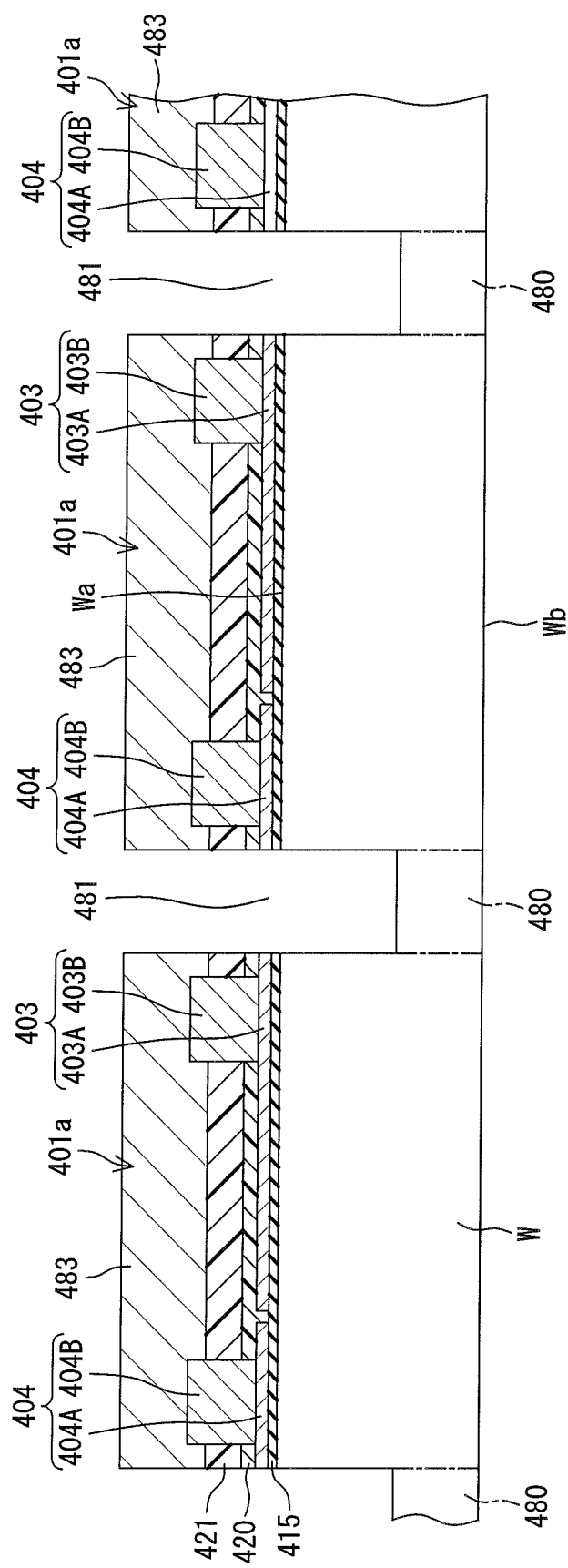

CHIP DIODE AND METHOD FOR MANUFACTURING SAME

CROSS-REFERENCE TO RELATED APPLICATIONS

This application is a continuation of application Ser. No. 14/430,174, filed on Mar. 20, 2015 (allowed on Jan. 11, 2017), which was a National Stage of application number PCT/JP2013/073166, filed on Aug. 29, 2013. Further, this application claims the benefit of priority of Japanese applications number 2012-215061, filed on Sep. 27, 2012, number 2012-215063, filed on Sep. 27, 2012, and number 2012-215064, filed on Sep. 27, 2012. The disclosures of these prior U.S. and foreign applications are incorporated herein by reference.

TECHNICAL FIELD

The present invention relates to a chip diode and a method for manufacturing thereof, and to a circuit assembly including the chip diode and an electronic device.

BACKGROUND ART

Patent Document 1 discloses a semiconductor device having a diode element. The semiconductor device includes an n-type semiconductor substrate, an n-type epitaxial layer formed on the semiconductor substrate, an n-type semiconductor region formed in the n-type epitaxial layer, a p-type semiconductor region formed on the n-type semiconductor region, an insulating film formed on the n-type epitaxial layer, an anode electrode connected through the insulating film to the p-type semiconductor region, and a cathode electrode connected to the other surface of the semiconductor substrate.

RELATED ART DOCUMENT

Patent Document

Patent Document 1: Japanese Patent Application Publication No. 2002-270858 (FIG. 18)

SUMMARY OF THE INVENTION

Problem to be Solved by the Invention

One of the principal characteristics of Zener diodes is, for example, Zener voltage Vz. Zener diodes are therefore required to provide a Zener voltage Vz as designed. It is, however, difficult to precisely control the Zener voltage Vz to be a designed value, being far from the establishment of an effective approach.

It is hence an object of the present invention to provide a chip diode in which the Zener voltage Vz can be controlled precisely to be from 4.0 V to 5.5 V and a method for manufacturing thereof.

It is another object of the present invention to provide a circuit assembly including the chip diode according to the present invention and an electronic device including such a circuit assembly.

Means for Solving the Problem

The present invention is directed to a chip diode with a Zener voltage Vz of 4.0 V to 5.5 V, including a semiconductor substrate having a resistivity of 3 mΩ·cm to 5 mΩ·cm and a diffusion layer formed on a surface of the semiconductor substrate and defining a diode junction region with the semiconductor substrate therebetween, in which the diffusion layer has a depth of 0.01 μm to 0.2 μm from the surface of the semiconductor substrate.

The chip diode according to the present invention can be manufactured in a chip diode manufacturing method including the steps of selectively introducing an impurity into a surface of a semiconductor substrate having a resistivity of 3 mΩ·cm to 5 mΩ·cm and, with the condition of the surface of the semiconductor substrate after the introduction of the impurity remain unchanged, performing an RTA (Rapid Thermal Annealing) process on the surface of the semiconductor substrate to diffuse the impurity to thereby form a diffusion layer defining a diode junction region with the semiconductor substrate therebetween and having a depth of 0.01 μm to 0.2 μm from the surface of the semiconductor substrate.

In accordance with the method above, after the introduction of the impurity, the condition of the surface of the semiconductor substrate remains unchanged with no CVD film or thermal oxide film, etc., formed in the region into which the impurity is introduced. Under the surface condition, an RTA process is then performed to diffuse the impurity, which takes only a short time compared to a drive-in process. In addition, the semiconductor substrate has a resistivity of 3 mΩ·cm to 5 mΩ·cm. This can reduce the amount of heat to be applied to the semiconductor substrate, whereby it is possible to precisely control the Zener voltage Vz of the chip diode to be from 4.0 V to 5.5 V.

The diode junction region is preferably a pn junction region. This arrangement allows for providing a pn junction-type chip diode.

It is preferred that the semiconductor substrate is composed of a p-type semiconductor substrate, and that the diffusion layer is an n-type diffusion layer defining the pn junction region with the p-type semiconductor substrate therebetween.

In accordance with the arrangement above, since the semiconductor substrate is composed of a p-type semiconductor substrate, it is possible to achieve stable characteristics without forming an epitaxial layer on the semiconductor substrate. That is, in the case of n-type semiconductor wafers, which have large in-plane resistivity variation, it is necessary to form an epitaxial layer, which has small in-plane resistivity variation on the surface and form an impurity diffusion layer on the epitaxial layer to define a pn junction. On the other hand, in the case of p-type semiconductor wafers, which have small in-plane variation, it is possible to cut a diode with stable characteristics out of any site of such a wafer without forming an epitaxial layer. Thus using a p-type semiconductor substrate can simplify the manufacturing process and reduce the manufacturing cost.

The chip diode preferably further includes a cathode electrode electrically connected to the n-type diffusion layer and an anode electrode electrically connected to the p-type semiconductor substrate, in which the cathode electrode and the anode electrode include an electrode film composed of a Ti/Al laminated film or a Ti/TiN/AlCu laminated film which is in contact with the p-type semiconductor substrate.

In accordance with the arrangement above, since the cathode electrode is an electrode film composed of a Ti/Al laminated film or a Ti/TiN/AlCu laminated film, it is possible to prevent the electrode film from spiking into the p-type semiconductor substrate through the n-type diffusion layer, which has a depth of as small as 0.01 μm to 0.2 μm. On the other hand, the Ti/Al laminated film or the Ti/TiN/ AlCu laminated film is less likely to come into ohmic contact with a p-type semiconductor. However, the semiconductor substrate according to the present invention has a resistivity of 3 mΩ·cm to 5 mΩ·cm, so that it is possible to provide a good ohmic contact between the laminated film (anode electrode) and the p-type semiconductor substrate without forming a $p^+$-type diffusion layer on the p-type semiconductor substrate.

In the manufacturing method, it is also preferred that the semiconductor substrate is composed of a p-type semiconductor substrate, and that the step of introducing the impurity includes the step of ion-implanting an n-type impurity into the surface of the semiconductor substrate.

With the method above, in the chip diode, the diffusion layer can have a concentration profile of continuous decrease to a predetermined depth from the surface of the semiconductor substrate.

In the chip diode, the surface of the semiconductor substrate preferably has a rectangular shape with round corner portions. This arrangement can reduce or prevent chipping of the corner portions of the chip diode and thereby can provide a chip diode with less possibility of poor appearance.

In the case above, a recessed portion indicating the cathode side is preferably defined in a middle portion of one of the sides of the rectangular shape.

In accordance with the arrangement above, since a recessed portion indicating the cathode side is defined in one of the sides of the rectangular semiconductor substrate, it is not necessary to define a mark indicating the cathode side (cathode mark) by, for example, marking on the surface of the semiconductor substrate. The recessed portion may be defined at the same time during the process of cutting the chip diode out of a wafer (original substrate), and also can be defined even if the chip diode may have a small size and marking is difficult. It is therefore possible to skip the step of marking and provide a sign indicating the cathode side even in a small-sized chip diode.

The present invention is also directed to a circuit assembly including a mounting substrate and the chip diode mounted on the mounting substrate. This arrangement allows for providing a circuit assembly including a chip diode with a Zener voltage Vz controlled precisely to be from 4.0 V to 5.5 V.

In the circuit assembly, the chip diode is preferably connected to the mounting substrate by wireless bonding (face-down bonding or flip-chip bonding). This arrangement can reduce the occupation space of the chip diode on the mounting substrate, contributing to high-density mounting of electronic parts.

The present invention is further directed to an electronic device including the circuit assembly and a casing housing the circuit assembly therein. This arrangement allows for providing an electronic device including a chip diode with a Zener voltage Vz controlled precisely to be from 4.0 V to 5.5 V.

BRIEF DESCRIPTION OF THE DRAWINGS

FIG. 53A is a cross-sectional view showing the configuration of the chip diode according to the preferred embodiment of Reference Example 2 at a step during the manufacturing process.

MODES FOR CARRYING OUT THE INVENTION

Preferred Embodiments of the Present Invention

Preferred embodiments of the present invention will hereinafter be described in detail with reference to the accompanying drawings.

Figure 1:
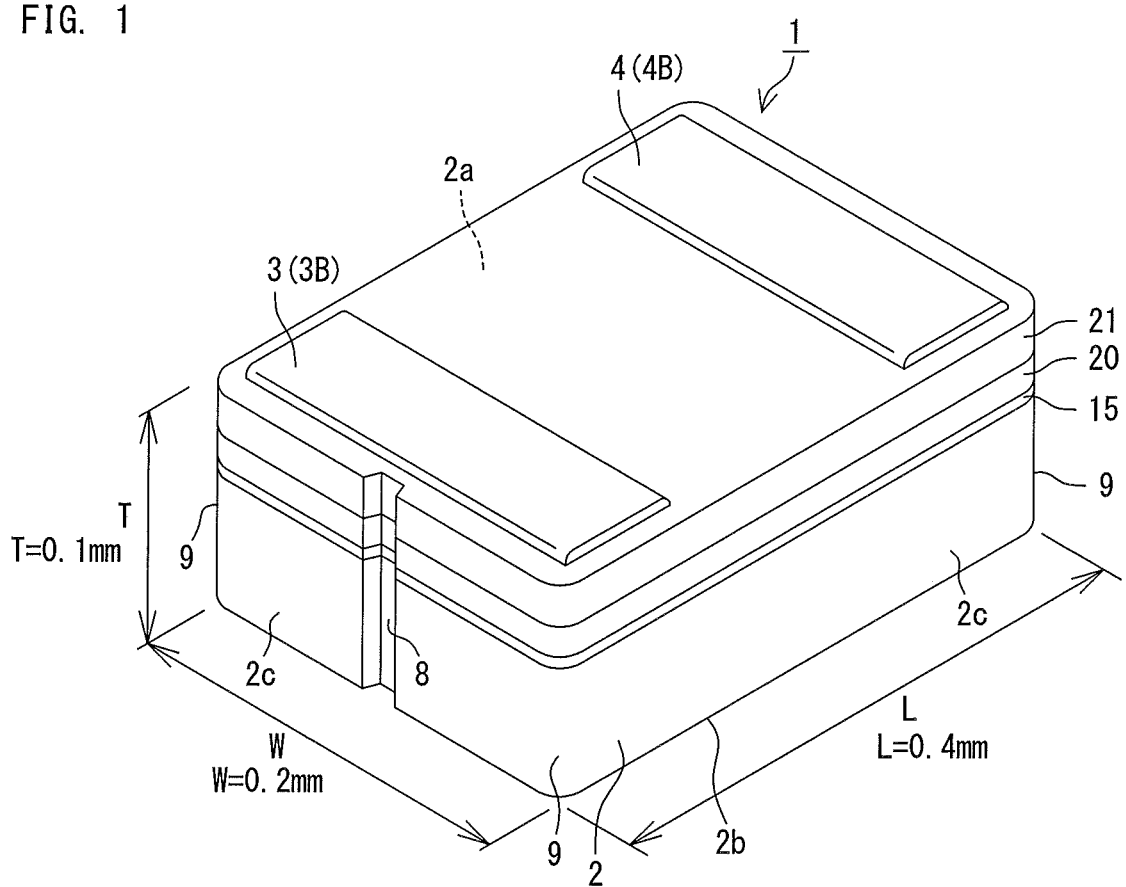
FIG. 1 is a perspective view of a chip diode according to a preferred embodiment of the present invention.
Figure 2:
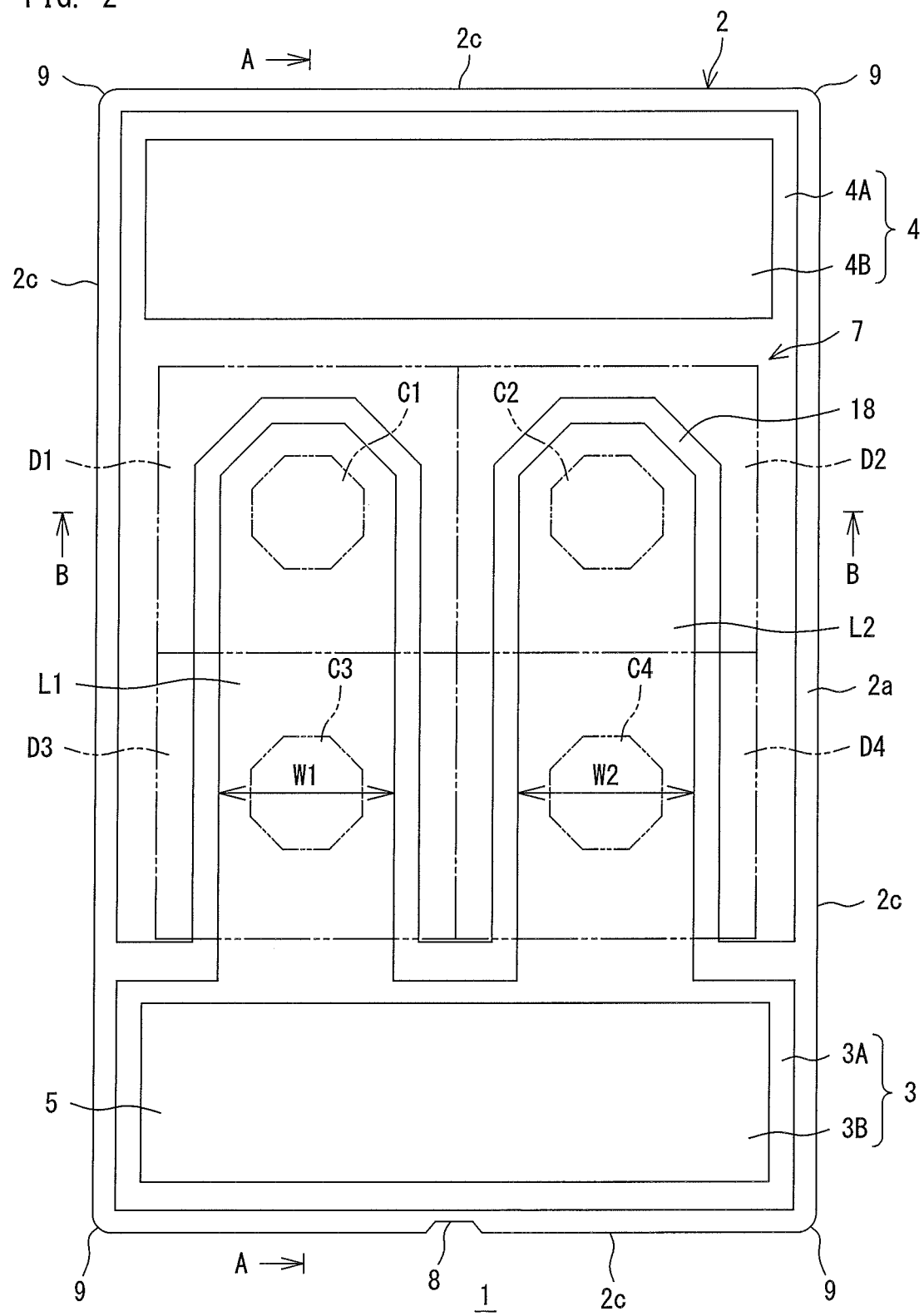
FIG. 2 is a plan view of the chip diode according to the preferred embodiment.
Figure 3:
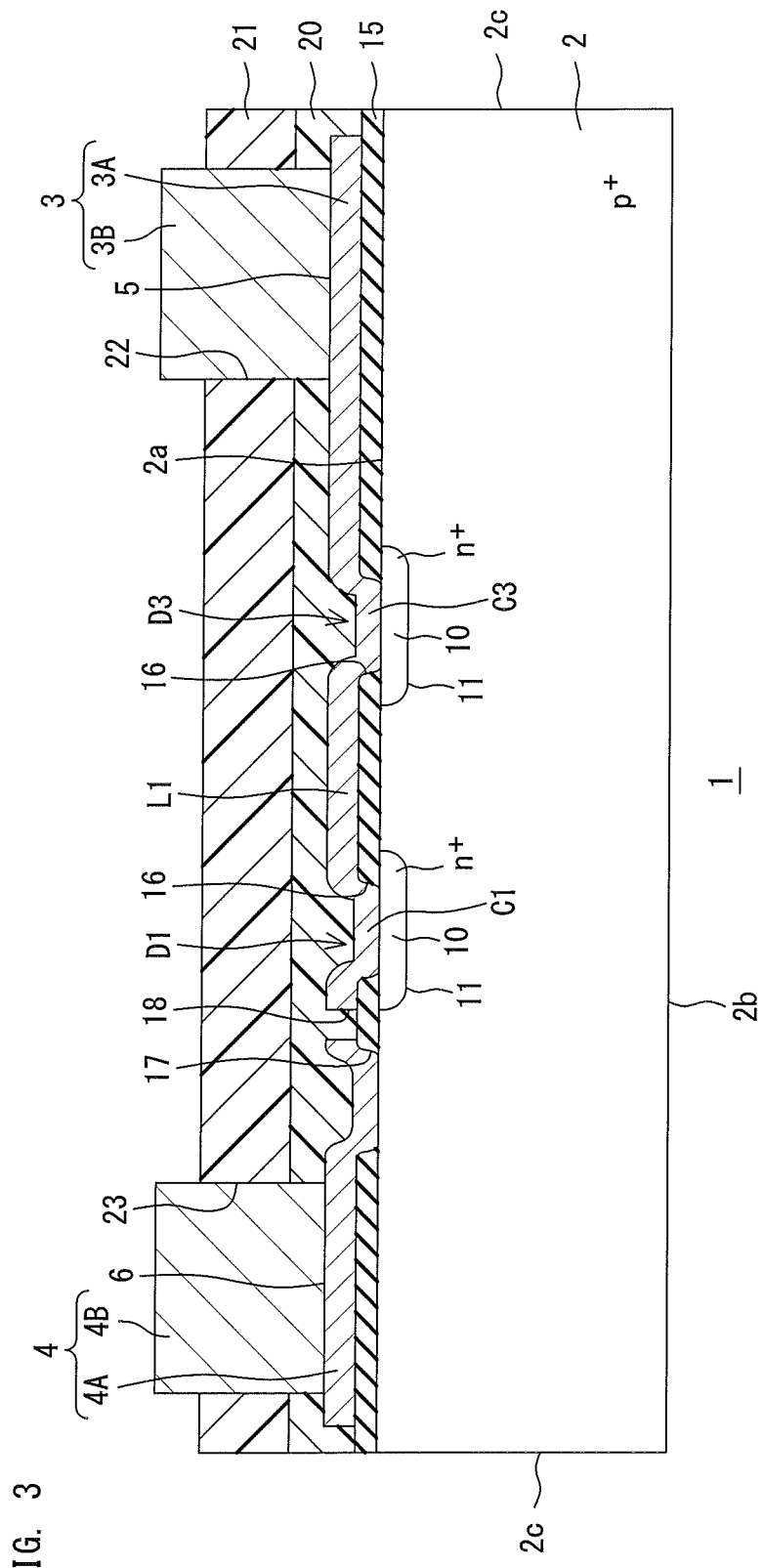
FIG. 3 is a cross-sectional view taken along the line A-A in FIG. 2.
Figure 4:
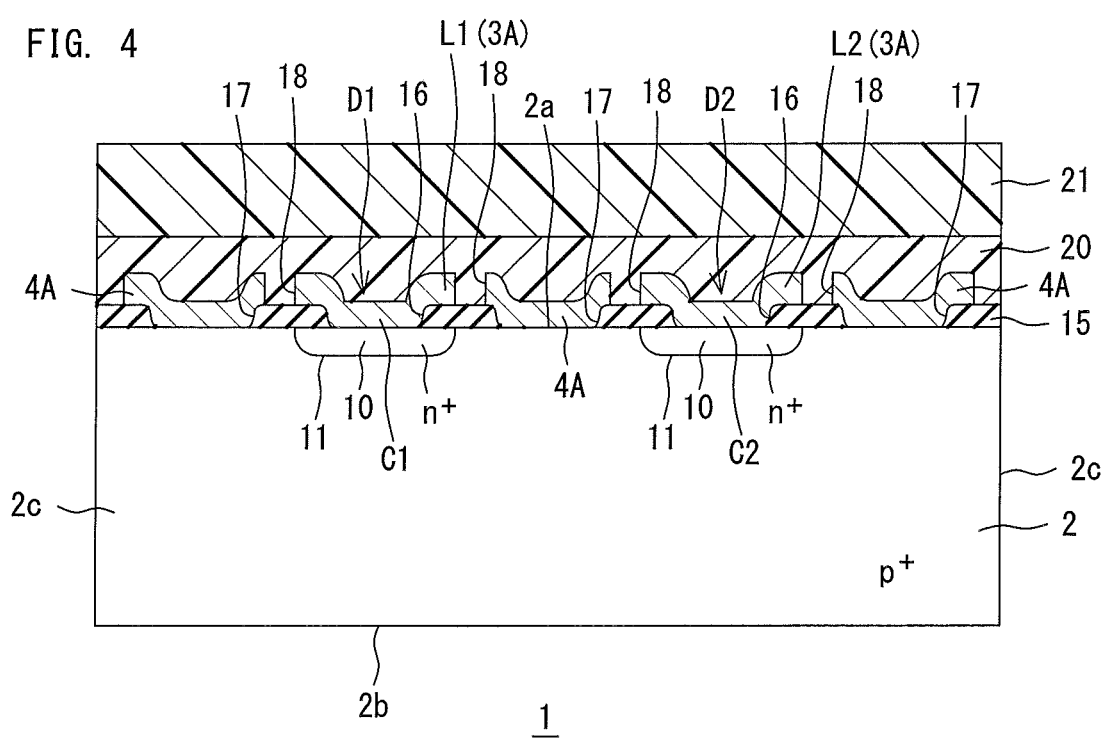
FIG. 4 is a cross-sectional view taken along the line B-B in FIG. 2.

FIG. 1 is a perspective view of a chip diode according to a preferred embodiment of the present invention. FIG. 2 is a plan view of the chip diode. FIG. 3 is a cross-sectional view taken along the line A-A in FIG. 2. FIG. 4 is a cross-sectional view taken along the line B-B in FIG. 2.

The chip diode 1 includes a $p^+$-type semiconductor substrate 2 (silicon substrate, for example), multiple diode cells D1 to D4 formed on the semiconductor substrate 2, and a cathode electrode 3 and an anode electrode 4 connecting the multiple diode cells D1 to D4 in parallel.

The semiconductor substrate 2 has a resistivity of 3 mΩ·cm to 5 mΩ·cm.

The semiconductor substrate 2 includes a pair of principal surfaces 2a, 2b and multiple side surfaces 2c orthogonal to the pair of principal surfaces 2a, 2b, one (principal surface 2a) of the pair of principal surfaces 2a, 2b being a device forming surface. The principal surface 2a will hereinafter be referred to as "device forming surface 2a." The device forming surface 2a is formed in a rectangular shape in a plan view and, for example, the longer sides may have a length L of about 0.4 mm and the shorter sides may have a length W of about 0.2 mm. The chip diode 1 may also have a total thickness T of about 0.1 mm. An external connection electrode 3B of the cathode electrode 3 and an external connection electrode 4B of the anode electrode 4 are disposed, respectively, in end portions of the device forming surface 2a. A diode cell region 7 is provided on the device forming surface 2a between the external connection electrodes 3B, 4B.

A cutout recessed portion 8 extending in the thickness direction of the semiconductor substrate 2 is defined in one of the side surfaces 2c coupled to one short side (closer to the cathode external connection electrode 3B in this preferred embodiment) of the device forming surface 2a. The recessed portion 8 extends throughout the thickness of the semiconductor substrate 2 in this preferred embodiment. In a plan view, the recessed portion 8 is recessed inward from the short side of the device forming surface 2a and, in this preferred embodiment, has a trapezoidal shape tapered toward the interior of the device forming surface 2a. It will be understood that the planar geometry is illustrative only, and a rectangular shape, a triangular shape, or a recessed curved shape such as a partially circular shape (arc shape, for example) may be employed. The recessed portion 8 indicates the orientation of the chip diode 1 (chip orientation). More specifically, the recessed portion 8 provides a cathode mark that indicates the location of the cathode external connection electrode 3B. This provides a structure with which the polarity can be determined based on the appearance when the chip diode 1 is mounted.

The semiconductor substrate 2 has four corner portions 9 at four corners each corresponding to the intersection of a pair of mutually adjacent ones of the four side surfaces 2c. The four corner portions 9 are formed roundly in this preferred embodiment. The corner portions 9 each have an outward convex smooth curved surface in a plan view in the normal direction of the device forming surface 2a. This provides a structure with which chipping can be reduced when the chip diode 1 is manufactured and mounted.

The diode cell region 7 is formed in a rectangular shape in this preferred embodiment. The multiple diode cells D1 to D4 are disposed within the diode cell region 7. The number of the multiple diode cells D1 to D4 is four in this preferred embodiment, which are arranged two-dimensionally at equal spaces in a matrix manner along the longer sides and the shorter sides of the semiconductor substrate 2.

Figure 5:
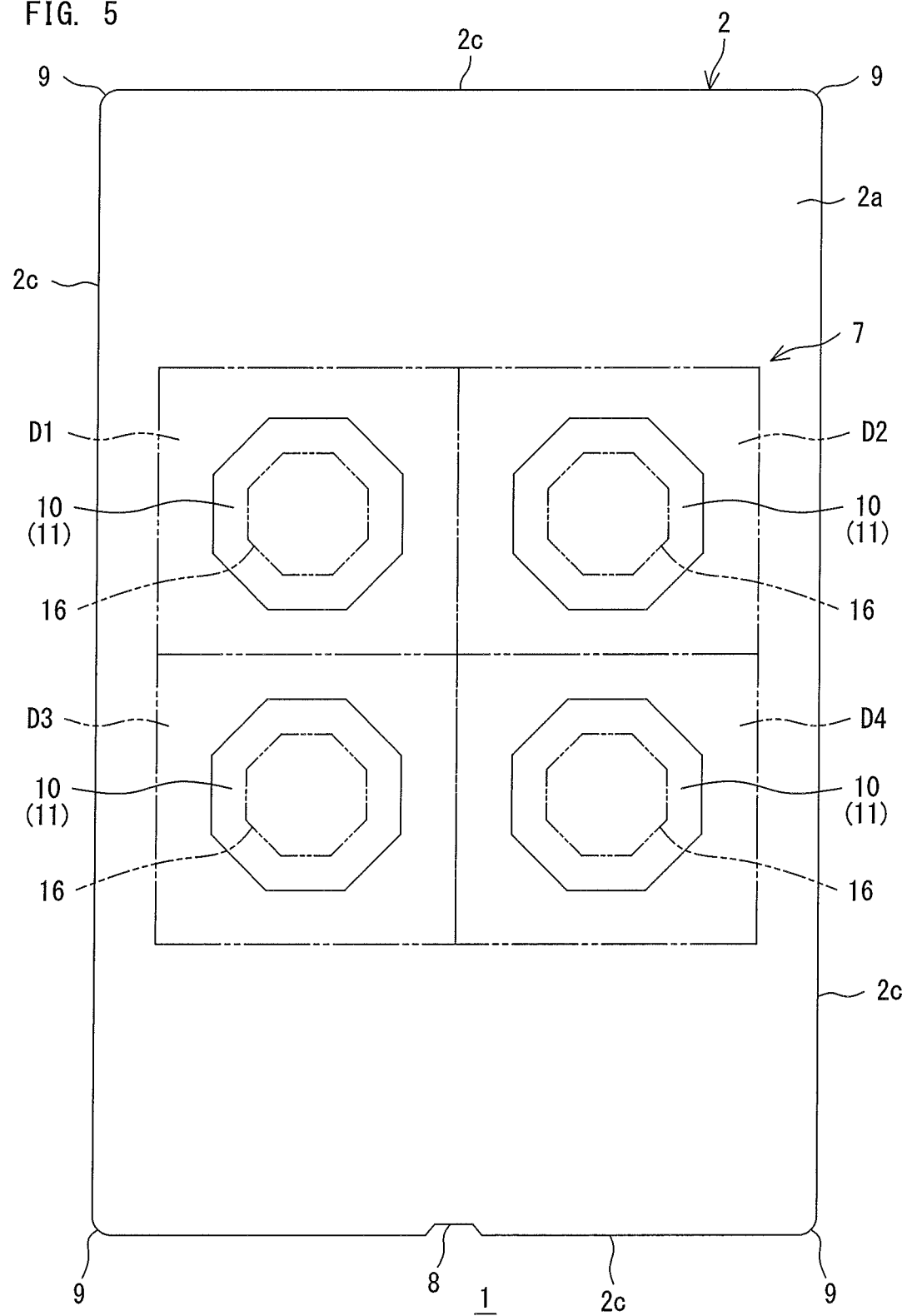
FIG. 5 is a plan view showing the structure of a surface of a semiconductor substrate excluding a cathode electrode, an anode electrode, and components formed thereon in the chip diode according to the preferred embodiment.

FIG. 5 is a plan view showing the structure of the surface (device forming surface 2a) of the semiconductor substrate 2 excluding the cathode electrode 3, the anode electrode 4, and the components formed thereon. Within each region of the diode cells D1 to D4, an n$^+$-type region 10 is formed in a surficial region of the p$^+$-type semiconductor substrate 2. The n$^+$-type regions 10 are separated for each diode cell. Accordingly, the diode cells D1 to D4, respectively, have pn junction regions 11 separated for each diode cell.

The multiple diode cells D1 to D4 are formed in the same shape, specifically a rectangular shape of the same size in this preferred embodiment and, within the rectangular region of each diode cell, the n$^+$-type region 10 is formed in a polygonal shape. In this preferred embodiment, the n$^+$-type region 10 is formed in a regular octagon having four sides along the respective four sides of the rectangular region of each of the diode cells D1 to D4 and four sides opposed to the respective four corner portions of the rectangular region of each of the diode cells D1 to D4.

As shown in FIGS. 3 and 4, each n$^+$-type region 10 has a depth of 0.01 μm to 0.2 μm at its deepest portion from the device forming surface 2a. An insulating film 15 composed of an oxide film (not shown in FIG. 2) is formed on the device forming surface 2a of the semiconductor substrate 2. In the insulating film 15, contact holes 16 (cathode contact holes) for exposure of the surface of the n$^+$-type regions 10 of the respective diode cells D1 to D4 therethrough and contact holes 17 (anode contact holes) for exposure of the device forming surface 2a therethrough are defined. The bottom of the contact holes 16, 17 is approximately coplanar with the interface between the insulating film 15 and the device forming surface 2a.

The cathode electrode 3 and the anode electrode 4 are formed on the surface of the insulating film 15. The cathode electrode 3 includes a cathode electrode film 3A formed on the surface of the insulating film 15 and an external connection electrode 3B joined to the cathode electrode film 3A. The cathode electrode film 3A has a lead-out electrode L1 connected to the multiple diode cells D1, D3, a lead-out electrode L2 connected to the multiple diode cells D2, D4, and a cathode pad 5 formed integrally with the lead-out electrodes L1, L2 (cathode lead-out electrodes). The cathode pad 5 is formed in a rectangular shape in one end portion of the device forming surface 2a. The external connection electrode 3B is connected to the cathode pad 5. The external connection electrode 3B is thus connected in common to the lead-out electrodes L1, L2. The cathode pad 5 and the external connection electrode 3B constitute an external connection portion of the cathode electrode 3 (cathode external connection portion).

The anode electrode 4 includes an anode electrode film 4A formed on the surface of the insulating film 15 and an external connection electrode 4B joined to the anode electrode film 4A. The anode electrode film 4A is connected to the p$^+$-type semiconductor substrate 2 and has an anode pad 6 in the vicinity of one end portion of the device forming surface 2a. The anode pad 6 is formed of a region of the anode electrode film 4A disposed in one end portion of the device forming surface 2a. The external connection electrode 4B is connected to the anode pad 6. The anode pad 6 and the external connection electrode 4B constitute an external connection portion of the anode electrode 4 (anode external connection portion). The region of the anode electrode film 4A excluding the anode pad 6 includes anode lead-out electrodes led out through the respective anode contact holes 17.

The lead-out electrode L1 runs on the surface of the insulating film 15 to enter the contact holes 16 of the respective diode cells D1, D3 and, within the contact holes 16, come into ohmic contact with the n$^+$-type regions 10 of the respective diode cells D1, D3. The portions of the lead-out electrode L1 connected to the respective diode cells D1, D3 within the contact holes 16 constitute cell connection portions C1, C3, respectively. Similarly, the lead-out electrode L2 runs on the surface of the insulating film 15 to enter the contact holes 16 of the respective diode cells D2, D4 and, within the contact holes 16, come into ohmic contact with the n+-type regions 10 of the respective diode cells D2, D4. The portions of the lead-out electrode L2 connected to the respective diode cells D2, D4 within the contact holes 16 constitute cell connection portions C2, C4, respectively. The anode electrode film 4A runs on the surface of the insulating film 15 to extend into the contact holes 17 and, within the contact holes 17, come into ohmic contact with the p+-type semiconductor substrate 2. The cathode electrode film 3A and the anode electrode film 4A are composed of the same material in this preferred embodiment.

The electrode films employ a Ti/Al laminated film or a Ti/TiN/AlCu laminated film in this preferred embodiment.

The Ti/Al laminated film includes a lower Ti film and an upper Al film. Also, the Ti/TiN/AlCu laminated film includes a Ti film (having a thickness of 300 to 400 Å, for example), a TiN film (having a thickness of about 1000 Å, for example), and an AlCu film (having a thickness of about 30000 Å, for example) laminated in this order on the semiconductor substrate 2.

The cathode electrode film 3A and the anode electrode film 4A are separated with a slit 18 therebetween. The lead-out electrode L1 is formed linearly along the line extending from the diode cell D1 through the diode cell D3 to the cathode pad 5. Similarly, the lead-out electrode L2 is formed linearly along the line extending from the diode cell D2 through the diode cell D4 to the cathode pad 5. The lead-out electrodes L1, L2 have uniform widths W1, W2, respectively, everywhere from the n+-type regions 10 to the cathode pad 5. The widths W1, W2 are greater than the width of the cell connection portions C1, C2, C3, C4. The width of the cell connection portions C1, C2, C3, C4 is defined by the length of the lead-out electrodes L1, L2 in the direction orthogonal to the lead-out direction. The leading end portions of the lead-out electrodes L1, L2 are shaped to match the planar geometry of the n+-type regions 10. The base end portions of the lead-out electrodes L1, L2 are connected to the cathode pad 5. The slit 18 is formed in a manner following the edges of the lead-out electrodes L1, L2. On the other hand, the anode electrode film 4A is formed on the surface of the insulating film 15 in a manner surrounding the cathode electrode film 3A with spaces provided therein correspondingly to the slit 18 having an approximately constant width. The anode electrode film 4A integrally has a comb-shaped portion extending along the longer sides of the device forming surface 2a and the rectangular anode pad 6.

The cathode electrode film 3A and the anode electrode film 4A are covered with a passivation film 20 composed of, for example, a nitride film (not shown in FIG. 2), and further a resin film 21 such as polyimide is formed on the passivation film 20. A pad opening 22 for exposure of the cathode pad 5 and a pad opening 23 for exposure of the anode pad 6 are formed in a manner penetrating through the passivation film 20 and the resin film 21. The pad openings 22, 23 are filled with the external connection electrodes 3B, 4B. The passivation film 20 and the resin film 21 constitute a protective film that reduces or prevents moisture intrusion into the lead-out electrodes L1, L2 and the pn junction regions 11 as well as absorbs an external shock and the like to contribute to improvement in the durability of the chip diode 1.

The external connection electrodes 3B, 4B may have a surface at a level lower than the surface of the resin film 21 (closer to the semiconductor substrate 2) or may protrude from the surface of the resin film 21, that is, have a surface at a level higher than the resin film 21 (farther from the semiconductor substrate 2). FIG. 3 shows an example of the external connection electrodes 3B, 4B protruding from the surface of the resin film 21. The external connection electrodes 3B, 4B may be composed of, for example, an Ni/Pd/Au laminated film including an Ni film in contact with the electrode films 3A, 4A, a Pd film formed thereon, and an Au film formed thereon. Such a laminated film can be formed by plating.

In each of the diode cells D1 to D4, the pn junction region 11 is defined between the p-type semiconductor substrate 2 and the n+-type region 10, which accordingly forms a pn junction diode. The n+-type regions 10 of the multiple diode cells D1 to D4 are then connected in common to the cathode electrode 3, and the p+-type semiconductor substrate 2, which is a p-type region common to the diode cells D1 to D4, is connected in common to the anode electrode 4. All the multiple diode cells D1 to D4 formed on the semiconductor substrate 2 are thus connected in parallel.

Figure 6:
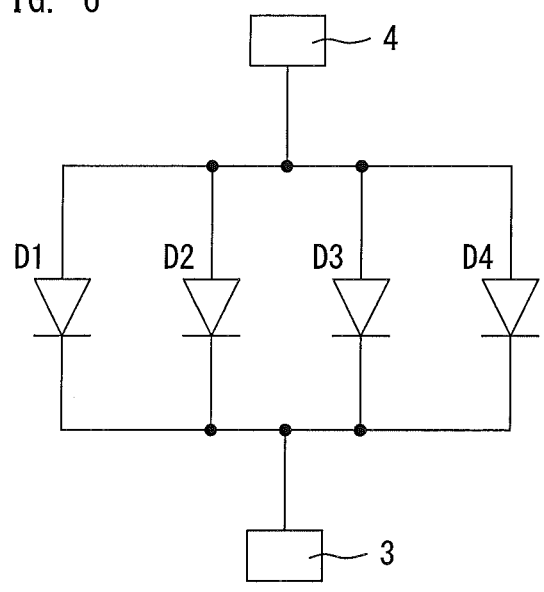
FIG. 6 is an electric circuit diagram showing the electrical structure of the inside of the chip diode according to the preferred embodiment.

FIG. 6 is an electric circuit diagram showing the electrical structure of the inside of the chip diode 1. The pn junction diodes configured by the respective diode cells D1 to D4 are connected, in parallel, with the cathodes connected in common with the cathode electrode 3 and the anodes connected in common with the anode electrode 4, thus totally serving as a single diode.

In accordance with the arrangement of this preferred embodiment, the chip diode 1 has the multiple diode cells D1 to D4, and each of the diode cells D1 to D4 in turn has the pn junction region 11. The pn junction regions 11 are separated for each of the diode cells D1 to D4. In the chip diode 1, this results in an increase in the perimeters of the pn junction regions 11, that is, the total perimeters (total extensions) of the n+-type regions 10 in the semiconductor substrate 2. The electric field can thereby be dispersed and prevented from concentrating in the vicinities of the pn junction regions 11, and the ESD tolerance can thus be improved. That is, even when the chip diode 1 is to be formed in a small size, the total perimeters of the pn junction regions 11 can be increased, enabling both size reduction of the chip diode 1 and securing of the ESD tolerance.

Figure 7:
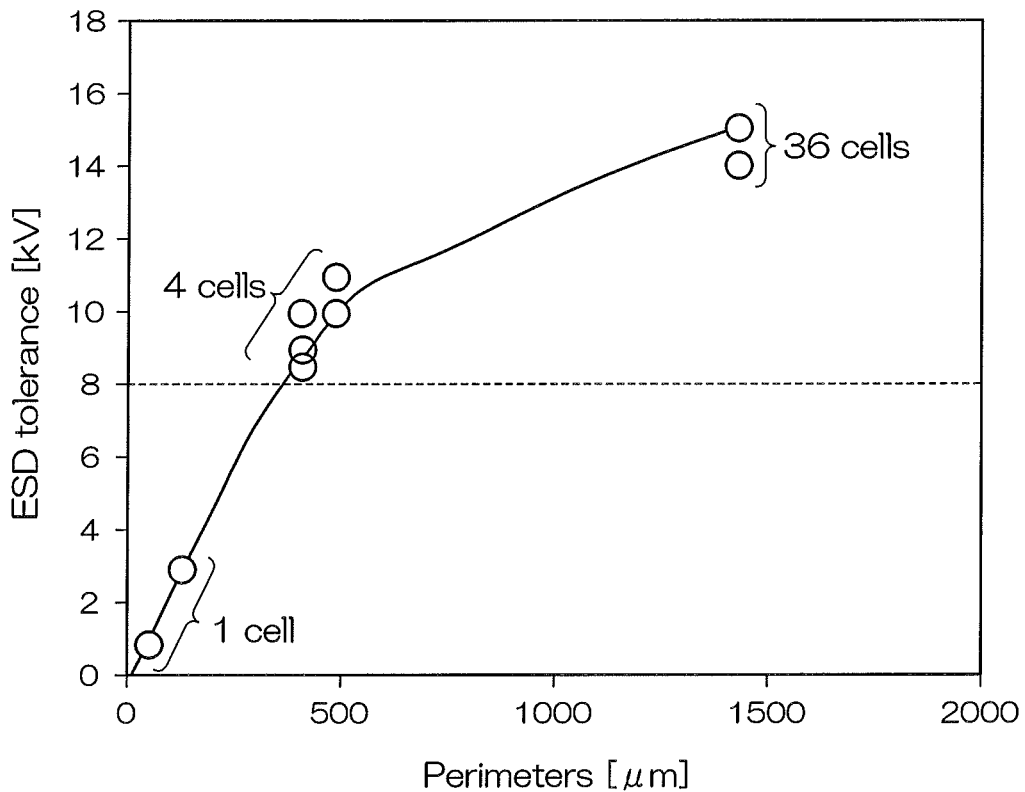
FIG. 7 shows results of an experiment measuring the ESD tolerance of multiple samples having their respective different total perimeters (total extensions) of pn junction regions for various sizes and/or numbers of diode cells formed on a semiconductor substrate of the same area.

FIG. 7 shows results of an experiment measuring the ESD tolerance of multiple samples having their respective different total perimeters (total extensions) of pn junction regions for various sizes and/or numbers of diode cells formed on a semiconductor substrate of the same area. The experimental results show that the greater the perimeters of the pn junction regions, the higher the ESD tolerance becomes. When four or more diode cells were formed on a semiconductor substrate, an ESD tolerance of higher than 8 kV was achieved.

Further, in this preferred embodiment, the widths W1, W2 of the lead-out electrodes L1, L2 are greater than the width of the cell connection portions C1 to C4 everywhere from the cell connection portions C1 to C4 to the cathode pad 5. This allows the allowable amount of current to be enlarged and the electromigration to be reduced to improve the high-current reliability. That is, it is possible to provide a chip diode with a small size having a high ESD tolerance and securing high-current reliability.

Also, in this preferred embodiment, the multiple diode cells D1, D3 and D2, D4 arranged linearly toward the cathode pad 5 are connected to the cathode pad 5 through the respective common linear lead-out electrodes L1, L2. This allows the length of the lead-out electrodes from the diode cells D1 to D4 to the cathode pad 5 to be minimized and thereby the electromigration to be reduced more effectively. In addition, since the multiple diode cells D1, D3 and D2, D4 can share the respective lead-out electrodes L1, L2, it is possible to layout the wide lead-out electrodes on the semiconductor substrate 2 while thus forming the multiple diode cells D1 to D4 to increase the perimeters of the diode junction regions (pn junction regions 11). This allows for both further improvement in the ESD tolerance and reduction in the electromigration for further improvement in reliability.

Further, since the end portions of the lead-out electrodes L1, L2 have a partially polygonal shape to match the geometry (polygon) of the n$^+$-type regions 10, the lead-out electrodes L1, L2 with a reduced occupation area can be connected to the n$^+$-type regions 10.

Figure 8:
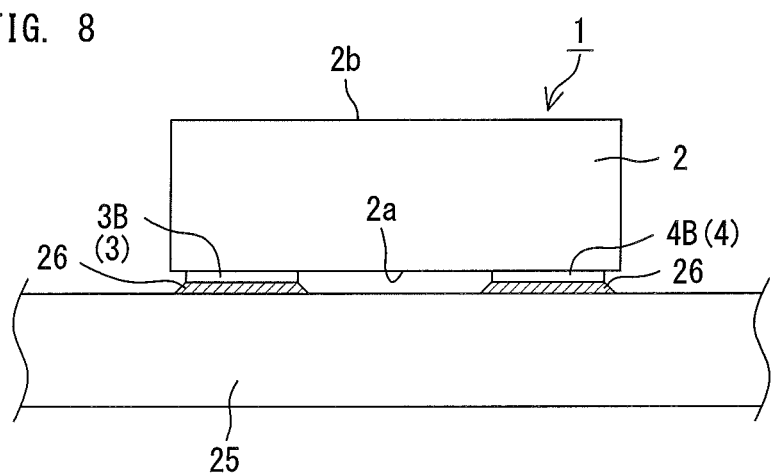
FIG. 8 is a cross-sectional view showing the configuration of a circuit assembly in which the chip diode according to the preferred embodiment is flip-chip connected onto a mounting substrate.

Furthermore, both the cathode and the anode external connection electrodes 3B, 4B are formed on the device forming surface 2a, one of the surfaces of the semiconductor substrate 2. Hence, as shown in FIG. 8, facing the device forming surface 2a toward a mounting substrate 25 and bonding the external connection electrodes 3B, 4B by soldering 26 onto the mounting substrate 25 allows a circuit assembly to be configured in which the chip diode 1 is surface-mounted on the mounting substrate 25. That is, the chip diode 1 of a flip-chip connection type can be provided and connected by wireless bonding to the mounting substrate 25, specifically by face-down bonding in which the device forming surface 2a is faced toward the mounting surface of the mounting substrate 25. This can reduce the occupation space of the chip diode 1 on the mounting substrate 25. It is particularly possible to achieve a reduction in the height of the chip diode 1 on the mounting substrate 25. As a result, it is possible to make use of the space in the casing of a small electronic device or the like, contributing to high-density mounting and size reduction.

Also, in this preferred embodiment, the insulating film 15 is formed on the semiconductor substrate 2, and the cell connection portions C1 to C4 of the lead-out electrodes L1, L2 are connected to the respective diode cells D1 to D4 via the contact holes 16 formed in the insulating film 15. The cathode pad 5 is then disposed on the insulating film 15 in a region outside the contact holes 16. That is, the cathode pad 5 is provided at a position distant from the regions immediately above the pn junction regions 11. The anode electrode film 4A is also connected to the semiconductor substrate 2 via the contact holes 17 formed in the insulating film 15, and the anode pad 6 is disposed on the insulating film 15 in a region outside the contact holes 17. The anode pad 6 is also provided at a position distant from the regions immediately above the pn junction regions 11. This can prevent a large shock acting on the pn junction regions 11 when the chip diode 1 is mounted on the mounting substrate 25. It is therefore possible to prevent the pn junction regions 11 from being damaged and thereby to achieve a chip diode having good durability against an external force. Another arrangement may be employed in which the cathode pad 5 and the anode pad 6 are provided, respectively, as a cathode external connection portion and an anode connection portion without providing the external connection electrodes 3B, 4B and bonding wires are connected to the cathode pad 5 and the anode pad 6. Also in this case, it is possible to prevent the pn junction regions 11 from being damaged due to a shock during the wire bonding.

Also, in this preferred embodiment, the cathode electrode film 3A and the anode electrode film 4A are composed of a Ti/Al laminated film or a Ti/TiN/AlCu laminated film. Since the electrode films employ such a laminated film, it is possible to prevent the cathode electrode film 3A from spiking into the p$^+$-type semiconductor substrate 2 through the n$^+$-type region 10, which has a depth of as small as 0.01 µm to 0.2 µm. On the other hand, the Ti/Al laminated film or the Ti/TiN/AlCu laminated film is less likely to come into ohmic contact with a p-type semiconductor. However, in this preferred embodiment, the semiconductor substrate 2 has a relatively low resistivity of 3 mΩ·cm to 5 mΩ·cm, so that it is possible to provide a good ohmic contact between the laminated film (anode electrode film 4A) and the p$^+$-type semiconductor substrate 2 without forming a p$^+$-type diffusion layer on the semiconductor substrate 2.

Further, in this preferred embodiment, the semiconductor substrate 2 has a rectangular shape with round corner portions 9. This can reduce or prevent chipping of the corner portions of the chip diode 1 and thereby can provide a chip diode 1 with less possibility of poor appearance.

Furthermore, in this preferred embodiment, since the recessed portion 8 indicating the cathode side is defined in the short side of the semiconductor substrate 2 closer to the cathode external connection electrode 3B, there is no need to define a cathode mark on the other surface (principal surface opposite to the device forming surface 2a) of the semiconductor substrate 2. The recessed portion 8 may be defined at the same time during the process of cutting the chip diode 1 out of a wafer (original substrate), and also can be defined to indicate the cathode side even if the chip diode 1 may have a small size and marking is difficult. It is therefore possible to skip the step of marking and provide a cathode mark even in a small-sized chip diode 1.

Figure 9:
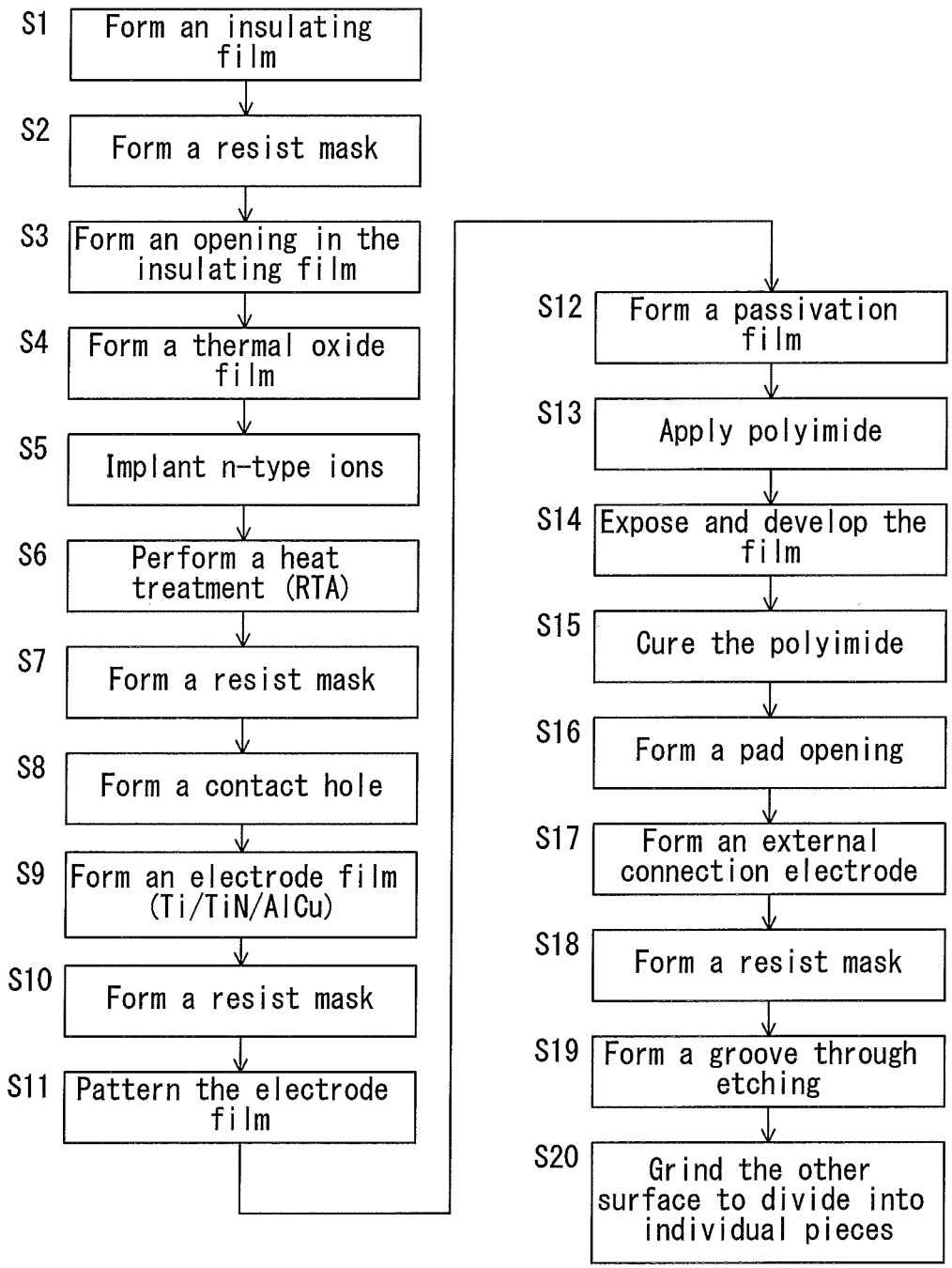
FIG. 9 is a process chart for illustrating an exemplary process of manufacturing the chip diode according to the preferred embodiment.
Figure 10A:
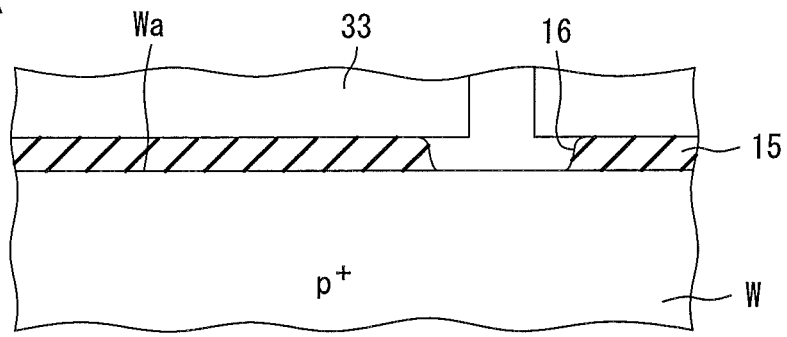
FIGS. 10A to 10E are cross-sectional views showing the configuration of the chip diode according to the preferred embodiment at steps during the manufacturing process.
Figure 10B:
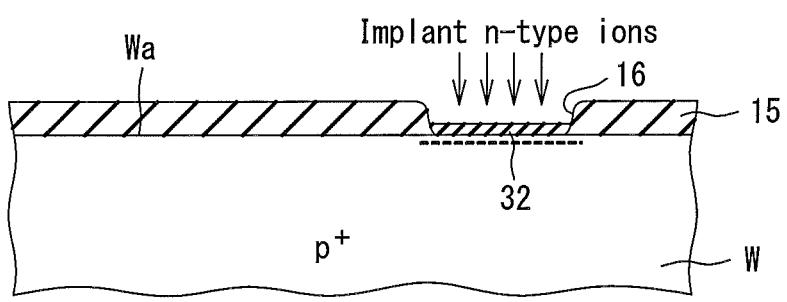
Figure 10C:
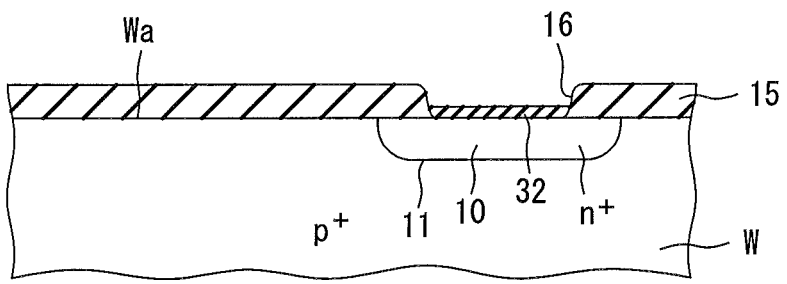
Figure 10D:
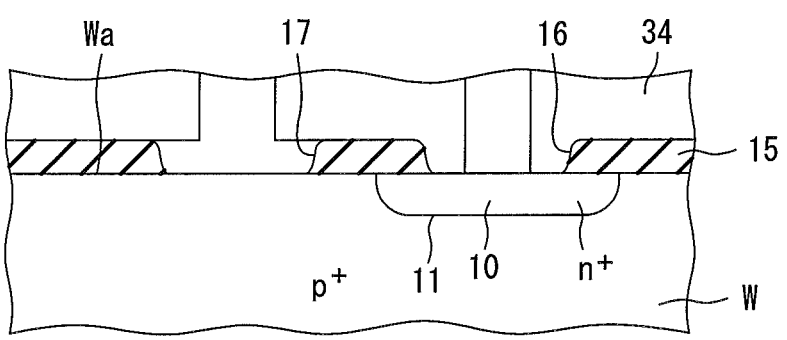
Figure 10E:
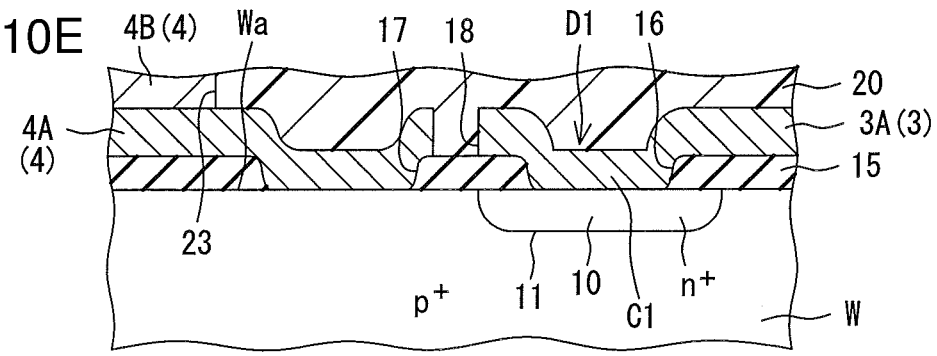
Figure 11A:
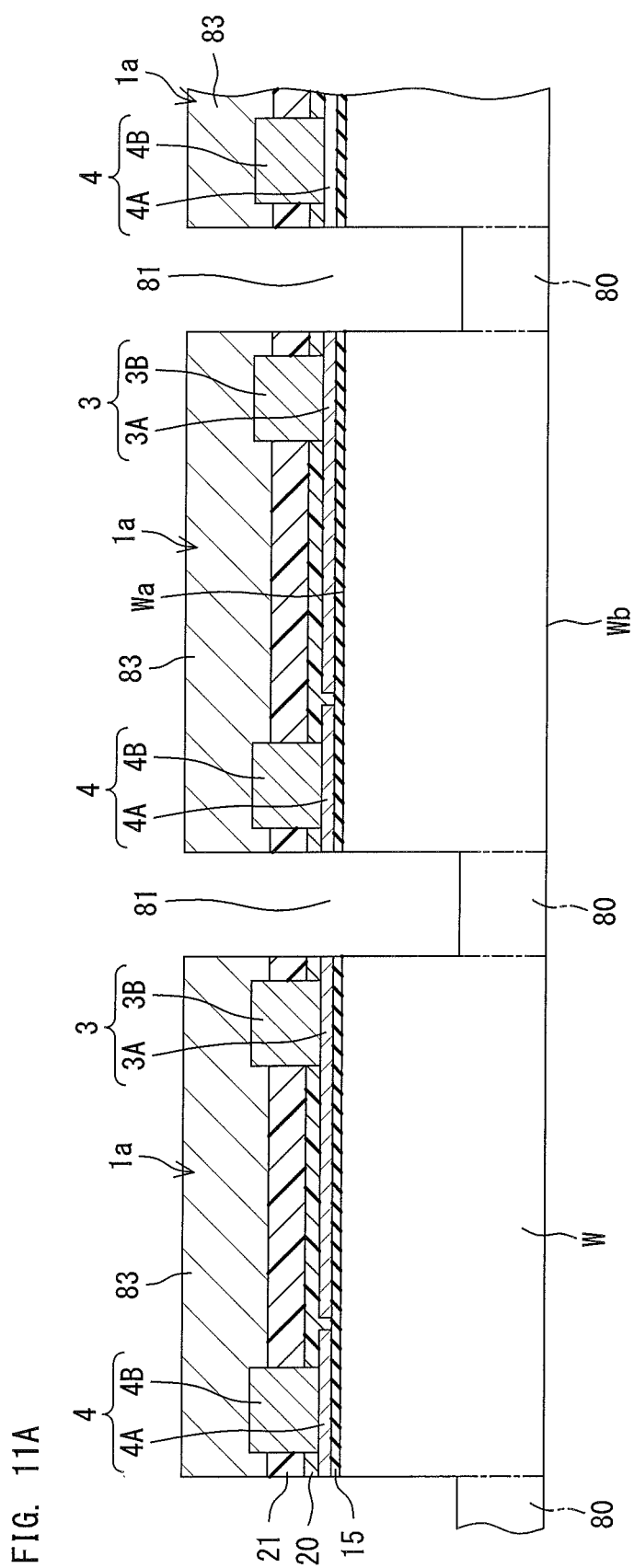
FIG. 11A is a cross-sectional view showing the configuration of the chip diode according to the preferred embodiment at a step during the manufacturing process.
Figure 11B:
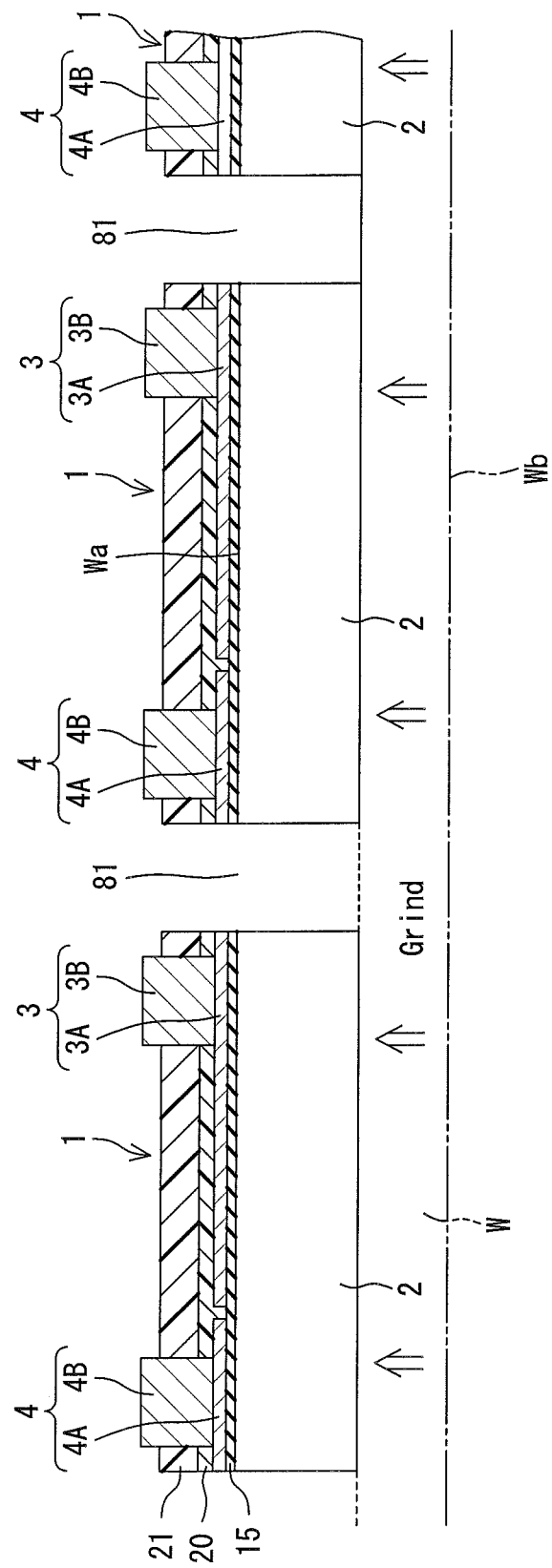
FIG. 11B is a cross-sectional view showing the configuration at a step following the step of FIG. 11A.
Figure 12:
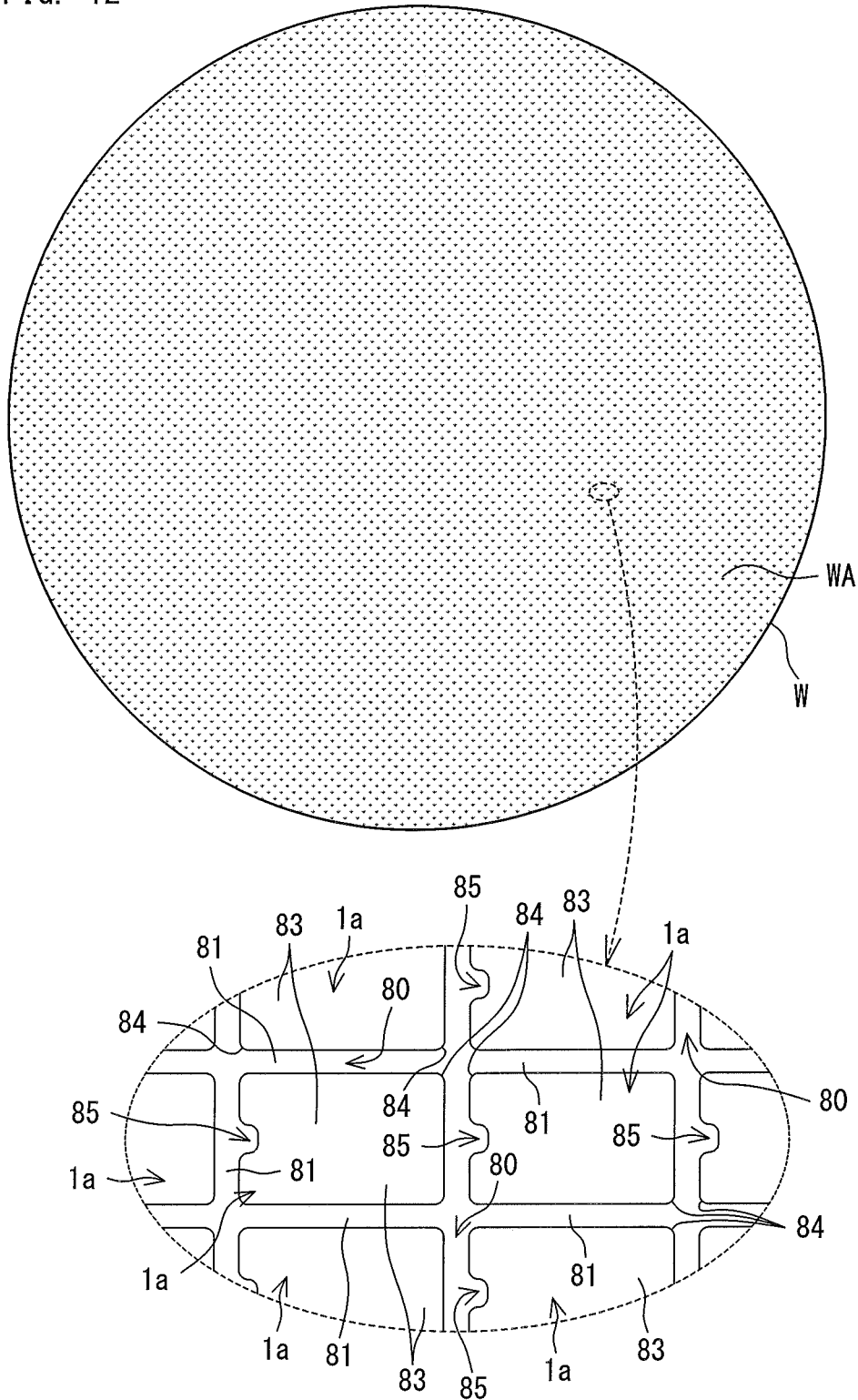
FIG. 12 is a plan view of a semiconductor wafer serving as an original substrate for the semiconductor substrate of the chip diode, partially showing a region in an enlarged manner.

FIG. 9 is a process chart for illustrating an exemplary process of manufacturing the chip diode 1. FIGS. 10 (a) to 10 (e) are cross-sectional views showing the configuration of the chip diode according to the preferred embodiment at steps during the manufacturing process. FIGS. 11A and 11B are cross-sectional views showing the configuration at steps during the manufacturing process in FIG. 9, showing sections corresponding to FIG. 3. FIG. 12 is a plan view of a p$^+$-type semiconductor wafer W serving as an original substrate for the semiconductor substrate 2, partially showing a region in an enlarged manner.

First, a p$^+$-type semiconductor wafer W is provided as an original substrate for the semiconductor substrate 2. One of the surfaces of the semiconductor wafer W is a device forming surface Wa corresponding to the device forming surface 2a of the semiconductor substrate 2. On the device forming surface Wa, multiple chip diode regions 1a corresponding to multiple chip diodes 1 are arranged and set in a matrix manner. A boundary region 80 is provided between adjacent ones of the chip diode regions 1a. The boundary region 80 is a band-shaped region having an approximately constant width and extends in two orthogonal directions to form a grid. After performing necessary steps on the semiconductor wafer W, the semiconductor wafer W is cut apart along the boundary region 80 to obtain multiple chip diodes 1.

Exemplary steps to be performed on the semiconductor wafer W are as follows.

First, as shown in FIG. 10 (a), an insulating film 15 composed of a thermal oxide film is formed on the device forming surface Wa of the p$^+$-type semiconductor wafer W (S1), and a resist mask 33 is formed on the film (S2). Through etching using the resist mask 33, an opening (contact hole 16) corresponding to the n$^+$-type region 10 is formed in the insulating film 15 (S3).

Next, as shown in FIG. 10 (b), after the resist mask 33 is peeled off, a thermal oxide film 32 for reduction of ion implantation damage is formed, as necessary, on the entire device forming surface Wa exposed through the contact hole 16 (S4). Since the thermal oxide film 32 is relatively thin, there is no possibility that during its thermal oxidation, the thermal oxide film 32 transforms silicon in the vicinity of the device forming surface Wa of the semiconductor wafer W into oxide silicon to grow toward the other surface so that a recessed portion continuing to the contact hole 16 is formed in the device forming surface Wa. Next, n-type impurity ions (phosphorous ions, for example) are implanted into a surficial portion of the semiconductor wafer W exposed through the contact hole 16 that is formed in the insulating film 15 (S5).

Next, as shown in FIG. 10 (c), with the condition of the device forming surface Wa after the implantation of the ions remain unchanged, that is, without performing a treatment (thermal oxidation, CVD, etc.) in which heat can be applied to the semiconductor wafer W, a heat treatment (RTA) for activation of the impurity ions introduced into the semiconductor wafer W is performed (S6). The conditions (temperature and duration) of the RTA process can be selected according to a targeted depth of the $n^+$-type region 10. The $n^+$-type region 10 is thus formed in the surficial portion of the semiconductor wafer W.

Next, as shown in FIG. 10 (d), another resist mask 34 having openings corresponding to the contact holes 16, 17 is formed on the insulating film 15 (S7). Through etching using the resist mask 34, the contact hole 17 is formed in the insulating film 15 and the thermal oxide film 32 within the contact hole 16 is removed (S8). Thereafter, the resist mask 34 is peeled off.

Next, as shown in FIG. 10 (e), an electrode film for the cathode electrode 3 and the anode electrode 4 is formed by, for example, sputtering on the insulating film 15 (S9). In this preferred embodiment, a Ti film, a TiN film, and an AlCu film are sputtered in this order to form an electrode film composed of the lamination of the films. Another resist mask having an opening pattern corresponding to the slit 18 is then formed on the electrode film (S10) and, through etching (reactive ion etching, for example) using the resist mask, the slit 18 is formed in the electrode film (S11). The slit 18 may have a width of about 3 µm. The electrode film is thus divided into the cathode electrode film 3A and the anode electrode film 4A.

Next, after the resist film is peeled off, a passivation film 20 such as a nitride film is formed by, for example, a CVD method (S12), and further a resin film 21 is formed by application of polyimide or the like (S13). For example, photosensitive polyimide is applied and exposed with a pattern corresponding to the pad openings 22, 23, and then the polyimide film is developed (S14). This causes openings corresponding to the pad openings 22, 23 to be formed in the resin film 21. Thereafter, a heat treatment is performed to cure the resin film as necessary (S15). Subsequently, through dry etching (reactive ion etching, for example) using the resin film 21 as a mask, the pad openings 22, 23 are formed in the passivation film 20 (S16). Thereafter, the external connection electrodes 3B, 4B are formed within the respective pad openings 22, 23 (S17). The external connection electrodes 3B, 4B can be formed by plating (preferably electroless plating).

Next, a resist mask 83 (see FIG. 11A) having a grid-shaped opening corresponding to the boundary region 80 (see FIG. 12) is formed (S18). Through plasma etching using the resist mask 83, the semiconductor wafer W is etched to a predetermined depth from the device forming surface Wa as shown in FIG. 11A. As a result, a groove 81 for cutting is formed along the boundary region 80 (S19). After the resist mask 83 is peeled off, the semiconductor wafer W is ground from the other surface Wb to the bottom of the groove 81 as shown in FIG. 11B (S20). As a result, the multiple chip diode regions 1a are divided into individual pieces and the chip diodes 1 of the above-described structure can be obtained.

As shown in FIG. 12, the resist mask 83 used to form the groove 81 in the boundary region 80 has outward convex curved and round-shaped portions 84 at positions in contact with the four corners of each chip diode region 1a. The round-shaped portions 84 are each formed to connect two adjacent ones of the sides of the chip diode region 1a with a smooth curve. The resist mask 83 used to form the groove 81 in the boundary region 80 further has a recessed portion 85 recessed toward the interior of each chip diode region 1a at a position in contact with one of the short sides of the chip diode region 1a. Accordingly, the groove 81, when formed through plasma etching using the resist mask 83 as a mask, has outward convex curved and round-shaped portions at positions in contact with the four corners of each chip diode region 1a and a recessed portion recessed toward the interior of each chip diode region 1a at a position in contact with one of the short sides of the chip diode region 1a. Thus, during the step of forming the groove 81 to cut the chip diode regions 1a out of the semiconductor wafer W, the four corner portions 9 of each chip diode 1 can be formed in a round shape and the recessed portion 8 can be defined in one of the short sides (closer to the cathode) as a cathode mark. That is, the corner portions 9 can be formed in a round shape and the recessed portion 8 can be formed as a cathode mark without adding a dedicated step.

In this preferred embodiment, since the semiconductor substrate 2 is composed of a p-type semiconductor, it is possible to achieve stable characteristics without forming an epitaxial layer on the semiconductor substrate 2. That is, in the case of using an n-type semiconductor wafer, which has large in-plane resistivity variation, it is necessary to form an epitaxial layer, which has small in-plane resistivity variation on the surface and form an impurity diffusion layer on the epitaxial layer to define a pn junction. This is for the reason that since the n-type impurity has a low segregation coefficient, when an ingot (silicon ingot, for example) causing a semiconductor wafer is formed, there is a great difference in the resistivity between the center and the periphery of the wafer. On the other hand, in the case of using a p-type semiconductor wafer, which has small in-plane resistivity variation because the p-type impurity has a relatively high segregation coefficient, it is possible to cut a diode with stable characteristics out of any site of the wafer without forming an epitaxial layer. Thus using the $p^+$-type semiconductor substrate 2 can simplify the manufacturing process and reduce the manufacturing cost.

Figure 13:
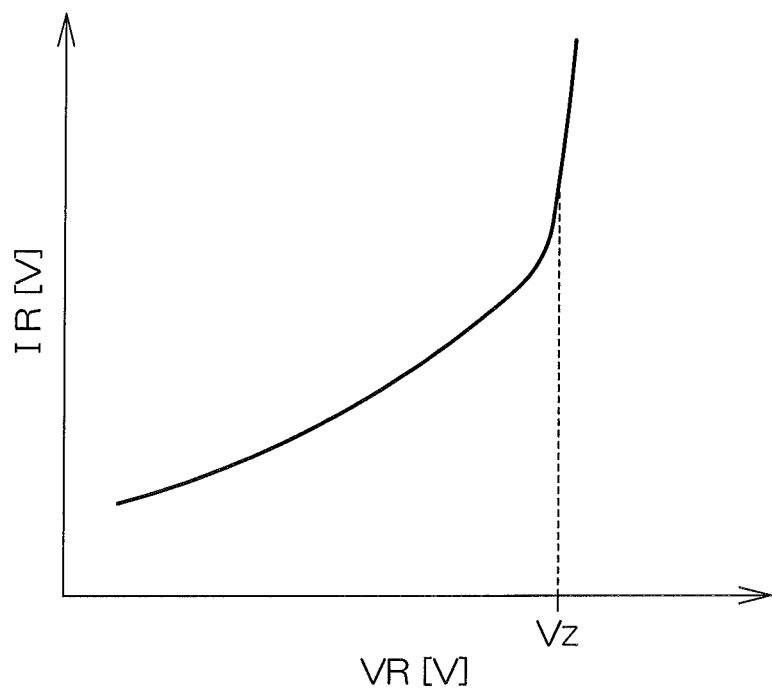
FIG. 13 illustrates the Zener voltage (Vz) of the chip diode.

Also, in accordance with this preferred embodiment, after the introduction of the n-type impurity, the condition of the device forming surface Wa of the semiconductor wafer W remains unchanged with no CVD film or thermal oxide film formed in the region into which the impurity is introduced. Under the surface condition, an RTA process is then performed to diffuse the impurity, which takes only a short time compared to a drive-in process. In addition, the semiconductor wafer W used has a resistivity of 3 mΩ·cm to 5 mΩ·cm. This can reduce the amount of heat to be applied to the semiconductor wafer W, whereby it is possible to precisely control the Zener voltage Vz of the chip diode to be from 4.0 V to 5.5 V. It is noted that the Zener voltage is a voltage Vz at which the current rises rapidly in the reverse I-V curve of the chip diode 1 shown in FIG. 13, for example.

Figure 14:
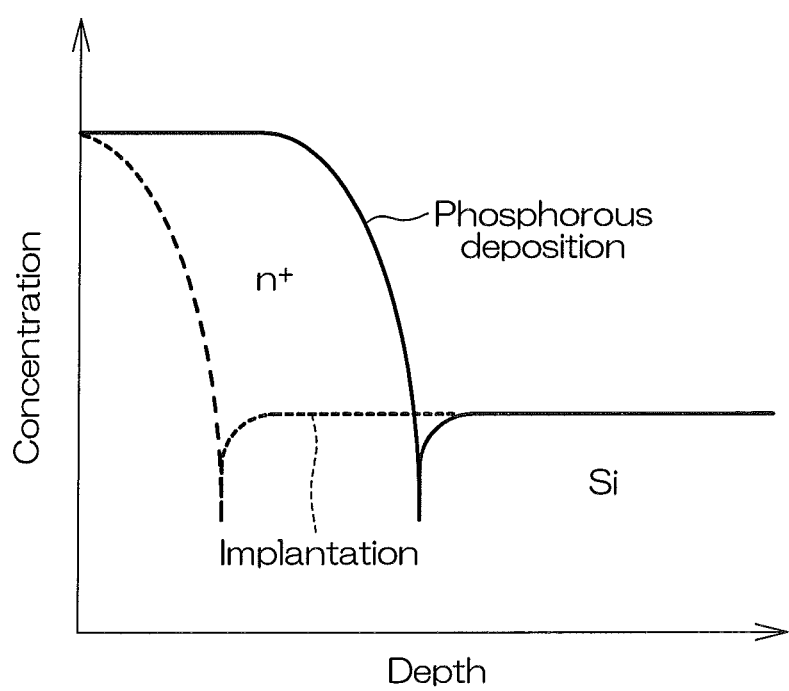
FIG. 14 shows a concentration profile in an $n^+$-type region.

Further, in this preferred embodiment, since the introduction of the n-type impurity is performed through ion implantation, the n⁺-type region 10 of the chip diode 1 can have a concentration profile of continuous decrease to a predetermined depth from the device forming surface 2a of the semiconductor substrate 2 as shown in FIG. 14. In contrast, the n-type impurity, if introduced through phosphorous deposition, has a constant concentration profile to a predetermined depth from the device forming surface 2a.

Figure 15:
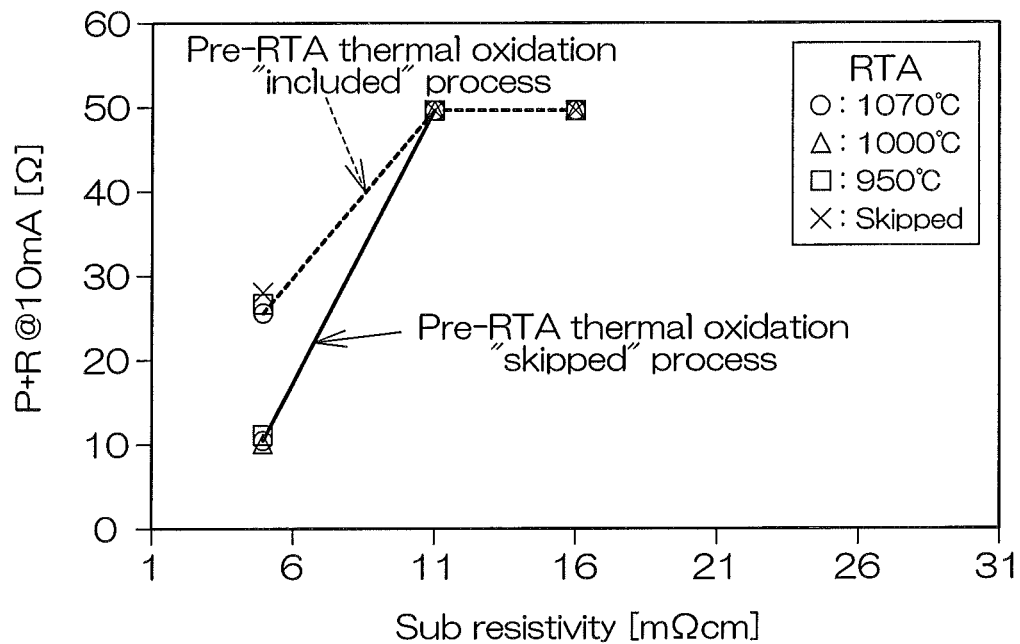
FIG. 15 illustrates the ohmic contact between a Ti/TiN/ AlCu electrode film and a $p^+$-type semiconductor substrate.
Figure 16:
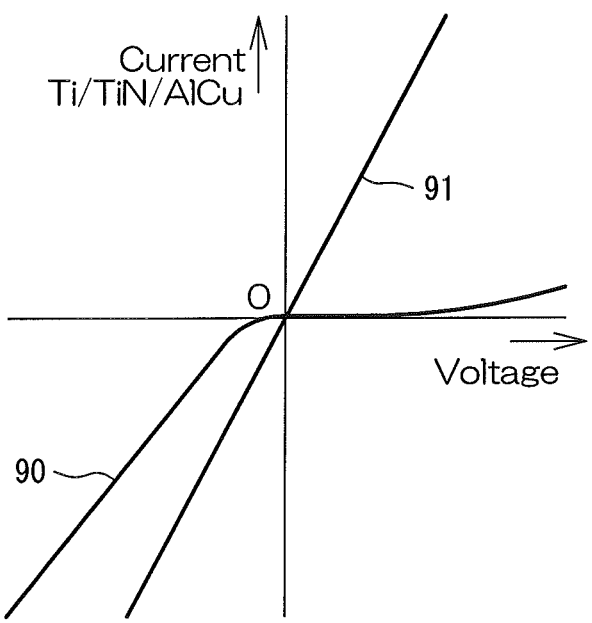
FIG. 16 illustrates the ohmic contact between a Ti/TiN/ AlCu electrode film and a $p^+$-type semiconductor substrate.

FIGS. 15 and 16 illustrate the ohmic contact between a Ti/TiN/AlCu electrode film and a p⁺-type semiconductor substrate.

FIG. 15 shows that in the case of the semiconductor substrate 2 with a resistivity of 3 mΩ·cm to 5 mΩ·cm used in this preferred embodiment, the contact resistance to the p⁺-type semiconductor substrate 2 is much smaller than those with a resistivity higher than the above range regardless of the conditions of the RTA process. That is, while a Ti/TiN/AlCu laminated film is generally less likely to come into ohmic contact with a p-type semiconductor, using a substrate with a resistivity of 3 mΩ·cm to 5 mΩ·cm allows a good ohmic contact to be provided between the laminated film and the p⁺-type semiconductor substrate. As a result, the anode electrode film 4A according to this preferred embodiment shows a linear voltage-current characteristic as indicated by the curve 91 in FIG. 16. On the other hand, using a substrate with a resistivity of, for example, 11 mΩ·cm would result in a non-linear characteristic as indicated by the curve 90 in FIG. 16.

Figure 17:
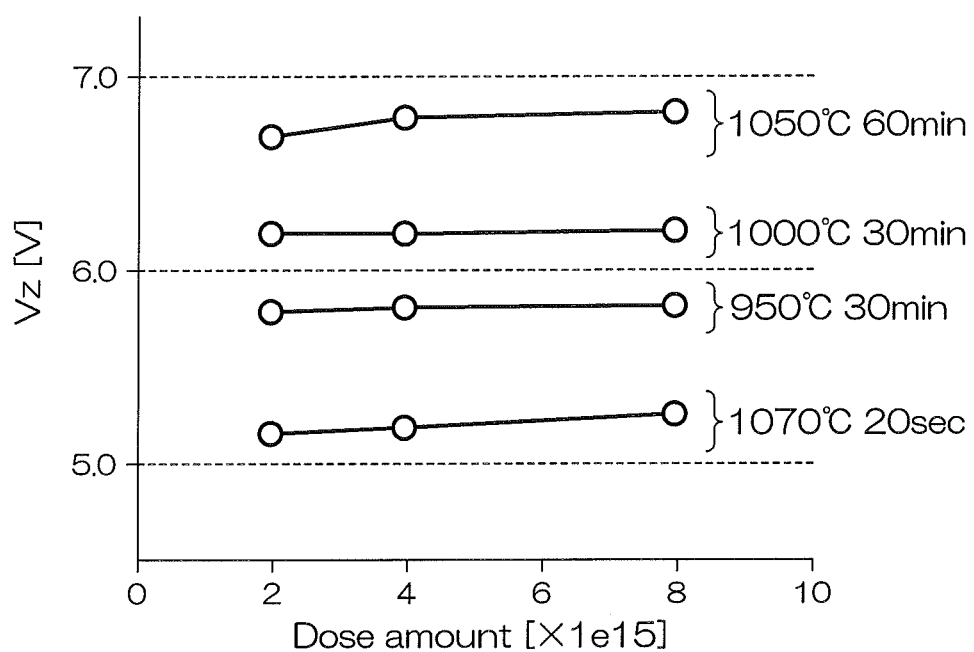
FIG. 17 illustrates a feature for the adjustment of the Zener voltage (Vz) of the chip diode.

FIG. 17 illustrates a feature for the adjustment of the Zener voltage (Vz) of the chip diode 1, that is, a feature for the adjustment of the Zener voltage when the chip diode 1 is configured as a Zener diode. It is noted that in FIG. 17, a chip diode 1 in which an n⁺-type region 10 is formed by a method different from that according to this preferred embodiment is used as a sample to investigate the relationship between the amount of heat applied to the semiconductor substrate 2 and the Zener voltage. To describe more specifically, after the n-type impurity (phosphor, for example) is introduced into the surficial portion of the semiconductor substrate 2 to form the n⁺-type region 10, a heat treatment (drive-in process) for activation of the introduced impurity is performed. The Zener voltage varies depending on the temperature and duration of the heat treatment. Specifically, the Zener voltage tends to increase with an increase in the amount of heat applied to the semiconductor substrate 2 during the heat treatment. The Zener voltage can be adjusted using this tendency. As can be understood from FIG. 17, the Zener voltage is more strongly dependent on the amount of heat during the heat treatment than the dose amount of the impurity. The tendency also applies to the case where the n⁺-type region 10 is formed through an RTA process as in this preferred embodiment.

Figure 18:
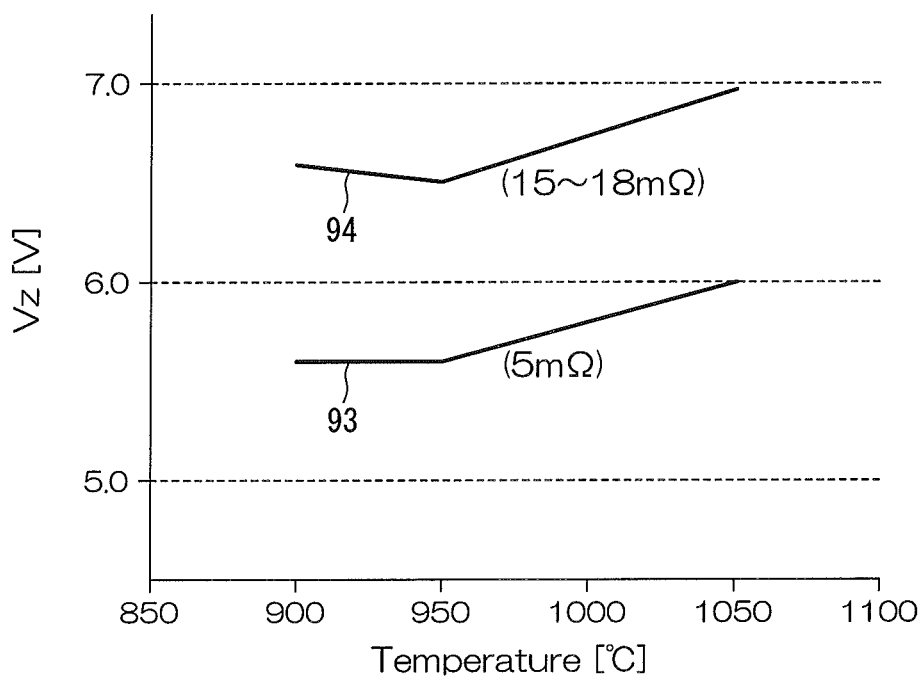
FIG. 18 illustrates another feature for the adjustment of the Zener voltage (Vz).

FIG. 18 illustrates another feature for the adjustment of the Zener voltage (Vz), and specifically shows the change in the Zener voltage with respect to the temperature during the heat treatment for activation of the n-type impurity introduced into the semiconductor substrate 2 of the sample in FIG. 17. The curve 93 shows the Zener voltage when a semiconductor substrate having a relatively low resistivity (5 mΩ, for example) is used, while the curve 94 shows the Zener voltage when a semiconductor substrate having a relatively high resistivity (15 to 18 mΩ, for example) is used. The comparison between the curves 93, 94 shows that the Zener voltage depends on the resistivity of the semiconductor substrate. Accordingly, by applying a semiconductor substrate having an appropriate resistivity depending on a targeted Zener voltage, it is possible to control the Zener voltage to be a designed value.

However, as can be understood from the curve 93 in FIG. 18, it is difficult to control the Zener voltage to be within the range (4.0 V to 5.5 V) according to the present invention only by using a semiconductor substrate having a relatively low resistivity. In practice, the Zener voltage may be higher than 5.5 V even with a semiconductor substrate of 5 mΩ·cm. Hence, in this preferred embodiment, after the introduction of the n-type impurity, the condition of the device forming surface Wa of the semiconductor wafer W remains unchanged with no CVD film or thermal oxide film formed in the region into which the impurity is introduced. Under the surface condition, an RTA process is then performed to diffuse the impurity, which takes only a short time compared to a drive-in process. This makes it possible to precisely control the Zener voltage Vz of the chip diode to be from 4.0 V to 5.5 V. This can be proved with reference to FIGS. 19 and 20.

Figure 19:
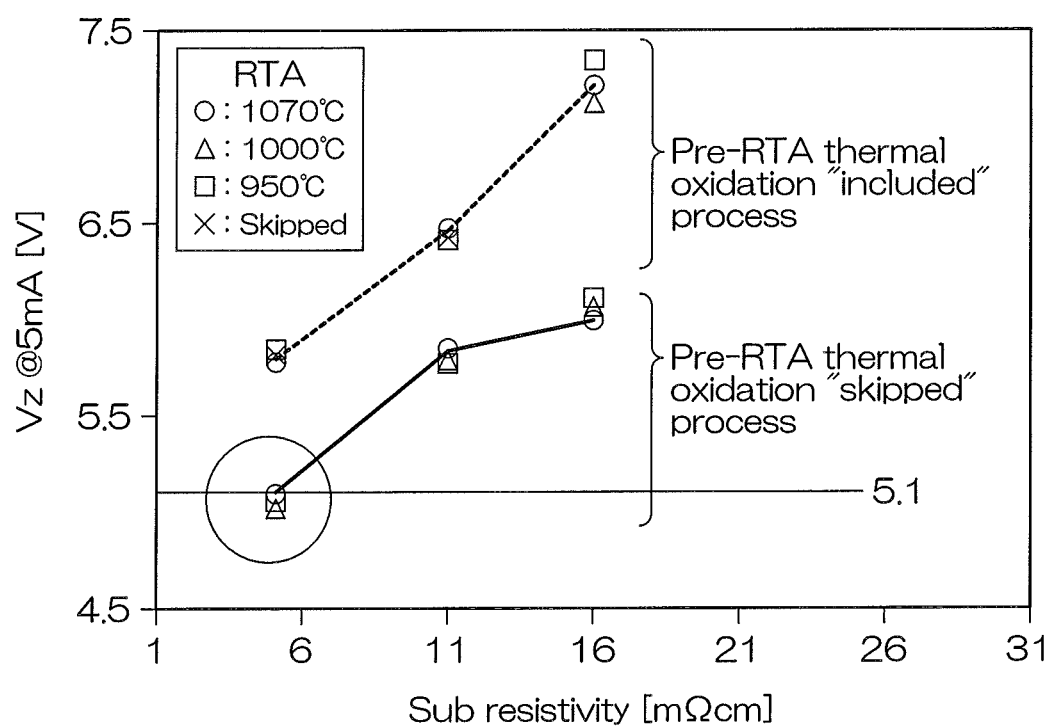
FIG. 19 illustrates a further feature for the adjustment of the Zener voltage (Vz).
Figure 20A:
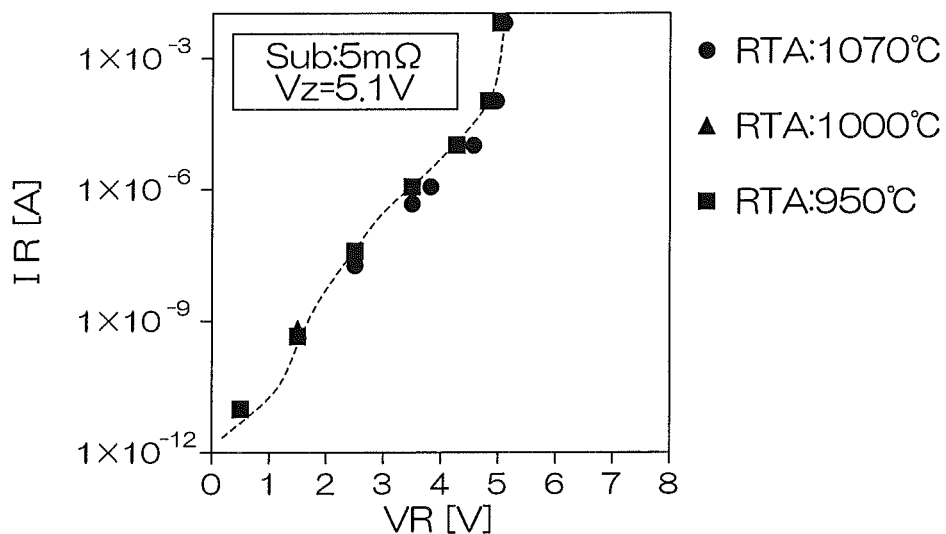
FIGS. 20A-20C show I-V characteristics of the sample (thermal oxidation "skipped" process) in FIG. 19.
Figure 20B:
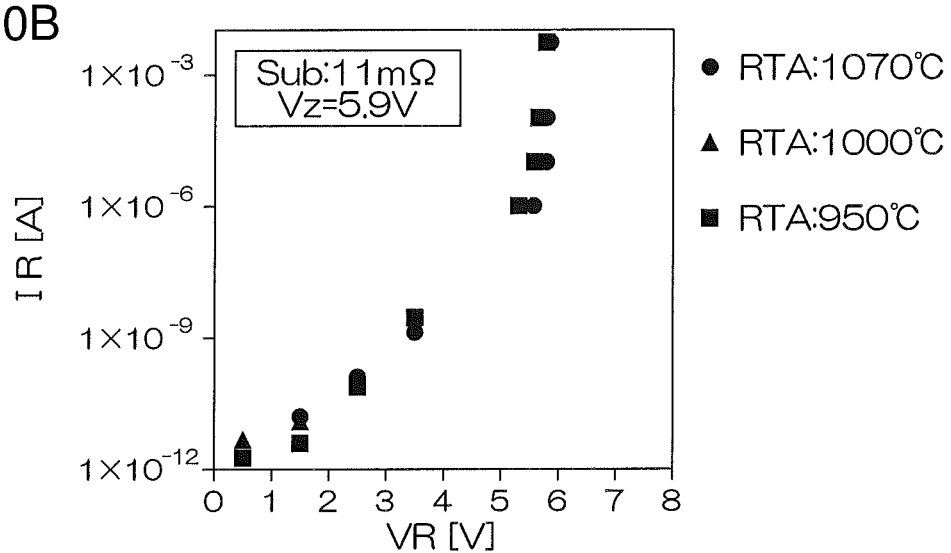
Figure 20C:
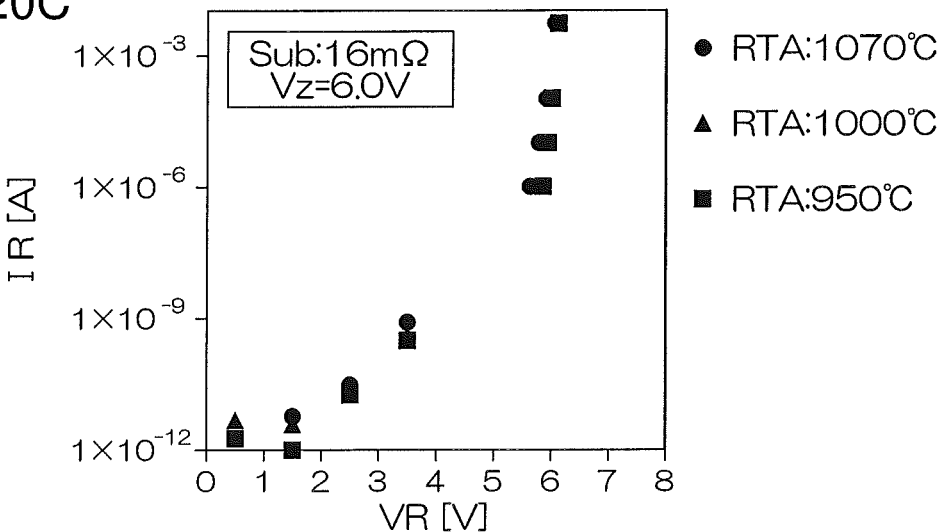

FIG. 19 illustrates a further feature for the adjustment of the Zener voltage (Vz). FIG. 20 shows I-V characteristics of the sample (thermal oxidation "skipped" process) in FIG. 19.

That is, FIG. 19 shows that when a semiconductor substrate of 5 mΩ·cm is ion-implanted with an n-type impurity and subsequently undergoes a pre-RTA thermal oxidation "skipped" process, the Zener voltage Vz of the chip diode can be controlled precisely to be 5.1 V regardless of the conditions of the RTA. This is obvious also from the I-V curve in FIG. 20 (a).

On the other hand, it is shown that if the semiconductor substrate 2 has a higher resistivity (11 mΩ·cm or 16 mΩ·cm, for example) and/or, after the introduction of the n-type impurity, a pre-RTA thermal oxidation "included" process runs, it is difficult to produce a chip diode having a Zener voltage Vz of 4.0 V to 5.5 V.

Figure 21:
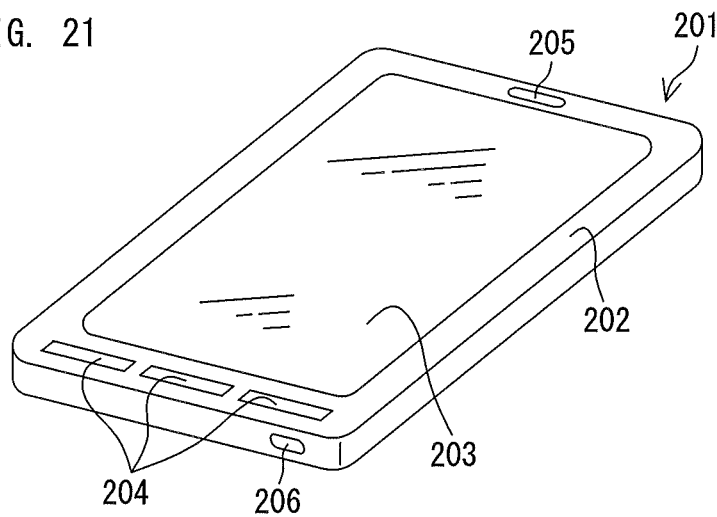
FIG. 21 is a perspective view showing the appearance of a smartphone as an exemplary electronic device in which the chip diode is used.

FIG. 21 is a perspective view showing the appearance of a smartphone as an exemplary electronic device in which the chip diode is used. The smartphone 201 is arranged by housing electronic parts inside a flat rectangular parallelepiped casing 202. The casing 202 has a pair of rectangular principal surfaces at its front side and rear side, and the pair of principal surfaces are joined by four side surfaces. A display surface of a display panel 203 composed of a liquid crystal panel, an organic EL panel, or the like is exposed on one of the principal surfaces of the casing 202. The display surface of the display panel 203 constitutes a touch panel and provides an input interface for the user.

The display panel 203 is formed in a rectangular shape that occupies most of the one principal surface of the casing 202. Operation buttons 204 are disposed along one of the short sides of the display panel 203. In this preferred embodiment, multiple (three) operation buttons 204 are arranged along the short side of the display panel 203. The user can operate the operation buttons 204 and the touch panel to perform operations on the smartphone 210 and thereby call and execute necessary functions.

A speaker 205 is disposed in the vicinity of the other short side of the display panel 203. The speaker 205 provides an earpiece for a telephone function and is also used as an acoustic conversion unit for reproduction of music data and the like. On the other hand, near the operation buttons 204, a microphone 206 is disposed in one of the side surfaces of the casing 202. The microphone 206 provides a mouthpiece for the telephone function and may also be used as a microphone for sound recording.

Figure 22:
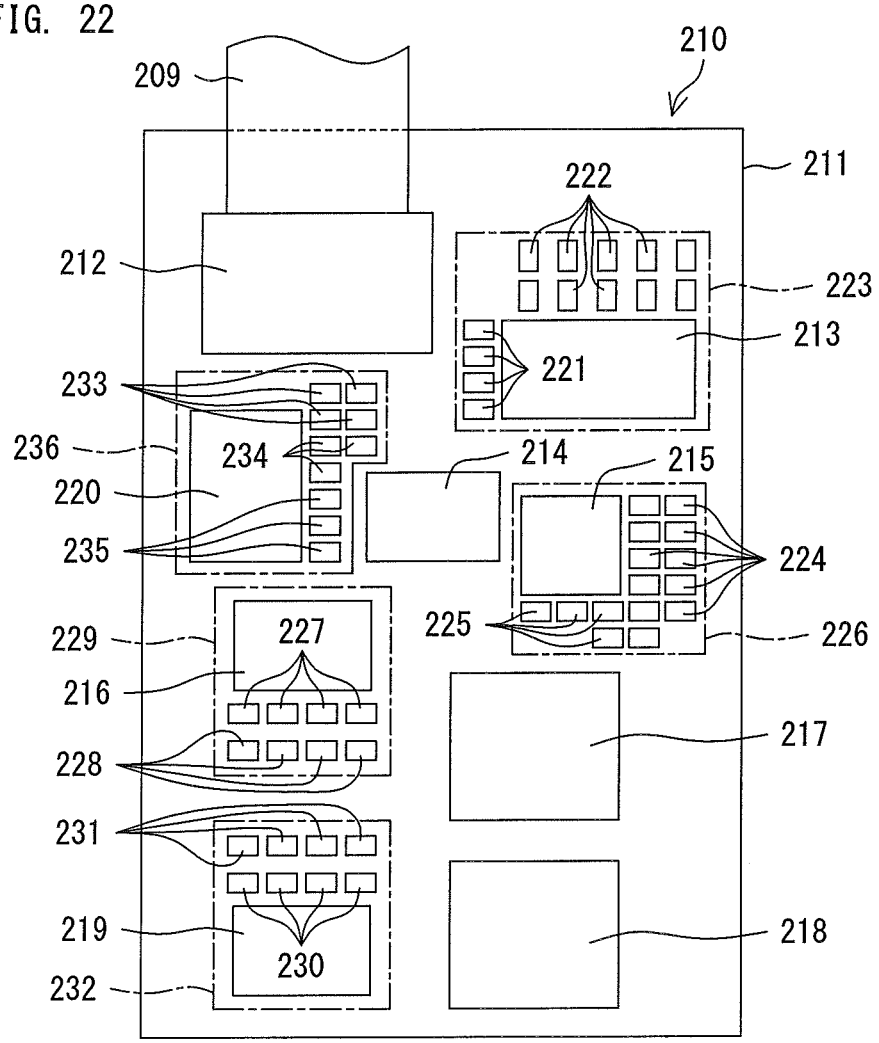
FIG. 22 is an illustrative plan view showing the configuration of an electronic circuit assembly housed in the casing of the smartphone.

FIG. 22 is an illustrative plan view showing the configuration of an electronic circuit assembly 210 housed inside the casing 202. The electronic circuit assembly 210 includes a wiring substrate 211 and circuit parts mounted on a mounting surface of the wiring substrate 211. The multiple circuit parts include multiple integrated circuit elements (ICs) 212 to 220 and multiple chip parts. The multiple ICs include a transmission processing IC 212, a one-segment TV receiving IC 213, a GPS receiving IC 214, an FM tuner IC 215, a power supply IC 216, a flash memory 217, a microcomputer 218, a power supply IC 219, and a baseband IC 220. The multiple chip parts include chip inductors 221, 225, 235, chip resistors 222, 224, 233, chip capacitors 227, 230, 234, and chip diodes 228, 231. The chip parts are mounted on the mounting surface of the wiring substrate 211 by, for example, flip-chip bonding. The chip diodes according to the above-described preferred embodiment may be applied as the chip diodes 228, 231.

The transmission processing IC 212 has incorporated therein an electronic circuit arranged to generate display control signals for the display panel 203 and receive input signals through the touch panel on the surface of the display panel 203. For connection with the display panel 203, the transmission processing IC 212 is connected to a flexible wiring 209.

The one-segment TV receiving IC 213 has incorporated therein an electronic circuit that constitutes a receiver arranged to receive one-segment broadcast (digital terrestrial television broadcast targeted for reception by mobile devices) radio waves. Multiple chip inductors 221 and multiple chip resistors 222 are disposed in the vicinity of the one-segment TV receiving IC 213. The one-segment TV receiving IC 213, the chip inductors 221, and the chip resistors 222 constitute a one-segment broadcast receiving circuit 223. The chip inductors 221 and the chip resistors 222 have accurately adjusted inductances and resistances, respectively, and provide circuit constants of high precision to the one-segment broadcast receiving circuit 223.

The GPS receiving IC 214 has incorporated therein an electronic circuit arranged to receive radio waves from GPS satellites and output positional information of the smartphone 201.

The FM tuner IC 215 constitutes, together with multiple chip resistors 224 and multiple chip inductors 225 mounted on the wiring substrate 211 in the vicinity thereof, an FM broadcast receiving circuit 226. The chip resistors 224 and the chip inductors 225 have accurately adjusted resistances and inductances, respectively, and provide circuit constants of high precision to the FM broadcast receiving circuit 226.

Multiple chip capacitors 227 and multiple chip diodes 228 are mounted on the mounting surface of the wiring substrate 211 in the vicinity of the power supply IC 216. Together with the chip capacitors 227 and the chip diodes 228, the power supply IC 216 constitutes a power supply circuit 229.

The flash memory 217 is a storage device arranged to record operating system programs, data generated inside the smartphone 201, and data and programs acquired externally by communication functions, etc.

The microcomputer 218 is an operational processing circuit that has incorporated therein a CPU, a ROM, and a RAM and realizes multiple functions of the smartphone 201 performing various types of operational processing. More specifically, operational processing for image processing and various application programs are realized through the operation of the microcomputer 218.

Near the power supply IC 219, multiple chip capacitors 230 and multiple chip diodes 231 are mounted on the mounting surface of the wiring substrate 211. Together with the chip capacitors 230 and the chip diodes 231, the power supply IC 219 constitutes a power supply circuit 232.

Near the baseband IC 220, multiple chip resistors 233, multiple chip capacitors 234, and multiple chip inductors 235 are mounted on the mounting surface of the wiring substrate 211. Together with the chip resistors 233, the chip capacitors 234, and the chip inductors 235, the baseband IC 220 constitutes a baseband communication circuit 236. The baseband communication circuit 236 provides communication functions for telephone communication and data communication.

With the arrangement above, electric power adjusted appropriately by the power supply circuits 229, 232 is supplied to the transmission processing IC 212, the GPS receiving IC 214, the one-segment broadcast receiving circuit 223, the FM broadcast receiving circuit 226, the baseband communication circuit 236, the flash memory 217, and the microcomputer 218. The microcomputer 218 performs operational processing in response to input signals input via the transmission processing IC 212 and causes display control signals to be output from the transmission processing IC 212 to the display panel 203 to make the display panel 203 perform various displays.

When the touch panel or the operation buttons 204 are operated for reception of a one-segment broadcast, the one-segment broadcast is received through the operation of the one-segment broadcast receiving circuit 223. The microcomputer 218 then performs operational processing for outputting received images to the display panel 203 and acoustically converting received sounds through the speaker 205.

Also, when positional information of the smartphone 201 is required, the microcomputer 218 acquires the positional information output from the GPS receiving IC 214 and performs operational processing using the positional information.

Further, when the touch panel or the operation buttons 204 are operated and an FM broadcast receiving command is input, the microcomputer 218 starts up the FM broadcast receiving circuit 226 and performs operational processing for outputting received sounds through the speaker 205.

The flash memory 217 is used to store data acquired through communications and to store data prepared by operations of the microcomputer 218 and inputs through the touch panel. The microcomputer 218 writes data into the flash memory 217 and reads data out of the flash memory 217 as necessary.

The telephone communication or data communication function is realized by the baseband communication circuit 236. The microcomputer 218 controls the baseband communication circuit 236 to perform processing for sending and receiving sounds or data.

Although the preferred embodiment of the present invention has heretofore been described, the present invention may be implemented in yet other modes as well. For example, although the above-described preferred embodiment describes an example in which four diode cells are formed on the semiconductor substrate, two or three diode cells may be formed or four or more diode cells may be formed on the semiconductor substrate. Alternatively, only one diode cell may be formed.

Although the above-described preferred embodiment describes an example in which the pn junction regions are formed in a regular octagon in a plan view, the pn junction regions may be formed in any polygonal shape with three or more sides, and the planar geometry thereof may be circular or elliptical. The pn junction regions, if having a polygonal shape, may not necessarily have a regular polygonal shape and may be formed in a polygon with two or more types of side length. Yet further, there is no need to form the pn junction regions in the same size, and multiple diode cells having their respective junction regions of different sizes may be mixed on the semiconductor substrate. Moreover, the shape of the pn junction regions formed on the semiconductor substrate may not necessarily be of one type, and pn junction regions of two or more geometry types may be mixed on the semiconductor substrate.

Various other modifications to the design may be made within the scope of the aspects set forth in the claims.

Preferred Embodiment of Reference Example 1 of the Present Invention

A preferred embodiment of Reference Example 1 of the present invention will hereinafter be described in detail with reference to the accompanying drawings.

Figure 23:
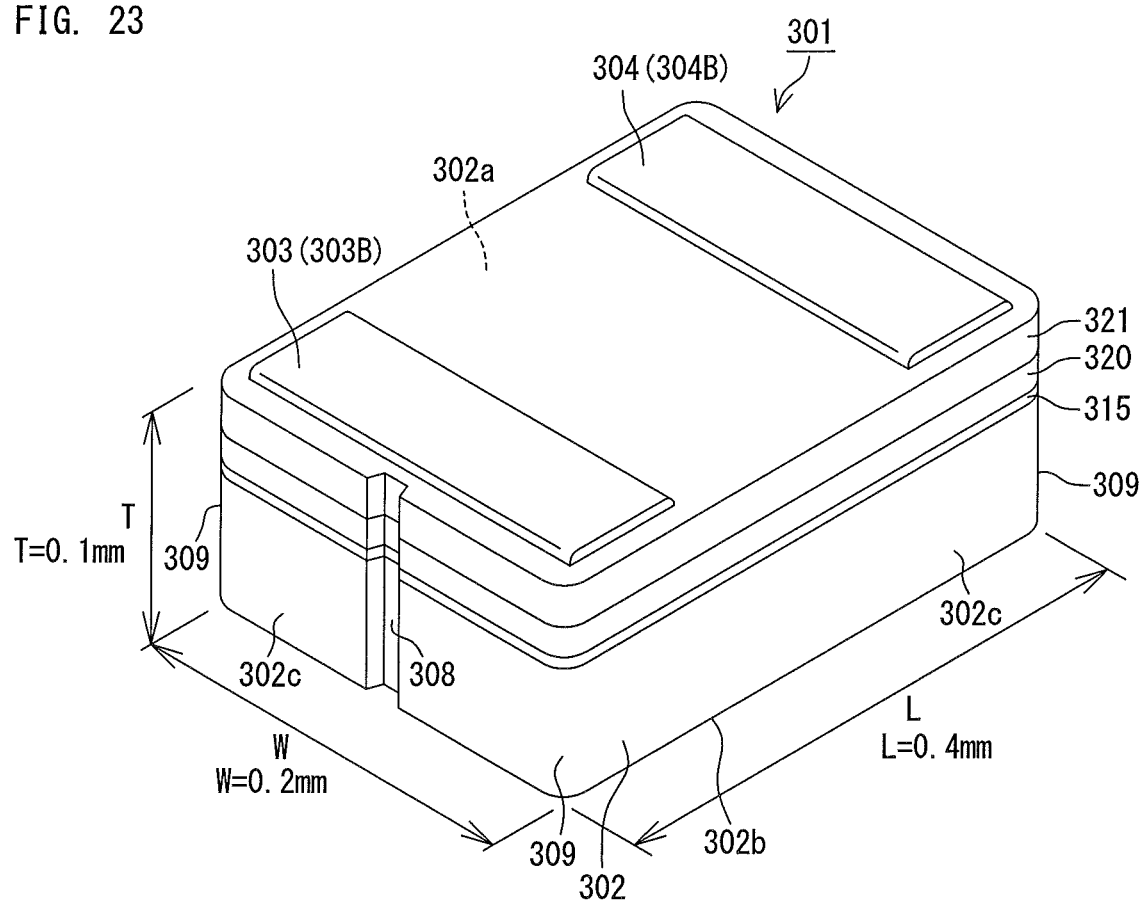
FIG. 23 is a perspective view of a chip diode according to a preferred embodiment of Reference Example 1 of the present invention.
Figure 24:
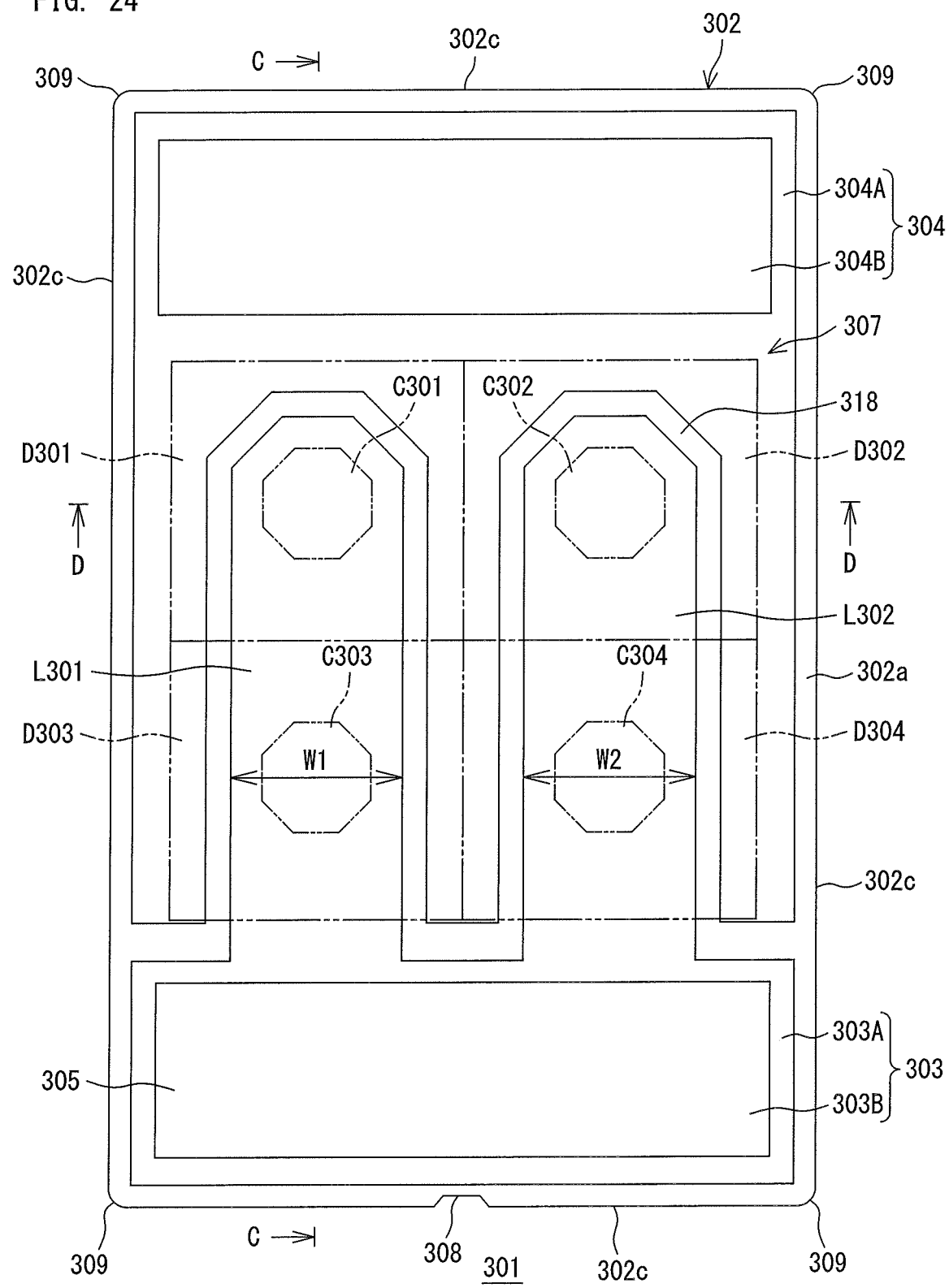
FIG. 24 is a plan view of the chip diode according to the preferred embodiment of Reference Example 1.
Figure 25:
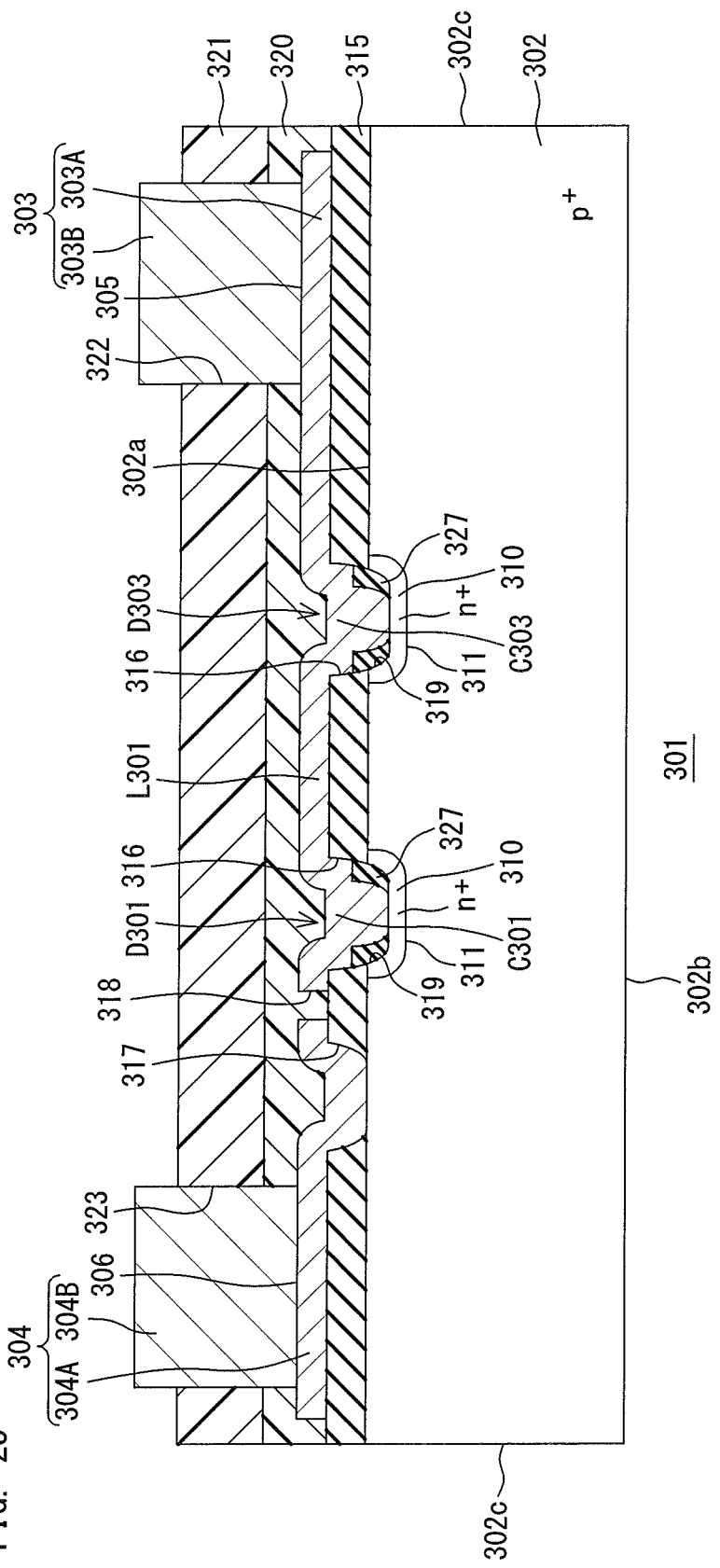
FIG. 25 is a cross-sectional view taken along the line C-C in FIG. 24.
Figure 26:
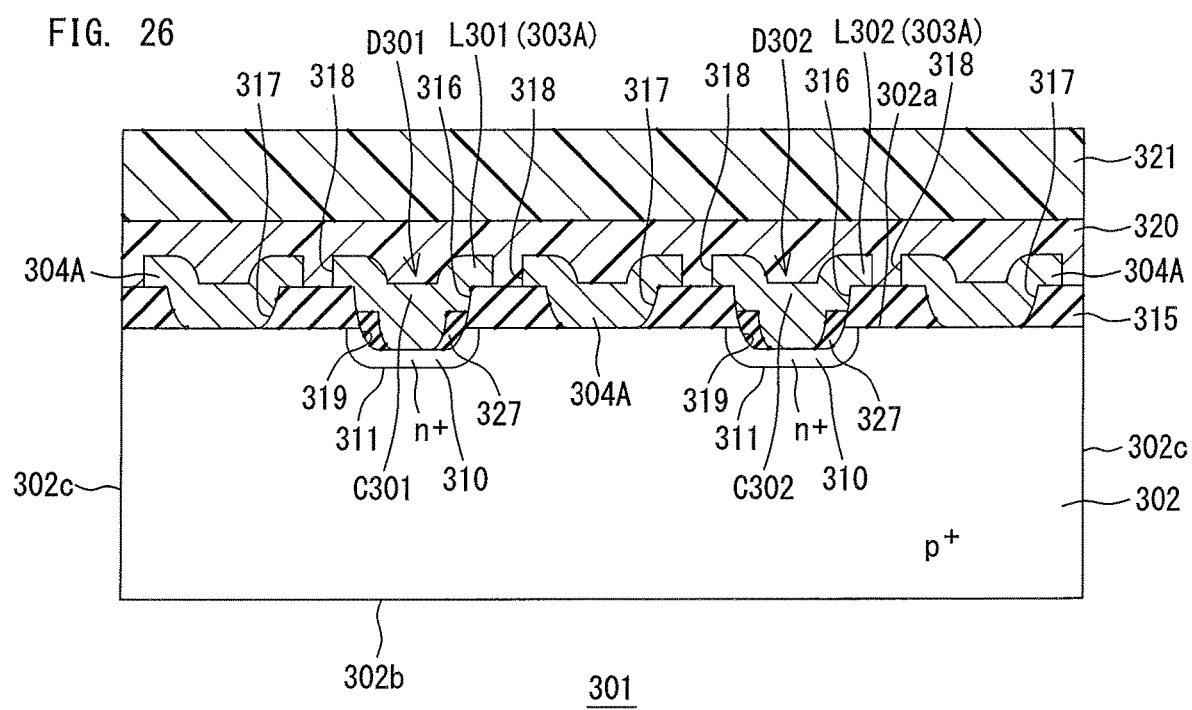
FIG. 26 is a cross-sectional view taken along the line D-D in FIG. 24.

FIG. 23 is a perspective view of a chip diode according to the preferred embodiment of Reference Example 1 of the present invention. FIG. 24 is a plan view of the chip diode. FIG. 25 is a cross-sectional view taken along the line C-C in FIG. 24. Further, FIG. 26 is a cross-sectional view taken along the line D-D in FIG. 24.

The chip diode 301 includes a p$^+$-type semiconductor substrate 302 (silicon substrate, for example), multiple diode cells D301 to D304 formed on the semiconductor substrate 302, and a cathode electrode 303 and an anode electrode 304 connecting the multiple diode cells D301 to D304 in parallel.

The semiconductor substrate 302 has a resistivity of 5 mΩ·cm to 20 mΩ·cm.

The semiconductor substrate 302 includes a pair of principal surfaces 302a, 302b and multiple side surfaces 302c orthogonal to the pair of principal surfaces 302a, 302b, one (principal surface 302a) of the pair of principal surfaces 302a, 302b being a device forming surface. The principal surface 302a will hereinafter be referred to as "device forming surface 302a." The device forming surface 302a is formed in a rectangular shape in a plan view and, for example, the longer sides may have a length L of about 0.4 mm and the shorter sides may have a length W of about 0.2 mm. The chip diode 301 may also have a total thickness T of about 0.1 mm. An external connection electrode 303B of the cathode electrode 303 and an external connection electrode 304B of the anode electrode 304 are disposed, respectively, in end portions of the device forming surface 302a. A diode cell region 307 is provided on the device forming surface 302a between the external connection electrodes 303B, 304B.

A cutout recessed portion 308 extending in the thickness direction of the semiconductor substrate 302 is defined in one of the side surfaces 302c coupled to one short side (closer to the cathode external connection electrode 303B in this preferred embodiment of Reference Example 1) of the device forming surface 302a. The recessed portion 308 extends throughout the thickness of the semiconductor substrate 302 in this preferred embodiment of Reference Example 1. In a plan view, the recessed portion 308 is recessed inward from the short side of the device forming surface 302a and, in this preferred embodiment of Reference Example 1, has a trapezoidal shape tapered toward the interior of the device forming surface 302a. It will be understood that the planar geometry is illustrative only, and a rectangular shape, a triangular shape, or a recessed curved shape such as a partially circular shape (arc shape, for example) may be employed. The recessed portion 308 indicates the orientation of the chip diode 301 (chip orientation). More specifically, the recessed portion 308 provides a cathode mark that indicates the location of the cathode external connection electrode 303B. This provides a structure with which the polarity can be determined based on the appearance when the chip diode 301 is mounted.

The semiconductor substrate 302 has four corner portions 309 at four corners each corresponding to the intersection of a pair of mutually adjacent ones of the four side surfaces 302c. The four corner portions 309 are formed roundly in this preferred embodiment of Reference Example 1. The corner portions 309 each have an outward convex smooth curved surface in a plan view in the normal direction of the device forming surface 302a. This provides a structure with which chipping can be reduced when the chip diode 301 is manufactured and mounted.

The diode cell region 307 is formed in a rectangular shape in this preferred embodiment of Reference Example 1. The multiple diode cells D301 to D304 are disposed within the diode cell region 307. The number of the multiple diode cells D301 to D304 is four in this preferred embodiment of Reference Example 1, which are arranged two-dimensionally at equal spaces in a matrix manner along the longer sides and the shorter sides of the semiconductor substrate 302.

Figure 27:
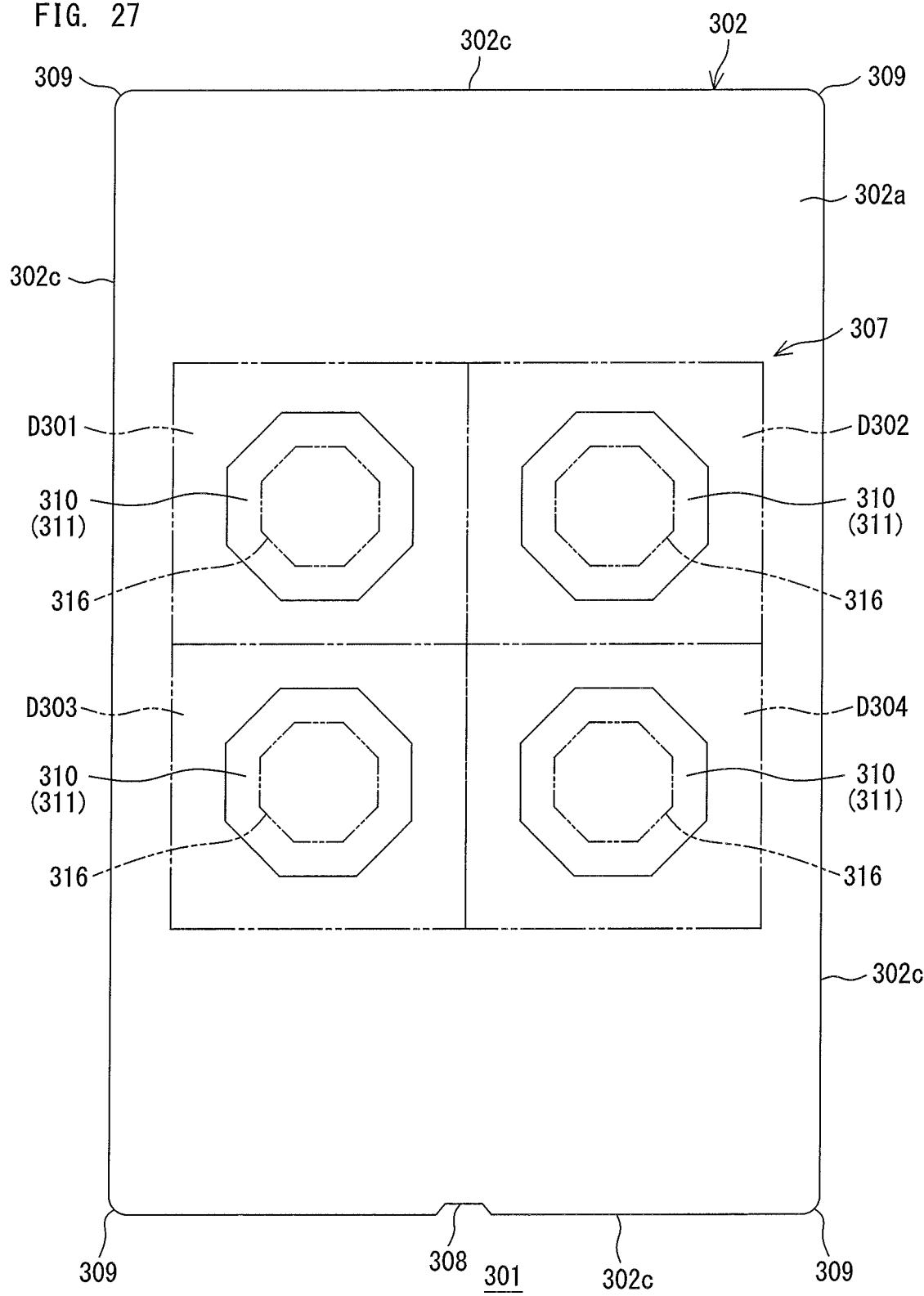
FIG. 27 is a plan view showing the structure of a surface of a semiconductor substrate excluding a cathode electrode, an anode electrode, and components formed thereon in the chip diode according to the preferred embodiment of Reference Example 1.

FIG. 27 is a plan view showing the structure of the surface (device forming surface 302a) of the semiconductor substrate 302 excluding the cathode electrode 303, the anode electrode 304, and the components formed thereon. Within each region of the diode cells D301 to D304, an n$^+$-type region 310 is formed in a surficial region of the p$^+$-type semiconductor substrate 302. The n$^+$-type regions 310 are separated for each diode cell. Accordingly, the diode cells D301 to D304, respectively, have pn junction regions 311 separated for each diode cell.

The multiple diode cells D301 to D304 are formed in the same shape, specifically a rectangular shape of the same size in this preferred embodiment of Reference Example 1 and, within the rectangular region of each diode cell, the n$^+$-type region 310 is formed in a polygonal shape. In this preferred embodiment of Reference Example 1, the n$^+$-type region 310 is formed in a regular octagon having four sides along the respective four sides of the rectangular region of each of the diode cells D301 to D304 and four sides opposed to the respective four corner portions of the rectangular region of each of the diode cells D301 to D304.

As shown in FIGS. 25 and 26, each n$^+$-type region 310 has a depth of 0.2 μm to 3.0 μm at its deepest portion from the device forming surface 302a. An insulating film 315 composed of an oxide film (not shown in FIG. 24) is formed on the device forming surface 302a of the semiconductor substrate 302. In the insulating film 315, contact holes 316 (cathode contact holes) for exposure of the surface of the n$^+$-type regions 310 of the respective diode cells D301 to D304 therethrough and contact holes 317 (anode contact holes) for exposure of the device forming surface 302a therethrough are defined. On the surface of each n$^+$-type region 310, a recessed portion 319 is defined in a manner continuing to the corresponding contact hole 316. The entire recessed portion 319 is defined in the interior region of the n$^+$-type region 310 with the side surface continuing smoothly to the side surface of the contact hole 316 with no step. The recessed portion 319 and the contact hole 316 are thus combined to define a hole having a stepless smooth side surface. An insulating film 327 serving as a recessed portion insulating film is formed in the peripheral portion of the hole (peripheral portion of the recessed portion 319). The insulating film 327 is composed of an oxide film and, in this preferred embodiment of Reference Example 1, is formed annularly along the side of the recessed portion 319 so that the center of the bottom of the recessed portion 319 is exposed. The insulating film 327 is also formed across the boundary between the recessed portion 319 and the contact hole 316 and partially (an upper portion thereof) protrudes outward from the device forming surface 302a.

The cathode electrode 303 and the anode electrode 304 are formed on the surface of the insulating film 315. The cathode electrode 303 includes a cathode electrode film 303A formed on the surface of the insulating film 315 and an external connection electrode 303B joined to the cathode electrode film 303A. The cathode electrode film 303A has a lead-out electrode L301 connected to the multiple diode cells D301, D303, a lead-out electrode L302 connected to the multiple diode cells D302, D304, and a cathode pad 305 formed integrally with the lead-out electrodes L301, L302 (cathode lead-out electrodes). The cathode pad 305 is formed in a rectangular shape in one end portion of the device forming surface 302a. The external connection electrode 303B is connected to the cathode pad 305. The external connection electrode 303B is thus connected in common to the lead-out electrodes L301, L302. The cathode pad 305 and the external connection electrode 303B constitute an external connection portion of the cathode electrode 303 (cathode external connection portion).

The anode electrode 304 includes an anode electrode film 304A formed on the surface of the insulating film 315 and an external connection electrode 304B joined to the anode electrode film 304A. The anode electrode film 304A is connected to the p$^+$-type semiconductor substrate 302 and has an anode pad 306 in the vicinity of one end portion of the device forming surface 302a. The anode pad 306 is formed of a region of the anode electrode film 304A disposed in one end portion of the device forming surface 302a. The external connection electrode 304B is connected to the anode pad 306. The anode pad 306 and the external connection electrode 304B constitute an external connection portion of the anode electrode 304 (anode external connection portion). The region of the anode electrode film 304A excluding the anode pad 306 includes anode lead-out electrodes led out through the respective anode contact holes 317.

The lead-out electrode L301 runs on the surface of the insulating film 315 to enter the contact holes 316 and the recessed portions 319 of the respective diode cells D301, D303 and, within the recessed portions 319, come into ohmic contact with the n$^+$-type regions 310 of the respective diode cells D301, D303. The portions of the lead-out electrode L301 connected to the respective diode cells D301, D303 within the contact holes 316 constitute cell connection portions C301, C303, respectively. Similarly, the lead-out electrode L302 runs on the surface of the insulating film 315 to enter the contact holes 316 and the recessed portion 319 of the respective diode cells D302, D304 and, within the recessed portions 319, come into ohmic contact with the n$^+$-type regions 310 of the respective diode cells D302, D304. The portions of the lead-out electrode L302 connected to the respective diode cells D302, D304 within the contact holes 316 constitute cell connection portions C302, C304, respectively. The anode electrode film 304A runs on the surface of the insulating film 315 to extend into the contact holes 317 and, within the contact holes 317, come into ohmic contact with the p$^+$-type semiconductor substrate 302. The cathode electrode film 303A and the anode electrode film 304A are composed of the same material in this preferred embodiment of Reference Example 1.

The electrode films employ an AlSiCu film, a Ti/Al laminated film, or a Ti/TiN/AlCu laminated film in this preferred embodiment of Reference Example 1.

In the case of using an AlSiCu film, the semiconductor substrate 302 preferably has a resistivity of 5 mΩ·cm to 20 mΩ·cm, and the n$^+$-type regions 310 preferably have a depth of 0.7 μm to 3.0 μm. Thus using the AlSiCu film allows the anode electrode film 304A to come into ohmic contact with the p$^+$-type semiconductor substrate 302 without providing a p$^+$-type region on the surface of the semiconductor substrate 302. That is, the anode electrode film 304A can come into direct contact and therefore ohmic contact with the p$^+$-type semiconductor substrate 302. It is therefore possible to skip the step of forming such a p$^+$-type region.

The Ti/Al laminated film includes a lower Ti film and an upper Al film. Also, the Ti/TiN/AlCu laminated film includes a Ti film (having a thickness of 300 to 400 Å, for example), a TiN film (having a thickness of about 1000 Å, for example), and an AlCu film (having a thickness of about 30000 Å, for example) laminated in this order on the semiconductor substrate 302. In the case of using such a laminated film, the semiconductor substrate 302 preferably has a resistivity of 5 mΩ·cm to 10 mΩ·cm, and the n$^+$-type regions 310 preferably have a depth of 0.2 μm to 0.7 μm.

The cathode electrode film 303A and the anode electrode film 304A are separated with a slit 318 therebetween. The lead-out electrode L301 is formed linearly along the line extending from the diode cell D301 through the diode cell D303 to the cathode pad 305. Similarly, the lead-out electrode L302 is formed linearly along the line extending from the diode cell D302 through the diode cell D304 to the cathode pad 305. The lead-out electrodes L301, L302 have uniform widths W1, W2, respectively, everywhere from the n$^+$-type regions 310 to the cathode pad 305. The widths W1, W2 are greater than the width of the cell connection portions C301, C302, C303, C304. The width of the cell connection portions C301 to C304 is defined by the length of the lead-out electrodes L301, L302 in the direction orthogonal to the lead-out direction. The leading end portions of the lead-out electrodes L301, L302 are shaped to match the planar geometry of the n$^+$-type regions 310. The base end portions of the lead-out electrodes L301, L302 are connected to the cathode pad 305. The slit 318 is formed in a manner following the edges of the lead-out electrodes L301, L302. On the other hand, the anode electrode film 304A is formed on the surface of the insulating film 315 in a manner surrounding the cathode electrode film 303A with spaces provided therein correspondingly to the slit 318 having an approximately constant width. The anode electrode film 304A integrally has a comb-shaped portion extending along the longer sides of the device forming surface 302a and the rectangular anode pad 306.

The cathode electrode film 303A and the anode electrode film 304A are covered with a passivation film 320 composed of, for example, a nitride film (not shown in FIG. 24), and further a resin film 321 such as polyimide is formed on the passivation film 320. A pad opening 322 for exposure of the cathode pad 305 and a pad opening 323 for exposure of the anode pad 306 are formed in a manner penetrating through the passivation film 320 and the resin film 321. The pad openings 322, 323 are filled with the external connection electrodes 303B, 304B. The passivation film 320 and the resin film 321 constitute a protective film that reduces or prevents moisture intrusion into the lead-out electrodes L301, L302 and the pn junction regions 311 as well as absorbs an external shock and the like to contribute to improvement in the durability of the chip diode 301.

The external connection electrodes 303B, 304B may have a surface at a level lower than the surface of the resin film 321 (closer to the semiconductor substrate 302) or may protrude from the surface of the resin film 321, that is, have a surface at a level higher than the resin film 321 (farther from the semiconductor substrate 302). FIG. 25 shows an example of the external connection electrodes 303B, 304B protruding from the surface of the resin film 321. The external connection electrodes 303B, 304B may be composed of, for example, an Ni/Pd/Au laminated film including an Ni film in contact with the electrode films 303A, 304A, a Pd film formed thereon, and an Au film formed thereon. Such a laminated film can be formed by plating.

In each of the diode cells D301 to D304, the pn junction region 311 is defined between the p-type semiconductor substrate 302 and the n$^+$-type region 310, which accordingly forms a pn junction diode. The n$^+$-type regions 310 of the multiple diode cells D301 to D304 are then connected in common to the cathode electrode 303, and the p$^+$-type semiconductor substrate 302, which is a p-type region common to the diode cells D301 to D304, is connected in common to the anode electrode 304. All the multiple diode cells D301 to D304 formed on the semiconductor substrate 302 are thus connected in parallel.

Figure 28:
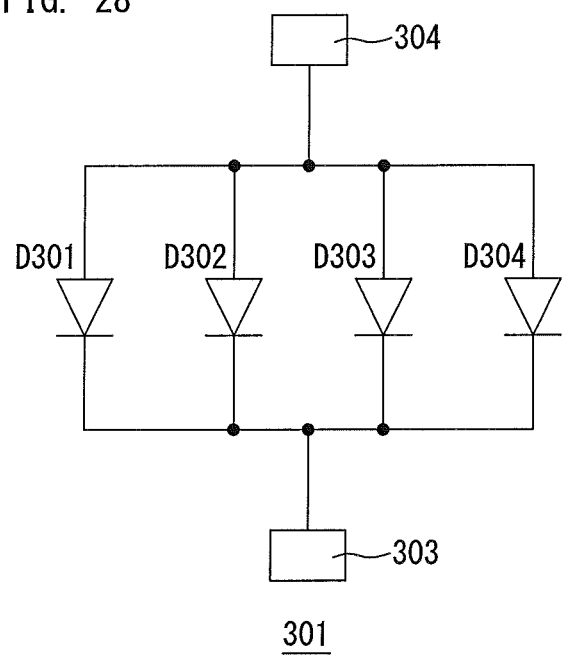
FIG. 28 is an electric circuit diagram showing the electrical structure of the inside of the chip diode according to the preferred embodiment of Reference Example 1.

FIG. 28 is an electric circuit diagram showing the electrical structure of the inside of the chip diode 301. The pn junction diodes configured by the respective diode cells D301 to D304 are connected, in parallel, with the cathodes connected in common with the cathode electrode 303 and the anodes connected in common with the anode electrode 304, thus totally serving as a single diode.

In accordance with the arrangement of this preferred embodiment of Reference Example 1, the chip diode 301 has the multiple diode cells D301 to D304, and each of the diode cells D301 to D304 in turn has the pn junction region 311. The pn junction regions 311 are separated for each of the diode cells D301 to D304. In the chip diode 301, this results in an increase in the perimeters of the pn junction regions 311, that is, the total perimeters (total extensions) of the n$^+$-type regions 310 in the semiconductor substrate 302. The electric field can thereby be dispersed and prevented from concentrating in the vicinities of the pn junction regions 311, and the ESD tolerance can thus be improved. That is, even when the chip diode 301 is to be formed in a small size, the total perimeters of the pn junction regions 311 can be increased, enabling both size reduction of the chip diode 301 and securing of the ESD tolerance.

Figure 29:
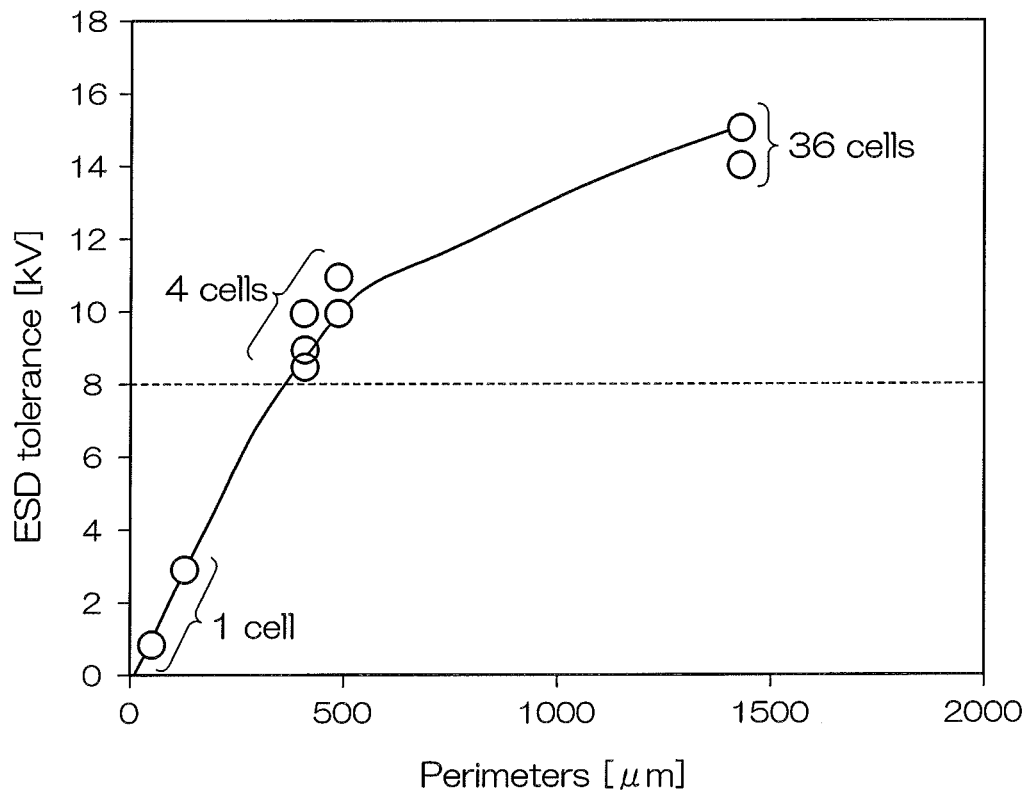
FIG. 29 shows results of an experiment measuring the ESD tolerance of multiple samples having their respective different total perimeters (total extensions) of pn junction regions for various sizes and/or numbers of diode cells formed on a semiconductor substrate of the same area.

FIG. 29 shows results of an experiment measuring the ESD tolerance of multiple samples having their respective different total perimeters (total extensions) of pn junction regions for various sizes and/or numbers of diode cells formed on a semiconductor substrate of the same area. The experimental results show that the greater the perimeters of the pn junction regions, the higher the ESD tolerance becomes. When four or more diode cells were formed on a semiconductor substrate, an ESD tolerance of higher than 8 kV was achieved.

Further, in this preferred embodiment of Reference Example 1, the widths W1, W2 of the lead-out electrodes L301, L302 are greater than the width of the cell connection portions C301 to C304 everywhere from the cell connection portions C301 to C304 to the cathode pad 305. This allows the allowable amount of current to be enlarged and the electromigration to be reduced to improve the high-current reliability. That is, it is possible to provide a chip diode with a small size having a high ESD tolerance and securing high-current reliability.

Also, in this preferred embodiment of Reference Example 1, the multiple diode cells D301, D303 and D302, D304 arranged linearly toward the cathode pad 305 are connected to the cathode pad 305 through the respective common linear lead-out electrodes L301, L302. This allows the length of the lead-out electrodes from the diode cells D301 to D304 to the cathode pad 305 to be minimized and thereby the electromigration to be reduced more effectively. In addition, since the multiple diode cells D301, D303 and D302, D304 can share the respective lead-out electrodes L301, L302, it is possible to layout the wide lead-out electrodes on the semiconductor substrate 302 while thus forming the multiple diode cells D301 to D304 to increase the perimeters of the diode junction regions (pn junction regions 311). This allows for both further improvement in the ESD tolerance and reduction in the electromigration for further improvement in reliability.

Further, since the end portions of the lead-out electrodes L301, L302 have a partially polygonal shape to match the geometry (polygon) of the n$^+$-type regions 310, the lead-out electrodes L301, L302 with a reduced occupation area can be connected to the n$^+$-type regions 310.

Figure 30:
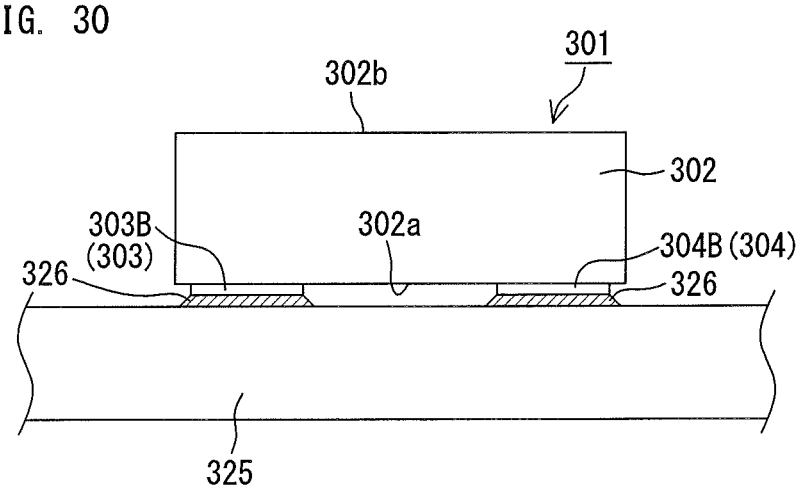
FIG. 30 is a cross-sectional view showing the configuration of a circuit assembly in which the chip diode according to the preferred embodiment of Reference Example 1 is flip-chip connected onto a mounting substrate.

Furthermore, both the cathode and the anode external connection electrodes 303B, 304B are formed on the device forming surface 302a, one of the surfaces of the semiconductor substrate 302. Hence, as shown in FIG. 30, facing the device forming surface 302a toward a mounting substrate 325 and bonding the external connection electrodes 303B, 304B by soldering 326 onto the mounting substrate 325 allows a circuit assembly to be configured in which the chip diode 301 is surface-mounted on the mounting substrate 325. That is, the chip diode 301 of a flip-chip connection type can be provided and connected by wireless bonding to the mounting substrate 325, specifically by face-down bonding in which the device forming surface 302a is faced toward the mounting surface of the mounting substrate 325. This can reduce the occupation space of the chip diode 301 on the mounting substrate 325. It is particularly possible to achieve a reduction in the height of the chip diode 301 on the mounting substrate 325. As a result, it is possible to make use of the space in the casing of a small electronic device or the like, contributing to high-density mounting and size reduction.

Also, in this preferred embodiment of Reference Example 1, the insulating film 315 is formed on the semiconductor substrate 302, and the cell connection portions C301 to C304 of the lead-out electrodes L301, L302 are connected to the respective diode cells D301 to D304 via the contact holes 316 formed in the insulating film 315. The cathode pad 305 is then disposed on the insulating film 315 in a region outside the contact holes 316. That is, the cathode pad 305 is provided at a position distant from the regions immediately above the pn junction regions 311. The anode electrode film 304A is also connected to the semiconductor substrate 302 via the contact holes 317 formed in the insulating film 315, and the anode pad 306 is disposed on the insulating film 315 in a region outside the contact holes 317. The anode pad 306 is also provided at a position distant from the regions immediately above the pn junction regions 311. This can avoid a large shock acting on the pn junction regions 311 when the chip diode 301 is mounted on the mounting substrate 325. It is therefore possible to prevent the pn junction regions 311 from being damaged and thereby to achieve a chip diode having good durability against an external force. Another arrangement may be employed in which the cathode pad 305 and the anode pad 306 are provided, respectively, as a cathode external connection portion and an anode connection portion without providing the external connection electrodes 303B, 304B and bonding wires are connected to the cathode pad 305 and the anode pad 306. Also in this case, it is possible to prevent the pn junction regions 311 from being damaged due to a shock during the wire bonding.

Also, in this preferred embodiment of Reference Example 1, the anode electrode film 304A is composed of an AlSiCu film. An AlSiCu film has a work function approximate to that of a p-type semiconductor (particularly a p-type silicon semiconductor) and therefore can come into good ohmic contact with the p$^+$-type semiconductor substrate 302. It is therefore not necessary to form a diffusion layer of a high impurity concentration for ohmic contact on the p$^+$-type semiconductor substrate 302. This can simplify the manufacturing process and productivity can be improved and production costs can be reduced accordingly. Alternatively, an AlSi electrode film material may be applied to an electrode film that can come into ohmic contact with a p-type semiconductor, but the AlSiCu electrode film can lead to a further improvement in reliability compared to the AlSi electrode film.

Also, in this preferred embodiment of Reference Example 1, the anode electrode film 304A may be composed of a Ti/Al laminated film or a Ti/TiN/AlCu laminated film. Using such a laminated film as an electrode film makes it possible to prevent the electrode film from spiking into the p$^+$-type semiconductor substrate 302 through the n$^+$-type region 310, which has a depth of as small as 0.2 μm to 0.7 μm. On the other hand, the Ti/Al laminated film or the Ti/TiN/AlCu laminated film is less likely to come into ohmic contact with a p-type semiconductor. However, in this preferred embodiment of Reference Example 1, the semiconductor substrate 302 has a relatively low resistivity of 5 mΩ·cm to 20 mΩ·cm, so that it is possible to provide a good ohmic contact between the laminated film and the p$^+$-type semiconductor substrate 302 without forming a p$^+$-type diffusion layer on the semiconductor substrate 302.

Further, in this preferred embodiment of Reference Example 1, the semiconductor substrate 302 has a rectangular shape with round corner portions 309. This can reduce or prevent chipping of the corner portions of the chip diode 301 and thereby can provide a chip diode 301 with less possibility of poor appearance.

Furthermore, in this preferred embodiment of Reference Example 1, since the recessed portion 308 indicating the cathode side is defined in the short side of the semiconductor substrate 302 closer to the cathode external connection electrode 303B, there is no need to define a cathode mark on the other surface (principal surface opposite to the device forming surface 302a) of the semiconductor substrate 302. The recessed portion 308 may be defined at the same time during the process of cutting the chip diode 301 out of a wafer (original substrate), and also can be defined to indicate the cathode side even if the chip diode 301 may have a small size and marking is difficult. It is therefore possible to skip the step of marking and provide a cathode mark even in a small-sized chip diode 301.

Figure 31:
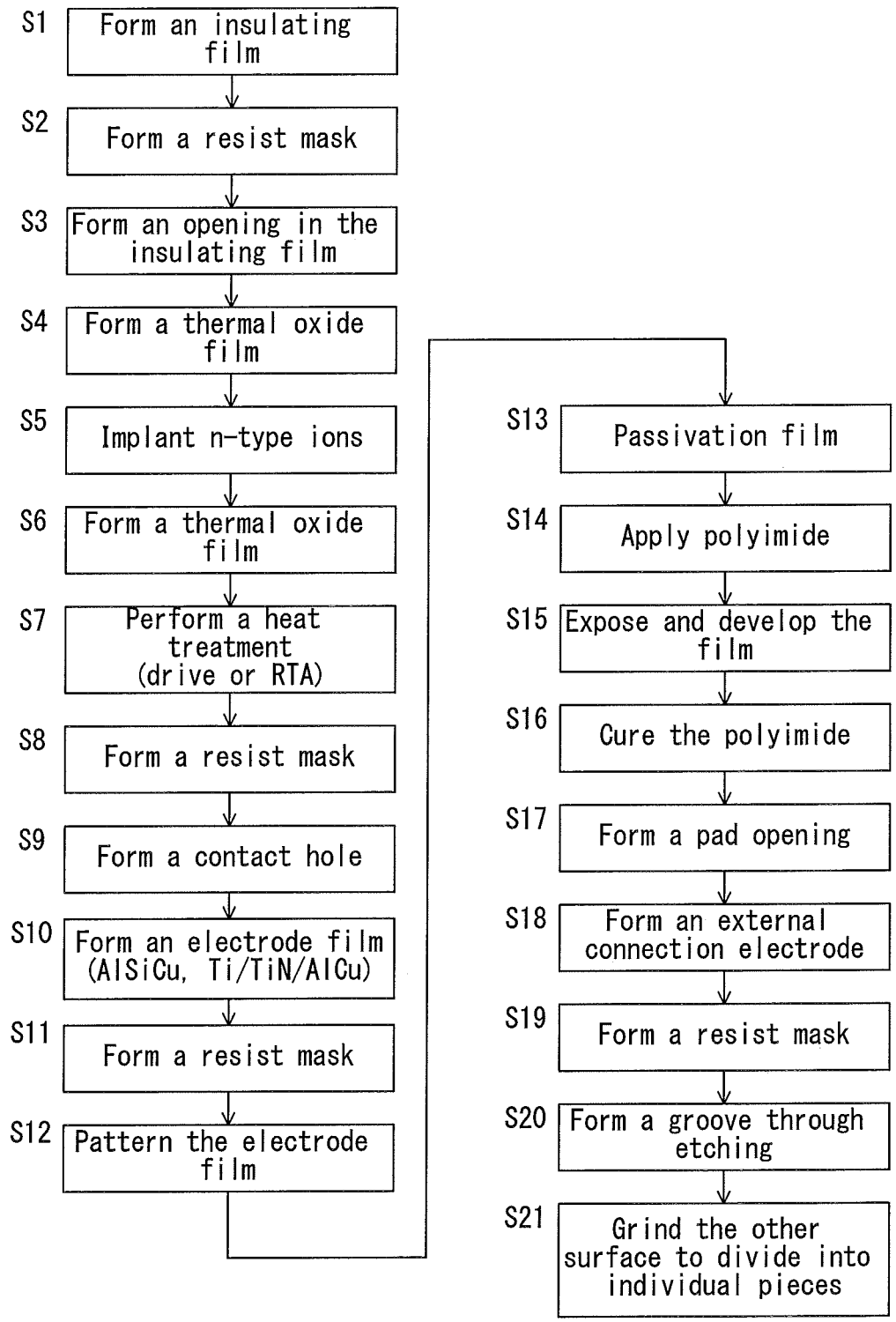
FIG. 31 is a process chart for illustrating an exemplary process of manufacturing the chip diode according to the preferred embodiment of Reference Example 1.
Figure 32A:
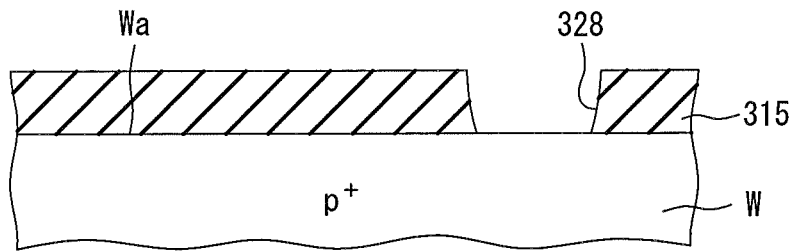
FIGS. 32A to 32E are cross-sectional views showing the configuration of the chip diode according to the preferred embodiment of Reference Example 1 at steps during the manufacturing process.
Figure 32B:
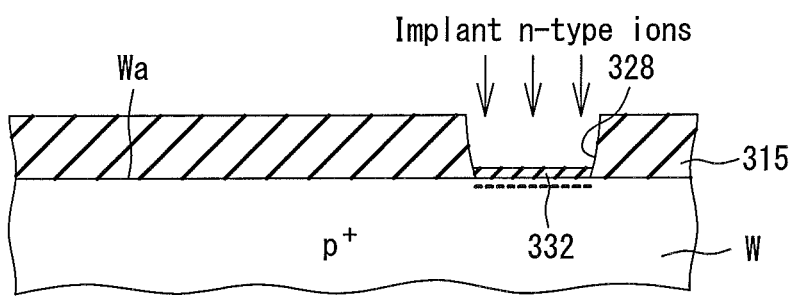
Figure 32C:
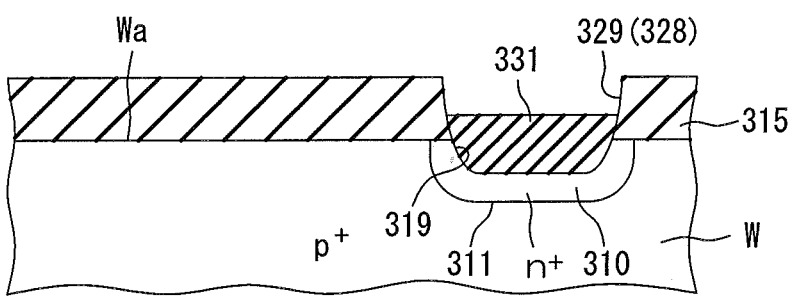
Figure 32D:
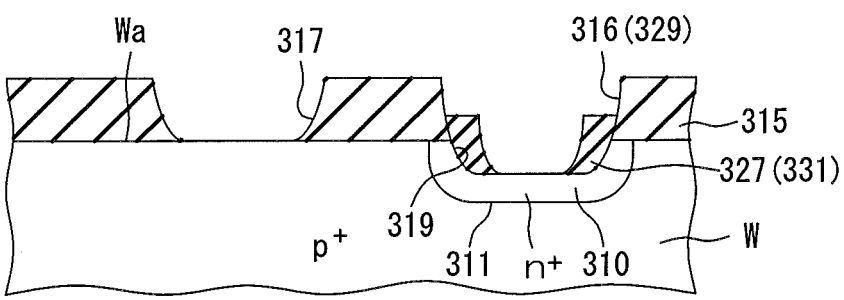
Figure 32E:
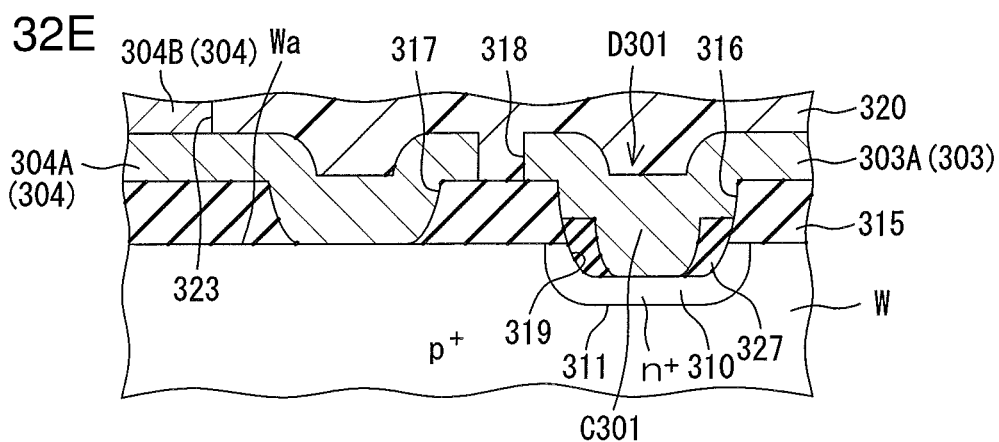
Figure 33A:
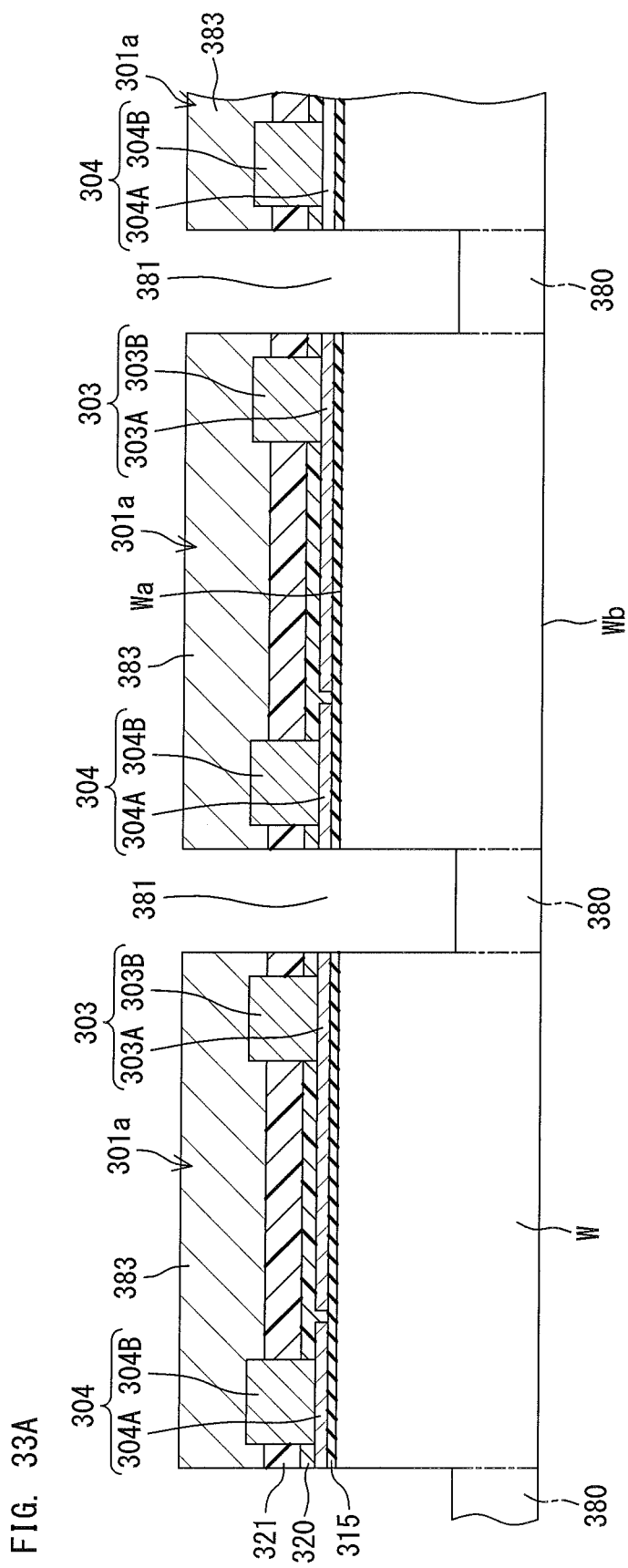
FIG. 33A is a cross-sectional view showing the configuration of the chip diode according to the preferred embodiment of Reference Example 1 at a step during the manufacturing process.
Figure 33B:
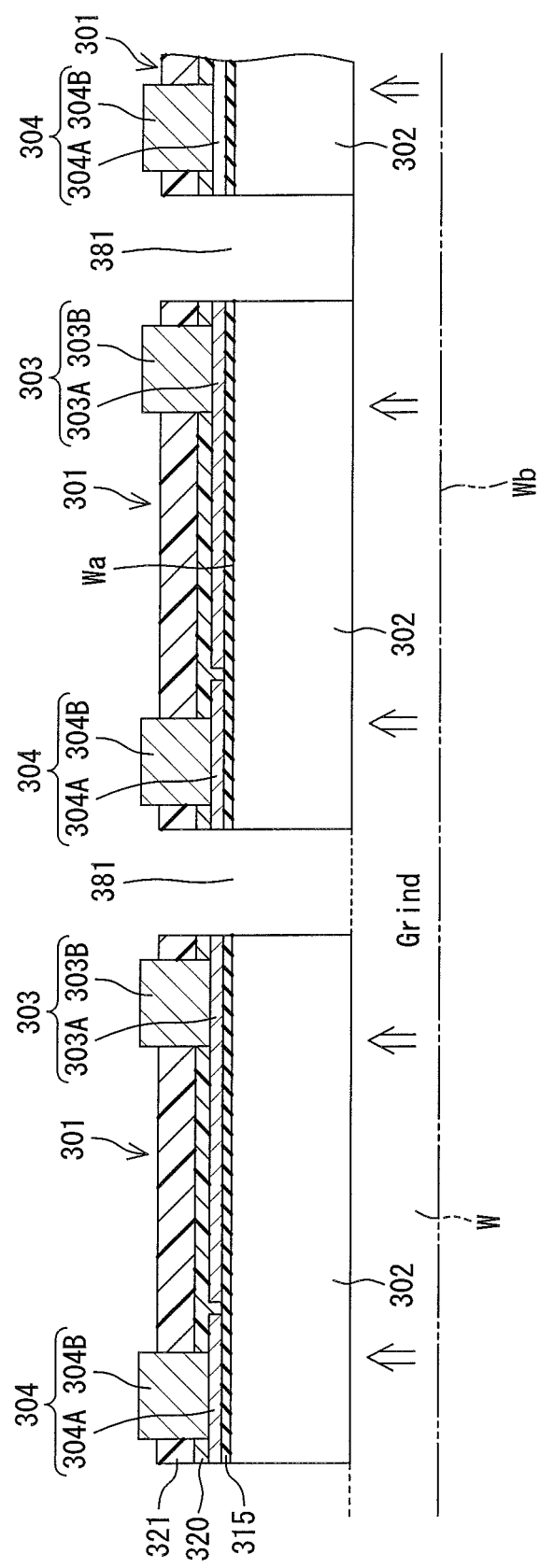
FIG. 33B is a cross-sectional view showing the configuration at a step following the step of FIG. 33A.
Figure 34:
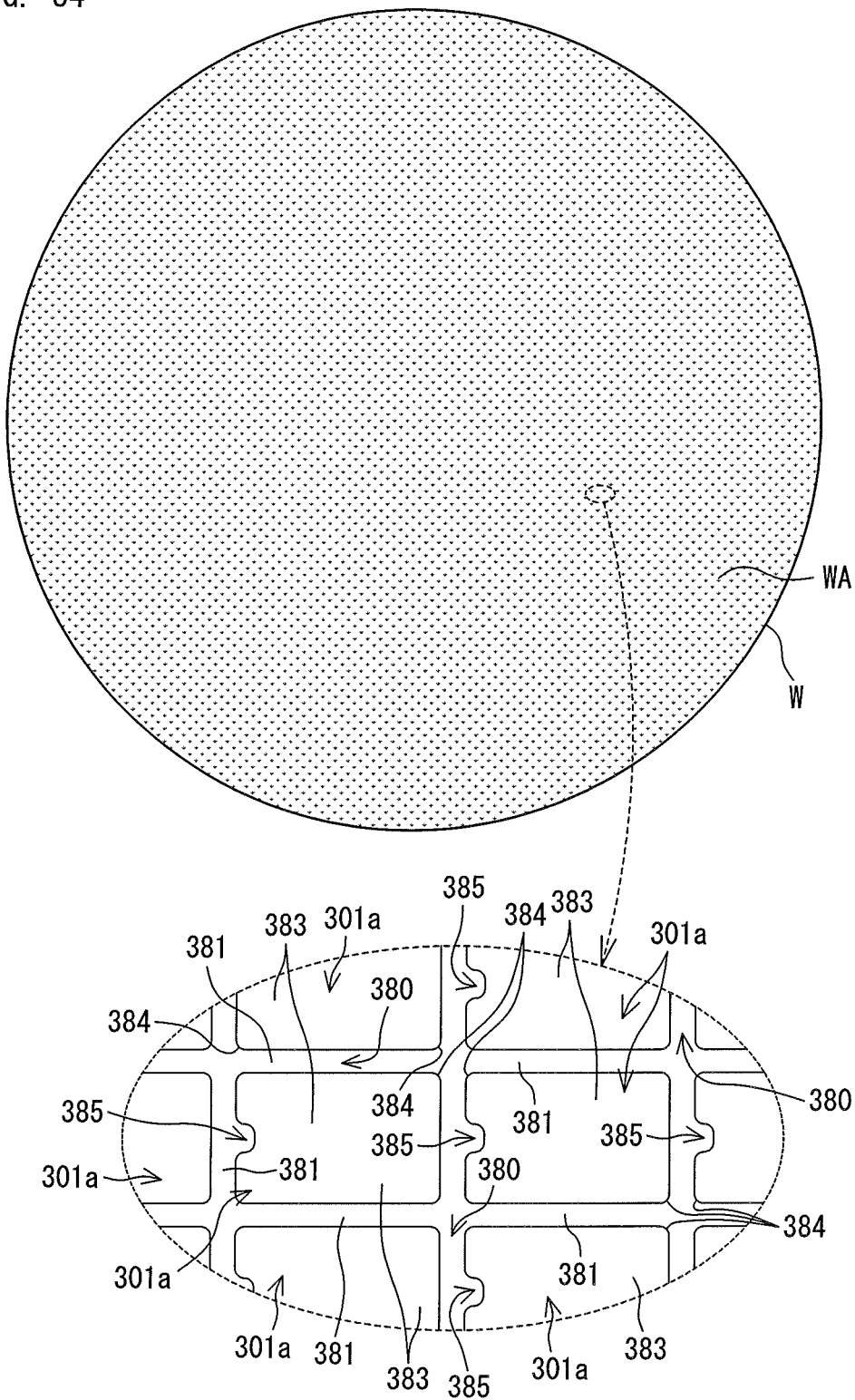
FIG. 34 is a plan view of a semiconductor wafer serving as an original substrate for the semiconductor substrate of the chip diode, partially showing a region in an enlarged manner.

FIG. 31 is a process chart for illustrating an exemplary process of manufacturing the chip diode 301. FIGS. 32 (a) to 32 (e) are cross-sectional views showing the configuration of the chip diode according to the preferred embodiment of Reference Example 1 at steps during the manufacturing process. FIGS. 33A and 33B are cross-sectional views showing the configuration at steps during the manufacturing process in FIG. 31, showing sections corresponding to FIG. 25. FIG. 34 is a plan view of a p$^+$-type semiconductor wafer W serving as an original substrate for the semiconductor substrate 302, partially showing a region in an enlarged manner.

First, a p$^+$-type semiconductor wafer W is provided as an original substrate for the semiconductor substrate 302. One of the surfaces of the semiconductor wafer W is a device forming surface Wa corresponding to the device forming surface 302a of the semiconductor substrate 302. On the device forming surface Wa, multiple chip diode regions 301a corresponding to multiple chip diodes 301 are arranged and set in a matrix manner. A boundary region 380 is provided between adjacent ones of the chip diode regions 301a. The boundary region 380 is a band-shaped region having an approximately constant width and extends in two orthogonal directions to form a grid. After performing necessary steps on the semiconductor wafer W, the semiconductor wafer W is cut apart along the boundary region 380 to obtain multiple chip diodes 301.

Exemplary steps to be performed on the semiconductor wafer W are as follows.

First, as shown in FIG. 32 (a), an insulating film 315 composed of a thermal oxide film is formed on the device forming surface Wa of the p$^+$-type semiconductor wafer W (S1), and a resist mask (not shown) is formed on the film (S2). Through etching using the resist mask, an opening 328 corresponding to the n$^+$-type region 310 is formed in the insulating film 315 (S3).

Next, as shown in FIG. 32 (b), after the resist mask is peeled off, a thermal oxide film 332 for reduction of ion implantation damage is formed, as necessary, on the entire device forming surface Wa exposed through the opening 328 (S4). Next, n-type impurity ions (phosphorous ions, for example) are implanted into a surficial portion of the semiconductor wafer W exposed through the opening 328 that is formed in the insulating film 315 (S5).

Next, as shown in FIG. 32 (c), another resist mask (not shown) having an opening corresponding to an opening 329 with a width greater than that of the opening 328 is formed on the insulating film 315 as necessary. Through etching using the resist mask, the thermal oxide film 332 is peeled off and the opening 328 is widened to be the opening 329. Within the opening 329, the device forming surface Wa is then thermally oxidized selectively to form a thermal oxide film 331 (S6). The thermal oxide film 331 transforms silicon in the vicinity of the device forming surface Wa of the semiconductor wafer W into oxide silicon to grow not on the device forming surface Wa but also toward the other surface so that a recessed portion 319 continuing to the opening 329 is formed in the device forming surface Wa. Thereafter, a heat treatment for activation of the impurity ions introduced into the semiconductor wafer W is performed (S7). The heat treatment can employ a drive-in process or an RTA process. If the semiconductor substrate 302 used has a resistivity of 5 mΩ·cm to 20 mΩ·cm, a drive-in process is preferably applied, while if the semiconductor substrate 302 used has a resistivity of 5 mΩ·cm to 10 mΩ·cm, an RTA process is preferably applied. Thus combining the resistivity and the process allows the n$^+$-type region 310 having a depth of 0.7 μm to 3.0 μm to be formed successfully through the former drive-in process, while the n$^+$-type region 310 having a depth of 0.2 μm to 0.7 μm to be formed successfully through the latter RTA process. It is noted that the conditions (temperature and duration) of the drive-in process and the RTA process can be selected according to a targeted depth of the n$^+$-type region 310.

Next, as shown in FIG. 32 (d), a further resist mask having openings corresponding to the contact holes 316, 317 is formed on the insulating film 315 (S8). Through etching using the resist mask, the contact holes 316, 317 are formed in the insulating film 315 (S9). At the same time, the thermal oxide film 331 is partially and selectively removed and the remaining portion is formed as an insulating film 327. Thereafter, the resist mask is peeled off.

Next, as shown in FIG. 32 (*e*), an electrode film for the cathode electrode 303 and the anode electrode 304 is formed by, for example, sputtering on the insulating film 315 (S10). In this preferred embodiment of Reference Example 1, an electrode film composed of AlSiCu (having a thickness of 10000 Å, for example) is formed. Alternatively, a Ti film, a TiN film, and an AlCu film may be sputtered in this order to form an electrode film composed of the lamination of the films. Another resist mask having an opening pattern corresponding to the slit 318 is then formed on the electrode film (S11) and, through etching (reactive ion etching, for example) using the resist mask, the slit 318 is formed in the electrode film (S12). The slit 318 may have a width of about 3 µm. The electrode film is thus divided into the cathode electrode film 303A and the anode electrode film 304A.

Next, after the resist film is peeled off, a passivation film 320 such as a nitride film is formed by, for example, a CVD method (S13), and further a resin film 321 is formed by application of polyimide or the like (S14). For example, photosensitive polyimide is applied and exposed with a pattern corresponding to the pad openings 322, 323, and then the polyimide film is developed (S15). This causes openings corresponding to the pad openings 322, 323 to be formed in the resin film 321. Thereafter, a heat treatment is performed to cure the resin film as necessary (S16). Subsequently, through dry etching (reactive ion etching, for example) using the resin film 321 as a mask, the pad openings 322, 323 are formed in the passivation film 320 (S17). Thereafter, the external connection electrodes 303B, 304B are formed within the respective pad openings 322, 323 (S18). The external connection electrodes 303B, 304B can be formed by plating (preferably electroless plating).

Next, a resist mask 383 (see FIG. 33A) having a grid-shaped opening corresponding to the boundary region 380 (see FIG. 34) is formed (S19). Through plasma etching using the resist mask 383, the semiconductor wafer W is etched to a predetermined depth from the device forming surface Wa as shown in FIG. 33A. As a result, a groove 381 for cutting is formed along the boundary region 380 (S20). After the resist mask 383 is peeled off, the semiconductor wafer W is ground from the other surface Wb to the bottom of the groove 381 as shown in FIG. 33B (S21). As a result, the multiple chip diode regions 301a are divided into individual pieces and the chip diodes 301 of the above-described structure can be obtained.

As shown in FIG. 34, the resist mask 383 used to form the groove 381 in the boundary region 380 has outward convex curved and round-shaped portions 384 at positions in contact with the four corners of each chip diode region 301a. The round-shaped portions 384 are each formed to connect two adjacent ones of the sides of the chip diode region 301a with a smooth curve. The resist mask 383 used to form the groove 381 in the boundary region 380 further has a recessed portion 385 recessed toward the interior of each chip diode region 301a at a position in contact with one of the short sides of the chip diode region 301a. Accordingly, the groove 381, when formed through plasma etching using the resist mask 383 as a mask, has outward convex curved and round-shaped portions at positions in contact with the four corners of each chip diode region 301a and a recessed portion recessed toward the interior of each chip diode region 301a at a position in contact with one of the short sides of the chip diode region 301a. Thus, during the step of forming the groove 381 to cut the chip diode regions 301a out of the semiconductor wafer W, the four corner portions 309 of each chip diode 301 can be formed in a round shape and the recessed portion 308 can be defined in one of the short sides (closer to the cathode) as a cathode mark. That is, the corner portions 309 can be formed in a round shape and the recessed portion 308 can be formed as a cathode mark without adding a dedicated step.

In this preferred embodiment of Reference Example 1, since the semiconductor substrate 302 is composed of a p-type semiconductor, it is possible to achieve stable characteristics without forming an epitaxial layer on the semiconductor substrate 302. That is, in the case of using an n-type semiconductor wafer, which has large in-plane resistivity variation, it is necessary to form an epitaxial layer, which has small in-plane resistivity variation on the surface and form an impurity diffusion layer on the epitaxial layer to define a pn junction. This is for the reason that since the n-type impurity has a low segregation coefficient, when an ingot (silicon ingot, for example) causing a semiconductor wafer is formed, there is a great difference in the resistivity between the center and the periphery of the wafer. On the other hand, in the case of using a p-type semiconductor wafer, which has small in-plane resistivity variation because the p-type impurity has a relatively high segregation coefficient, it is possible to cut a diode with stable characteristics out of any site of the wafer without forming an epitaxial layer. Thus using the p$^+$-type semiconductor substrate 302 can simplify the manufacturing process and reduce the manufacturing cost.

Also, in accordance with this preferred embodiment of Reference Example 1, since the thermal oxide film 331 is formed before the heat treatment (see FIG. 32 (*c*)), the p-type impurity concentration in the surface portion of the semiconductor wafer W can be reduced utilizing the heat during the thermal oxidation. In addition, the semiconductor wafer W used has a resistivity of 5 mΩ·cm to 20 mΩ·cm. Thus, since the heat treatment is performed such that the n-type impurity ions are diffused to a depth of 0.2 µm to 3.0 µm and the heat during the heat treatment is applied to the semiconductor wafer W, it is possible to precisely control the Zener voltage of the chip diode 301 to be from 5.5 V to 7.0 V.

In particular, if it is intended to control the Zener voltage to be within a relatively lower range (5.5 V to 6.0 V) in the above range, the semiconductor substrate 302 with a resistivity of 5 mΩ·cm to 10 mΩ·cm can undergo an RTA process. In this case, the depth of the n$^+$-type region 310 becomes approximately 0.2 µm to 0.7 µm, so that the electrode film (cathode electrode film 303A) can select a Ti/Al laminated film or a Ti/TiN/AlCu laminated film to prevent the electrode film from spiking into the semiconductor substrate 302.

On the other hand, if it is intended to control the Zener voltage to be within a relatively higher range (6.0 V to 7.0 V) in the above range, the semiconductor substrate 302 with a resistivity of 5 mΩ·cm to 20 mΩ·cm can undergo a drive-in process. In this case, the depth of the n$^+$-type region 310 becomes approximately 0.7 µm to 3.0 µm, so that the electrode film is less likely to spike into the semiconductor substrate 302. Accordingly, the electrode film can select an AlSiCu electrode film, which is likely to come into ohmic contact with the semiconductor substrate 302.

Figure 35:
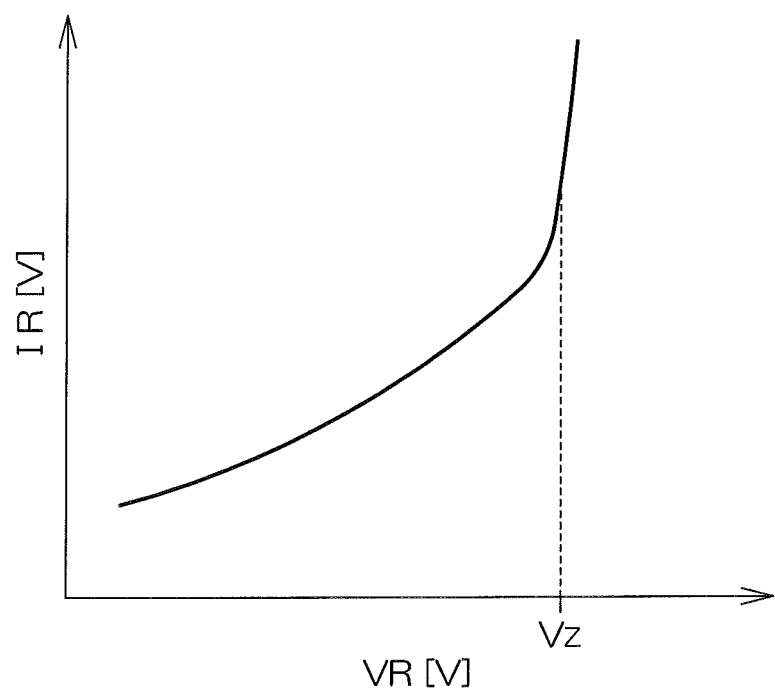
FIG. 35 illustrates the Zener voltage (Vz) of the chip diode.

It is noted that the Zener voltage is a voltage Vz at which the current rises rapidly in the reverse I-V curve of the chip diode 301 shown in FIG. 35, for example.

Figure 36:
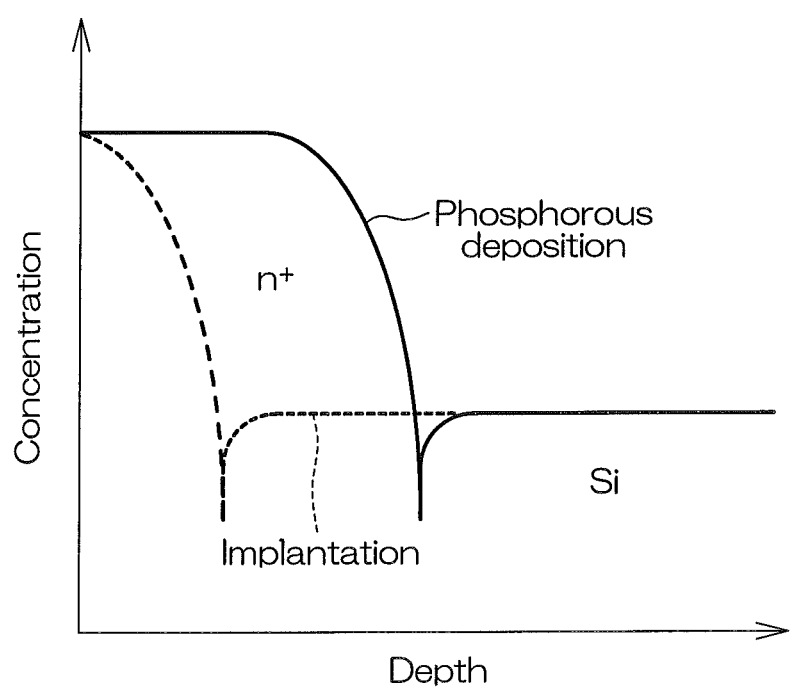
FIG. 36 shows a concentration profile in an $n^+$-type region.

Further, in this preferred embodiment of Reference Example 1, since the introduction of the n-type impurity is performed through ion implantation, the $n^+$-type region 310 of the chip diode 301 can have a concentration profile of continuous decrease to a predetermined depth from the device forming surface 302*a* of the semiconductor substrate 302 as shown in FIG. 36. In contrast, the n-type impurity, if introduced through phosphorous deposition, has a constant concentration profile to a predetermined depth from the device forming surface 302*a*.

Figure 37A:
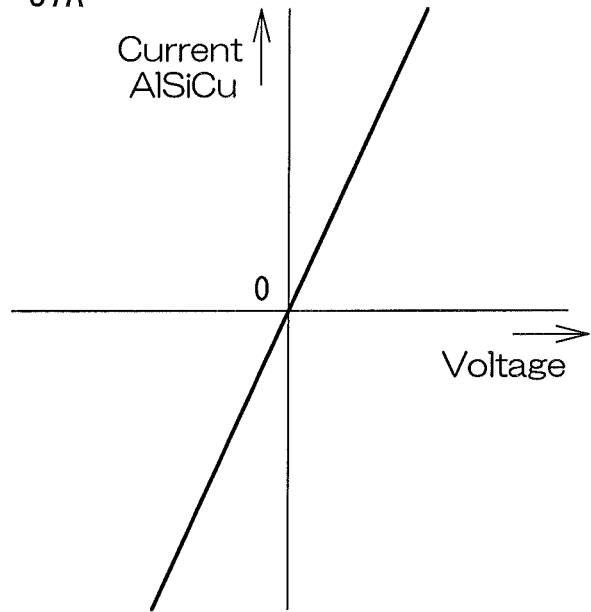
FIG. 37A illustrates the ohmic contact between an AlSiCu electrode film and a $p^+$-type semiconductor substrate.

FIG. 37A illustrates the ohmic contact between an AlSiCu electrode film and a $p^+$-type semiconductor substrate, showing the voltage-current characteristic between a $p^+$-type silicon substrate and an AlSiCu film formed on the $p^+$-type silicon substrate. The current is proportional to the applied voltage, showing that a good ohmic contact is provided. This shows that using an AlSiCu film as an electrode film can form a cathode electrode film and an anode electrode film in ohmic contact with the $p^+$-type semiconductor substrate without forming a high-concentration region on the $p^+$-type semiconductor substrate and thereby simplify the manufacturing process.

Figure 37B:
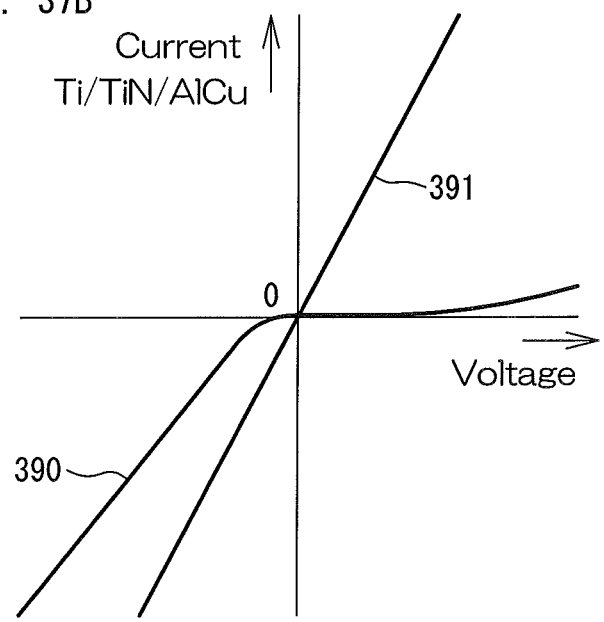
FIG. 37B illustrates the ohmic contact between a Ti/TiN/AlCu electrode film and a $p^+$-type semiconductor substrate.

FIG. 37B illustrates the ohmic contact between a Ti/TiN/AlCu electrode film and a $p^+$-type semiconductor substrate. In FIG. 37B, the same characteristic is indicated by the curve 390 for comparison in the case where an electrode film formed on a $p^+$-type silicon substrate with a resistivity of 25 mΩ·cm is composed of a laminated film in which a Ti film, a TiN film, and an AlCu film are laminated in this order on the surface of the substrate. The voltage-current characteristic is not linear, showing that no ohmic contact is provided. On the other hand, the voltage-current characteristic is indicated by the curve 391 in the case where an electrode film in contact with a $p^+$-type silicon substrate with a resistivity of 5 mΩ·cm is composed of a laminated film in which a Ti film, a TiN film, and an AlCu film are laminated in this order on the surface of the substrate. In this case, the voltage-current characteristic is linear, showing that a good ohmic contact is provided. These show that even using a Ti/TiN/AlCu electrode film as an electrode film can form a cathode electrode film and an anode electrode film in ohmic contact with the $p^+$-type semiconductor substrate by approximately selecting the resistivity of the $p^+$-type semiconductor substrate.

Figure 38:
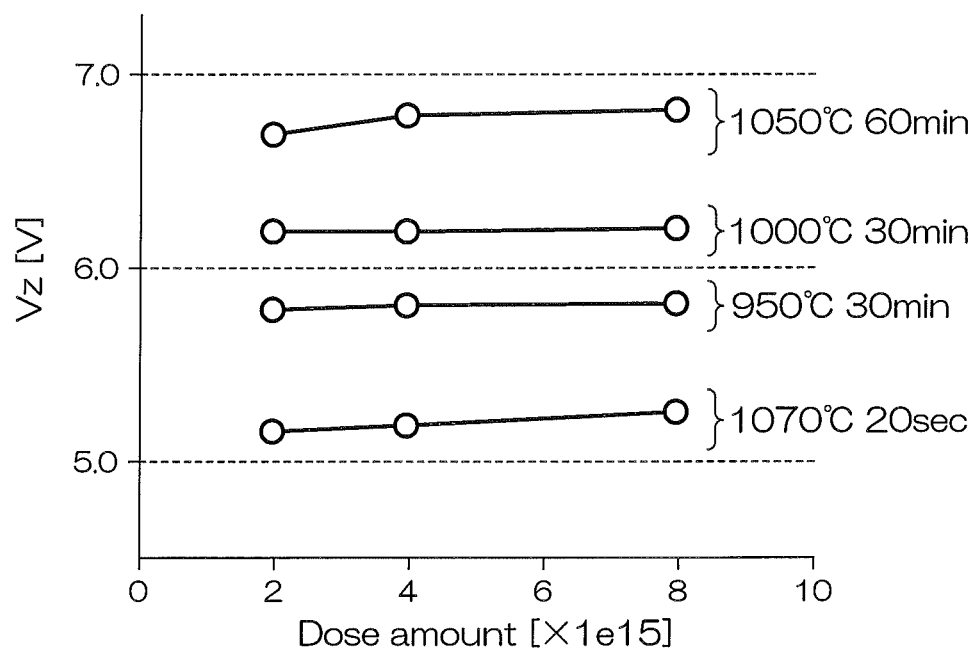
FIG. 38 illustrates a feature for the adjustment of the Zener voltage (Vz) of the chip diode.

FIG. 38 illustrates a feature for the adjustment of the Zener voltage (Vz) of the chip diode 301, that is, a feature for the adjustment of the Zener voltage when the chip diode 301 is configured as a Zener diode. To describe more specifically, after the n-type impurity (phosphor, for example) is introduced into the surficial portion of the semiconductor substrate 302 to form the $n^+$-type region 310, a heat treatment for activation of the introduced impurity is performed (FIG. 32 (*c*)). The Zener voltage varies depending on the temperature and duration of the heat treatment. Specifically, the Zener voltage tends to increase with an increase in the amount of heat applied to the semiconductor substrate 302 during the heat treatment. The Zener voltage can be adjusted using this tendency. As can be understood from FIG. 38, the Zener voltage is more strongly dependent on the amount of heat during the heat treatment than the dose amount of the impurity.

Figure 39:
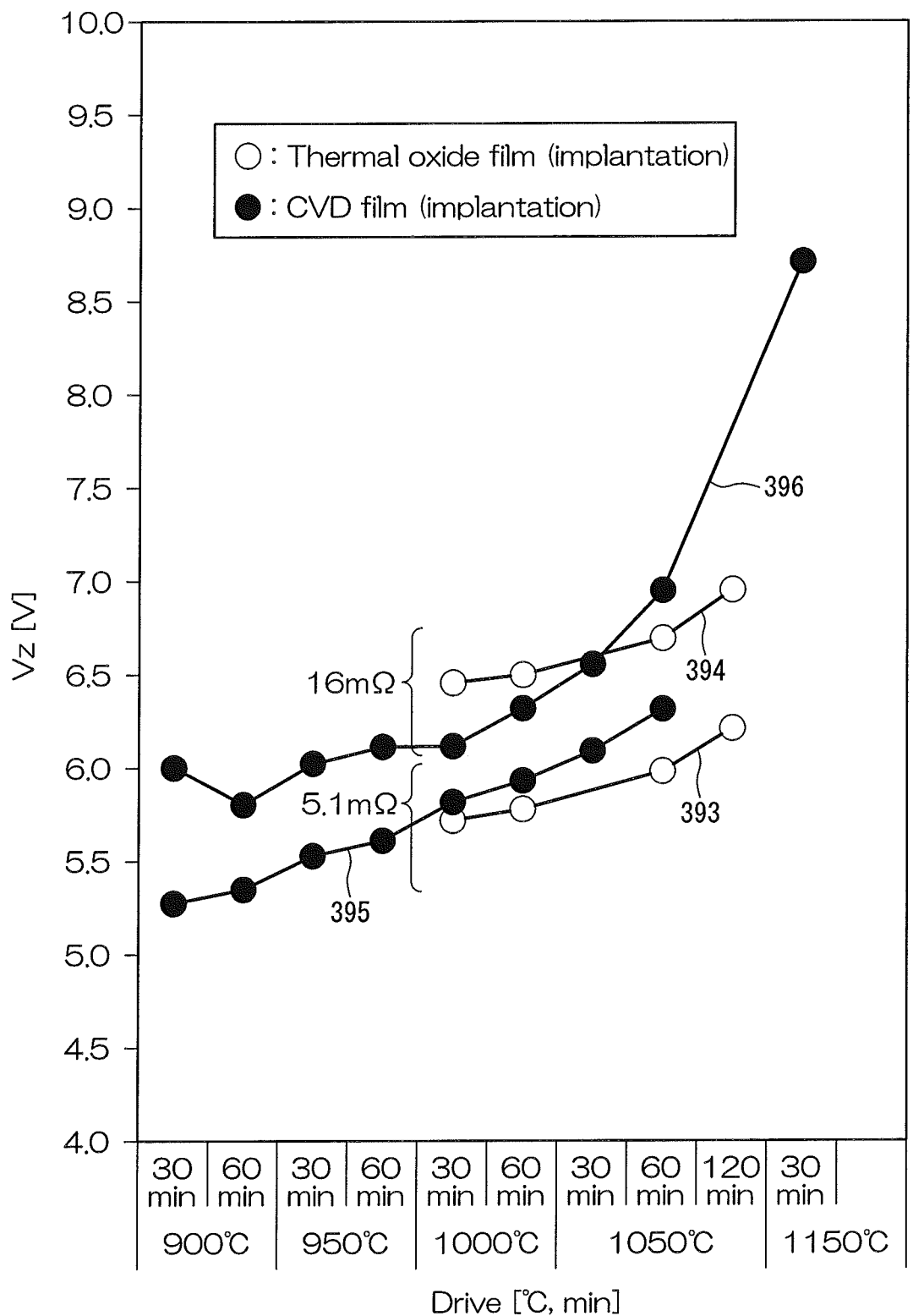
FIG. 39 illustrates another feature for the adjustment of the Zener voltage (Vz).

FIG. 39 illustrates another feature for the adjustment of the Zener voltage (Vz), and specifically shows the change in the Zener voltage (Vz) with respect to the conditions of a drive-in process. The curves 393, 394 indicate the Zener voltage in the case where a thermal oxide film 331 is formed on the device forming surface Wa before the drive-in process (FIG. 32 (*c*)). On the other hand, the curves 395, 396 indicate the Zener voltage in the case where not a thermal oxide film but a CVD film is formed on the device forming surface Wa before the drive-in process. Comparing the curves 393, 394 and the curves 395, 396, in the case where a thermal oxide film is formed, the Zener voltage is less dependent on the conditions (amount of heat) of the drive-in process as indicated by the curves 393, 394. That is, since the fluctuation of the Zener voltage due to process variations is small, it is possible to precisely control the Zener voltage to be from 5.5 to 7.0 V even if, for example, the conditions of a heat treatment such as a drive-in process cannot be controlled appropriately and thereby the amount of heat to be applied to the semiconductor substrate 302 may be too large or too small. This may be for the reason that the p-type impurity concentration in the surface portion of the semiconductor wafer W is reduced through the thermal oxidation.

Figure 40A:
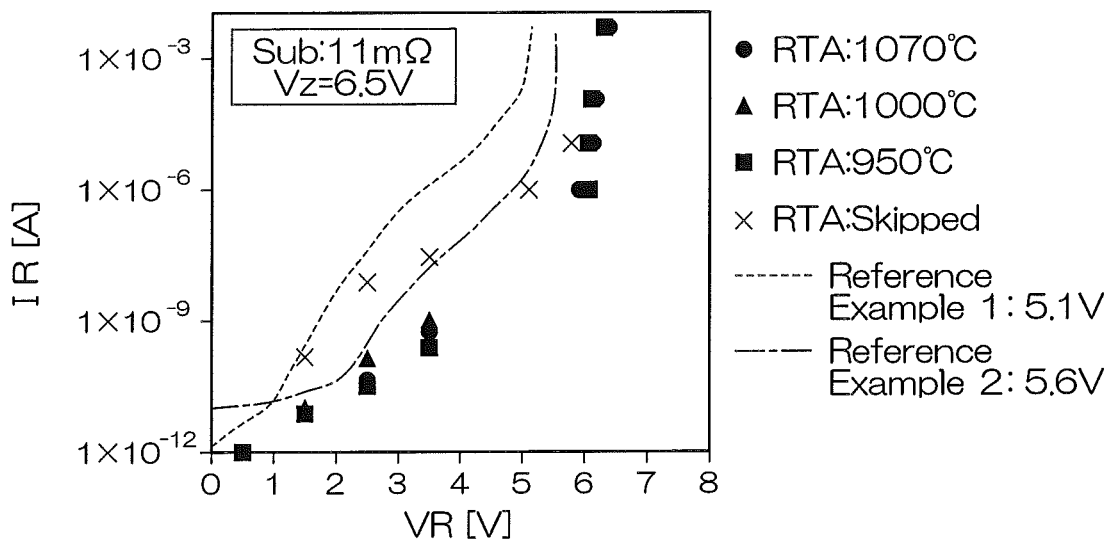
FIGS. 40A to 40C are I-V curves illustrating the dependency of a leak current on RTA process conditions.
Figure 40B:
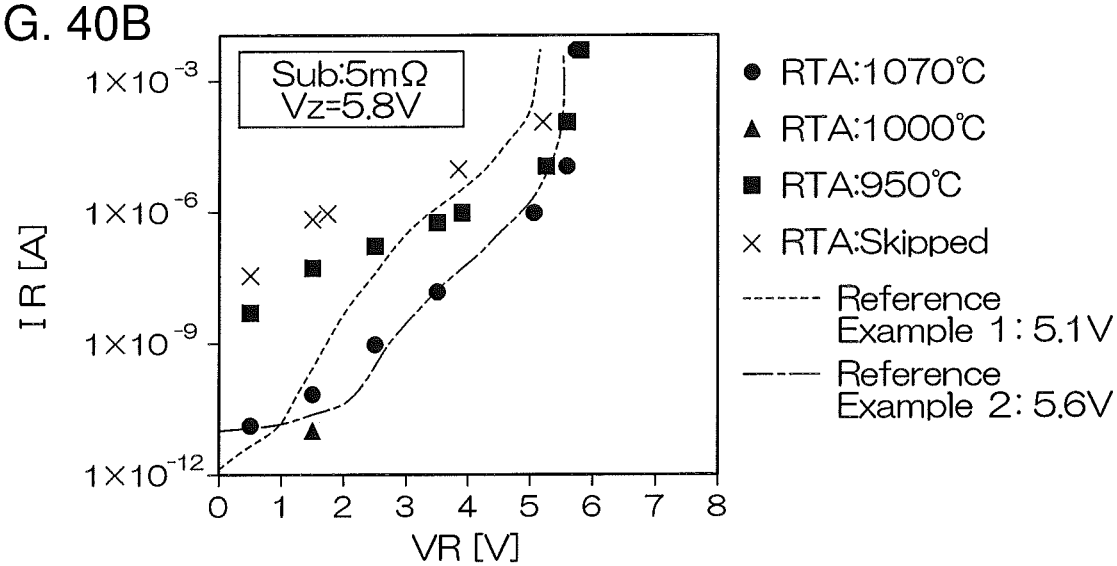
Figure 40C:
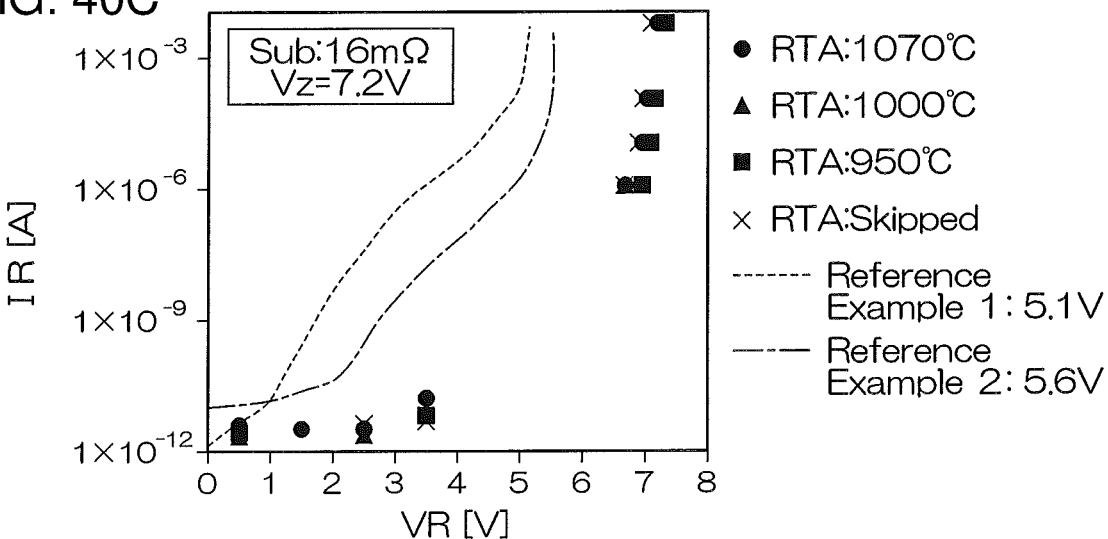

FIGS. 40 (*a*) to 40 (*c*) are I-V curves illustrating the dependency of a leak current on RTA process conditions. In FIGS. 40 (*a*) to 40 (*c*), the reference examples 1, 2 represent chip diodes having their respective different Zener voltages of 5.1 V and 5.6 V prepared by forming, before the formation of the $n^+$-type region 310, an insulating film not by thermal oxidation but by CVD and then performing a drive-in process.

FIGS. 40 (*a*) to 40 (*c*) show that if an RTA process is not performed or performed only at a relatively low temperature (950 degrees C.), a higher leak current flows relative to the case of a high temperature (1000 degrees C. or higher). In particular, as shown in FIG. 40 (*b*), if the semiconductor substrate 302 has a low resistivity and no RTA process is performed, a higher leak current flows. That is, these graphs show that the higher the temperature of the RTA process, the lower the leak current in the completed chip diode can become.

Figure 41:
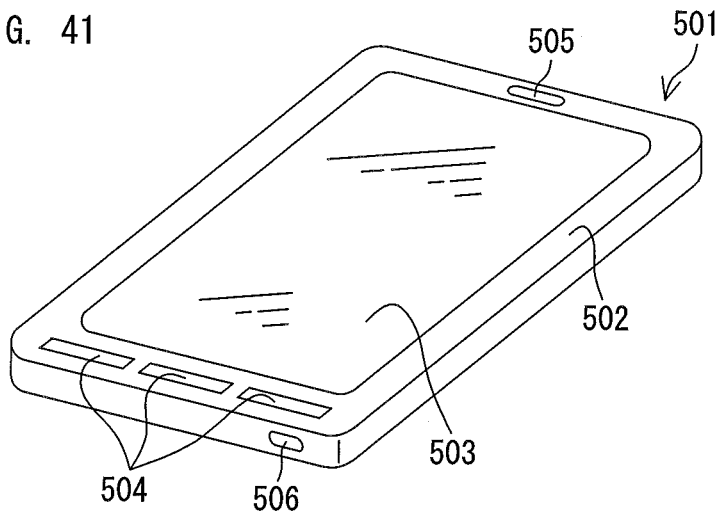
FIG. 41 is a perspective view showing the appearance of a smartphone as an exemplary electronic device in which the chip diode is used.

FIG. 41 is a perspective view showing the appearance of a smartphone as an exemplary electronic device in which the chip diode is used. The smartphone 501 is arranged by housing electronic parts inside a flat rectangular parallelepiped casing 502. The casing 502 has a pair of rectangular principal surfaces at its front side and rear side, and the pair of principal surfaces are joined by four side surfaces. A display surface of a display panel 503 composed of a liquid crystal panel, an organic EL panel, or the like is exposed on one of the principal surfaces of the casing 502. The display surface of the display panel 503 constitutes a touch panel and provides an input interface for the user.

The display panel 503 is formed in a rectangular shape that occupies most of the one principal surface of the casing 502. Operation buttons 504 are disposed along one of the short sides of the display panel 503. In this preferred embodiment of Reference Example 1, multiple (three) operation buttons 504 are arranged along the short side of the display panel 503. The user can operate the operation buttons 504 and the touch panel to perform operations on the smartphone 510 and thereby call and execute necessary functions.

A speaker 505 is disposed in the vicinity of the other short side of the display panel 503. The speaker 505 provides an earpiece for a telephone function and is also used as an acoustic conversion unit for reproduction of music data and the like. On the other hand, near the operation buttons 504, a microphone 506 is disposed in one of the side surfaces of the casing 502. The microphone 506 provides a mouthpiece for the telephone function and may also be used as a microphone for sound recording.

Figure 42:
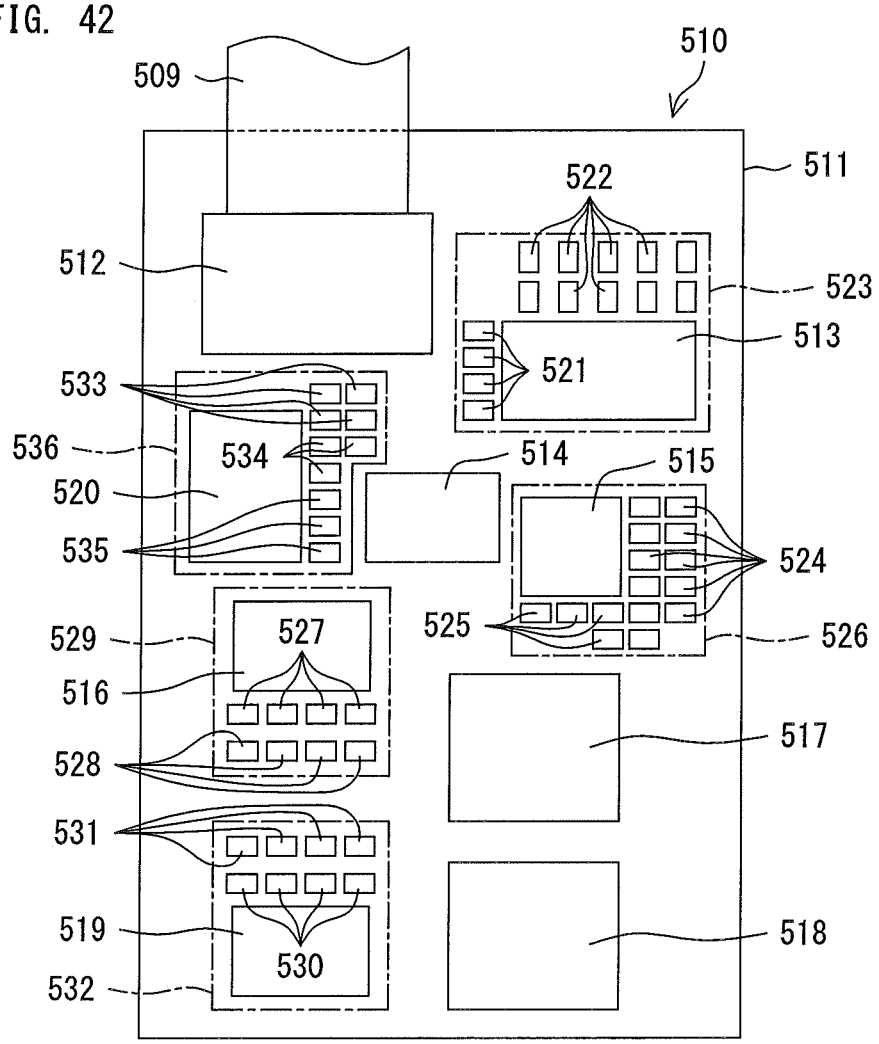
FIG. 42 is an illustrative plan view showing the configuration of an electronic circuit assembly housed in the casing of the smartphone.

FIG. 42 is an illustrative plan view showing the configuration of an electronic circuit assembly 510 housed inside the casing 502. The electronic circuit assembly 510 includes a wiring substrate 511 and circuit parts mounted on a mounting surface of the wiring substrate 511. The multiple circuit parts include multiple integrated circuit elements (ICs) 512 to 520 and multiple chip parts. The multiple ICs include a transmission processing IC 512, a one-segment TV receiving IC 513, a GPS receiving IC 514, an FM tuner IC 515, a power supply IC 516, a flash memory 517, a microcomputer 518, a power supply IC 519, and a baseband IC 520. The multiple chip parts include chip inductors 521, 525, 535, chip resistors 522, 524, 533, chip capacitors 527, 530, 534, and chip diodes 528, 531. The chip parts are mounted on the mounting surface of the wiring substrate 511 by, for example, flip-chip bonding. The chip diodes according to the above-described preferred embodiment of Reference Example 1 may be applied as the chip diodes 528, 531.

The transmission processing IC 512 has incorporated therein an electronic circuit arranged to generate display control signals for the display panel 503 and receive input signals through the touch panel on the surface of the display panel 503. For connection with the display panel 503, the transmission processing IC 512 is connected to a flexible wiring 509.

The one-segment TV receiving IC 513 has incorporated therein an electronic circuit that constitutes a receiver arranged to receive one-segment broadcast (digital terrestrial television broadcast targeted for reception by mobile devices) radio waves. Multiple chip inductors 521 and multiple chip resistors 522 are disposed in the vicinity of the one-segment TV receiving IC 513. The one-segment TV receiving IC 513, the chip inductors 521, and the chip resistors 522 constitute a one-segment broadcast receiving circuit 523. The chip inductors 521 and the chip resistors 522 have accurately adjusted inductances and resistances, respectively, and provide circuit constants of high precision to the one-segment broadcast receiving circuit 523.

The GPS receiving IC 514 has incorporated therein an electronic circuit arranged to receive radio waves from GPS satellites and output positional information of the smartphone 501.

The FM tuner IC 515 constitutes, together with multiple chip resistors 524 and multiple chip inductors 525 mounted on the wiring substrate 511 in the vicinity thereof, an FM broadcast receiving circuit 526. The chip resistors 524 and the chip inductors 525 have accurately adjusted resistances and inductances, respectively, and provide circuit constants of high precision to the FM broadcast receiving circuit 526.

Multiple chip capacitors 527 and multiple chip diodes 528 are mounted on the mounting surface of the wiring substrate 511 in the vicinity of the power supply IC 516. Together with the chip capacitors 527 and the chip diodes 528, the power supply IC 516 constitutes a power supply circuit 529.

The flash memory 517 is a storage device arranged to record operating system programs, data generated inside the smartphone 501, and data and programs acquired externally by communication functions, etc.

The microcomputer 518 is an operational processing circuit that has incorporated therein a CPU, a ROM, and a RAM and realizes multiple functions of the smartphone 501 by performing various types of operational processing. More specifically, operational processing for image processing and various application programs are realized through the operation of the microcomputer 518.

Near the power supply IC 519, multiple chip capacitors 530 and multiple chip diodes 531 are mounted on the mounting surface of the wiring substrate 511. Together with the chip capacitors 530 and the chip diodes 531, the power supply IC 519 constitutes a power supply circuit 532.

Near the baseband IC 520, multiple chip resistors 533, multiple chip capacitors 534, and multiple chip inductors 535 are mounted on the mounting surface of the wiring substrate 511. Together with the chip resistors 533, the chip capacitors 534, and the chip inductors 535, the baseband IC 520 constitutes a baseband communication circuit 536. The baseband communication circuit 536 provides communication functions for telephone communication and data communication.

With the arrangement above, electric power adjusted appropriately by the power supply circuits 529, 532 is supplied to the transmission processing IC 512, the GPS receiving IC 514, the one-segment broadcast receiving circuit 523, the FM broadcast receiving circuit 526, the baseband communication circuit 536, the flash memory 517, and the microcomputer 518. The microcomputer 518 performs operational processing in response to input signals input via the transmission processing IC 512 and causes display control signals to be output from the transmission processing IC 512 to the display panel 503 to make the display panel 503 perform various displays.

When the touch panel or the operation buttons 504 are operated for reception of a one-segment broadcast, the one-segment broadcast is received through the operation of the one-segment broadcast receiving circuit 523. The microcomputer 518 then performs operational processing for outputting received images to the display panel 503 and acoustically converting received sounds through the speaker 505.

Also, when positional information of the smartphone 501 is required, the microcomputer 518 acquires the positional information output from the GPS receiving IC 514 and performs operational processing using the positional information.

Further, when the touch panel or the operation buttons 504 are operated and an FM broadcast receiving command is input, the microcomputer 518 starts up the FM broadcast receiving circuit 526 and performs operational processing for outputting received sounds through the speaker 505.

The flash memory 517 is used to store data acquired through communications and to store data prepared by operations of the microcomputer 518 and inputs through the touch panel. The microcomputer 518 writes data into the flash memory 517 and reads data out of the flash memory 517 as necessary.

The telephone communication or data communication function is realized by the baseband communication circuit 536. The microcomputer 518 controls the baseband communication circuit 536 to perform processing for sending and receiving sounds or data.

Although the preferred embodiment of Reference Example 1 of the present invention has heretofore been described, the present invention may be implemented in yet other modes as well. For example, although the above-described preferred embodiment of Reference Example 1 describes an example in which four diode cells are formed on the semiconductor substrate, two or three diode cells may be formed or four or more diode cells may be formed on the semiconductor substrate. Alternatively, only one diode cell may be formed.

Although the above-described preferred embodiment of Reference Example 1 describes an example in which the pn junction regions are formed in a regular octagon in a plan view, the pn junction regions may be formed in any polygonal shape with three or more sides, and the planar geometry thereof may be circular or elliptical. The pn junction regions, if having a polygonal shape, may not necessarily have a regular polygonal shape and may be formed in a polygon with two or more types of side length. Yet further, there is no need to form the pn junction regions in the same size, and multiple diode cells having their respective junction regions of different sizes may be mixed on the semiconductor substrate. Moreover, the shape of the pn junction regions formed on the semiconductor substrate may not necessarily be of one type, and pn junction regions of two or more geometry types may be mixed on the semiconductor substrate.

It is noted that besides the inventions set forth in the claims, the following features can be extracted from the details of this preferred embodiment of Reference Example 1.

(Aspect 1) A chip diode with a Zener voltage Vz of 5.5 V to 7.0 V, including a semiconductor substrate having a resistivity of 5 mΩ·cm to 20 mΩ·cm and a diffusion layer formed on a surface of the semiconductor substrate and defining a diode junction region with the semiconductor substrate therebetween, in which the diffusion layer has a depth of 0.2 μm to 3.0 μm from the surface of the semiconductor substrate.

(Aspect 2) The chip diode according to aspect 1, in which the diode junction region is a pn junction region.

With the arrangement above, it is possible to provide a chip diode of a pn junction type.

(Aspect 3) The chip diode according to aspect 2, in which the semiconductor substrate is composed of a p-type semiconductor substrate, and in which the diffusion layer is an n-type diffusion layer defining the pn junction region with the p-type semiconductor substrate therebetween.

In accordance with the arrangement above, since the semiconductor substrate is composed of a p-type semiconductor substrate, it is possible to achieve stable characteristics without forming an epitaxial layer on the semiconductor substrate. That is, in the case of n-type semiconductor wafers, which have large in-plane resistivity variation, it is necessary to form an epitaxial layer, which has small in-plane resistivity variation on the surface and form an impurity diffusion layer on the epitaxial layer to define a pn junction. On the other hand, in the case of p-type semiconductor wafers, which have small in-plane variation, it is possible to cut a diode with stable characteristics out of any site of such a wafer without forming an epitaxial layer. Thus using a p-type semiconductor substrate can simplify the manufacturing process and reduce the manufacturing cost.

(Aspect 4) The chip diode according to aspect 3, further including a cathode electrode electrically connected to the n-type diffusion layer and an anode electrode electrically connected to the p-type semiconductor substrate, in which the n-type diffusion layer has a depth of 0.7 μm to 3.0 μm, and in which the cathode electrode and the anode electrode include an electrode film composed of AlSiCu which is in contact with the p-type semiconductor substrate.

AlSiCu has a work function approximate to that of a p-type semiconductor (particularly a p-type silicon semiconductor), and therefore an AlSiCu electrode film can come into good ohmic contact with a p-type semiconductor. It is therefore not necessary to form a diffusion layer of a high impurity concentration for ohmic contact on the p-type semiconductor substrate. This can further simplify the manufacturing process and productivity can be improved and production costs can be reduced accordingly. An AlSi electrode film material may also be applied to an electrode film that can come into ohmic contact with a p-type semiconductor, but the AlSiCu electrode film can lead to a further improvement in reliability compared to the AlSi electrode film. Since the n-type diffusion layer has a depth of 0.7 μm to 3.0 μm, it is possible to prevent the AlSiCu electrode film, after being formed, from spiking into the p-type semiconductor substrate through the n-type diffusion layer.

(Aspect 5) The chip diode according to aspect 3, further including a cathode electrode electrically connected to the n-type diffusion layer and an anode electrode electrically connected to the p-type semiconductor substrate, in which the n-type diffusion layer has a depth of 0.2 μm to 0.7 μm, and in which the cathode electrode and the anode electrode include an electrode film composed of a Ti/Al laminated film or a Ti/TiN/AlCu laminated film which is in contact with the p-type semiconductor substrate.

In accordance with the arrangement above, since the cathode electrode is an electrode film composed of a Ti/Al laminated film or a Ti/TiN/AlCu laminated film, it is possible to prevent the electrode film from spiking into the p-type semiconductor substrate through the n-type diffusion layer, which has a depth of as small as 0.2 μm to 0.7 μm. On the other hand, the Ti/Al laminated film or the Ti/TiN/AlCu laminated film is less likely to come into ohmic contact with a p-type semiconductor. However, the semiconductor substrate according to the present invention has a resistivity of 5 mΩ·cm to 20 mΩ·cm, so that it is possible to provide a good ohmic contact between the laminated film (anode electrode) and the p-type semiconductor substrate without forming a $p^+$-type diffusion layer on the p-type semiconductor substrate.

(Aspect 6) The chip diode according to any one of aspects 1 to 5, further including an insulating film covering the surface of the semiconductor substrate and formed with a contact hole for selective exposure of the diffusion layer, in which a recessed portion continuing to the contact hole is defined in the diffusion layer.

(Aspect 7) The chip diode according to aspect 6, further including a recessed portion insulating film formed selectively in a peripheral portion of the recessed portion.

(Aspect 8) The chip diode according to aspect 7, in which the recessed portion insulating film is formed across the boundary between the recessed portion and the contact hole.

(Aspect 9) The chip diode according to any one of aspects 1 to 8, in which the diffusion layer has a concentration profile of continuous decrease to a predetermined depth from the surface of the semiconductor substrate.

(Aspect 10) The chip diode according to any one of aspects 1 to 9, in which the surface of the semiconductor substrate has a rectangular shape with round corner portions.

The arrangement above can reduce or prevent chipping of the corner portions of the chip diode and thereby can provide a chip diode with less possibility of poor appearance.

(Aspect 11) The chip diode according to aspect 10, in which a recessed portion indicating the cathode side is defined in a middle portion of one of the sides of the rectangular shape.

In accordance with the arrangement above, since a recessed portion indicating the cathode side is defined in one of the sides of the rectangular semiconductor substrate, it is not necessary to define a mark indicating the cathode side (cathode mark) by, for example, marking on the surface of the semiconductor substrate. The recessed portion may be defined at the same time during the process of cutting the chip diode out of a wafer (original substrate), and also can be defined even if the chip diode may have a small size and marking is difficult. It is therefore possible to skip the step of marking and provide a sign indicating the cathode side even in a small-sized chip diode.

(Aspect 12) A circuit assembly including a mounting substrate and a chip diode according to any one of aspects 1 to 11 mounted on the mounting substrate.

The arrangement above allows for providing a circuit assembly including a chip diode with a Zener voltage Vz controlled precisely to be from 5.5 V to 7.0 V.

(Aspect 13) The circuit assembly according to aspect 12, in which the chip diode is connected to the mounting substrate by wireless bonding.

The arrangement above can reduce the occupation space of the chip diode on the mounting substrate, contributing to high-density mounting of electronic parts.

(Aspect 14) An electronic device including a circuit assembly according to aspect 12 or 13 and a casing housing the circuit assembly therein.

The arrangement above allows for providing an electronic device including a chip diode with a Zener voltage Vz controlled precisely to be from 5.5 V to 7.0 V.

(Aspect 15) A method for manufacturing a chip diode with a Zener voltage Vz of 5.5 V to 7.0 V, including the steps of selectively introducing an impurity into a surface of a semiconductor substrate having a resistivity of 5 mΩ·cm to 20 mΩ·cm, forming a thermal oxide film on the surface of the semiconductor substrate in a manner covering at least the region in which the impurity is introduced, and, with the thermal oxide film covering the surface of the semiconductor substrate, performing a heat treatment to diffuse the impurity to thereby form a diffusion layer defining a diode junction region with the semiconductor substrate therebetween and having a depth of 0.2 µm to 3.0 µm from the surface of the semiconductor substrate.

With the method above, it is possible to manufacture a chip diode according to aspect 1. In accordance with the method above, since the thermal oxide film is formed before the heat treatment, the impurity (n-type impurity or p-type impurity) concentration in the surface portion of the semiconductor substrate can be reduced. In addition, the semiconductor substrate used has a resistivity of 5 mΩ·cm to 20 mΩ·cm. Thus, since the heat treatment is performed such that the impurity is diffused to a depth of 0.2 µm to 3.0 µm and the heat during the heat treatment is applied to the semiconductor substrate, it is possible to precisely control the Zener voltage Vz of the chip diode to be from 5.5 V to 7.0 V.

(Aspect 16) The method for manufacturing a chip diode according to aspect 15, in which the step of introducing the impurity includes the step of forming, on the surface of the semiconductor substrate, an insulating film formed with a contact hole for selective exposure of the surface and introducing the impurity via the contact hole, and in which the step of forming the thermal oxide film includes the step of selectively and thermally oxidizing the surface of the semiconductor substrate within the contact hole and causing the thermal oxide film to grow toward the other surface of the semiconductor substrate to define a recessed portion continuing to the contact hole in the semiconductor substrate.

(Aspect 17) The method for manufacturing a chip diode according to aspect 15 or 16, in which the semiconductor substrate is composed of a p-type semiconductor substrate, and in which the step of introducing the impurity includes the step of ion-implanting an n-type impurity into the surface of the semiconductor substrate.

(Aspect 18) The method for manufacturing a chip diode according to any one of aspects 15 to 17, in which the step of forming the diffusion layer includes the step of performing a drive-in process on the semiconductor substrate such that the diffusion layer has a depth of 0.7 µm to 3.0 µm.

(Aspect 19) The method for manufacturing a chip diode according to any one of aspects 15 to 17, in which the step of forming the diffusion layer includes the step of performing an RTA (Rapid Thermal Annealing) process on the semiconductor substrate such that the diffusion layer has a depth of 0.2 µm to 0.7 µm.

Preferred Embodiment of Reference Example 2 of the Present Invention

A preferred embodiment of Reference Example 2 of the present invention will hereinafter be described in detail with reference to the accompanying drawings.

Figure 43:
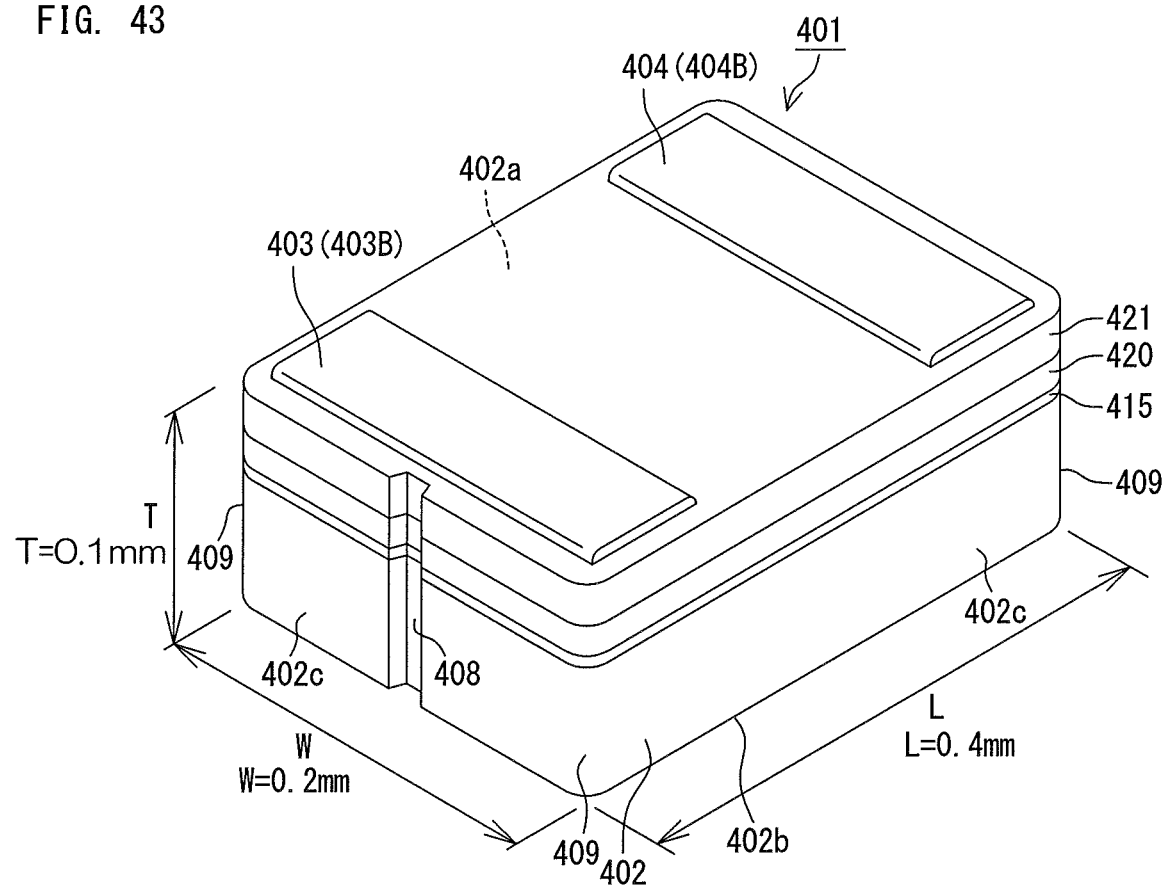
FIG. 43 is a perspective view of a chip diode according to a preferred embodiment of Reference Example 2 of the present invention.
Figure 44:
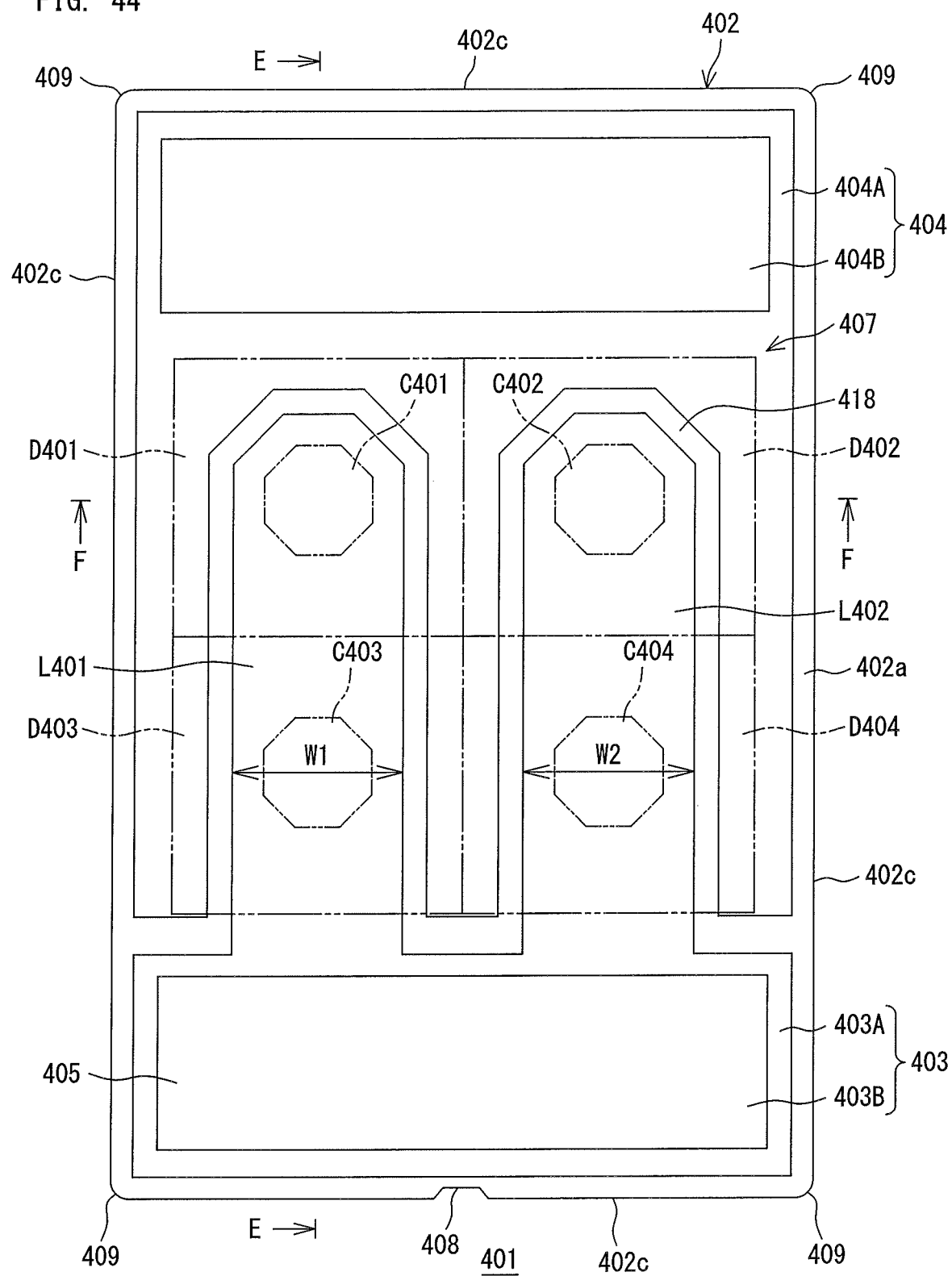
FIG. 44 is a plan view of the chip diode according to the preferred embodiment of Reference Example 2.
Figure 45:
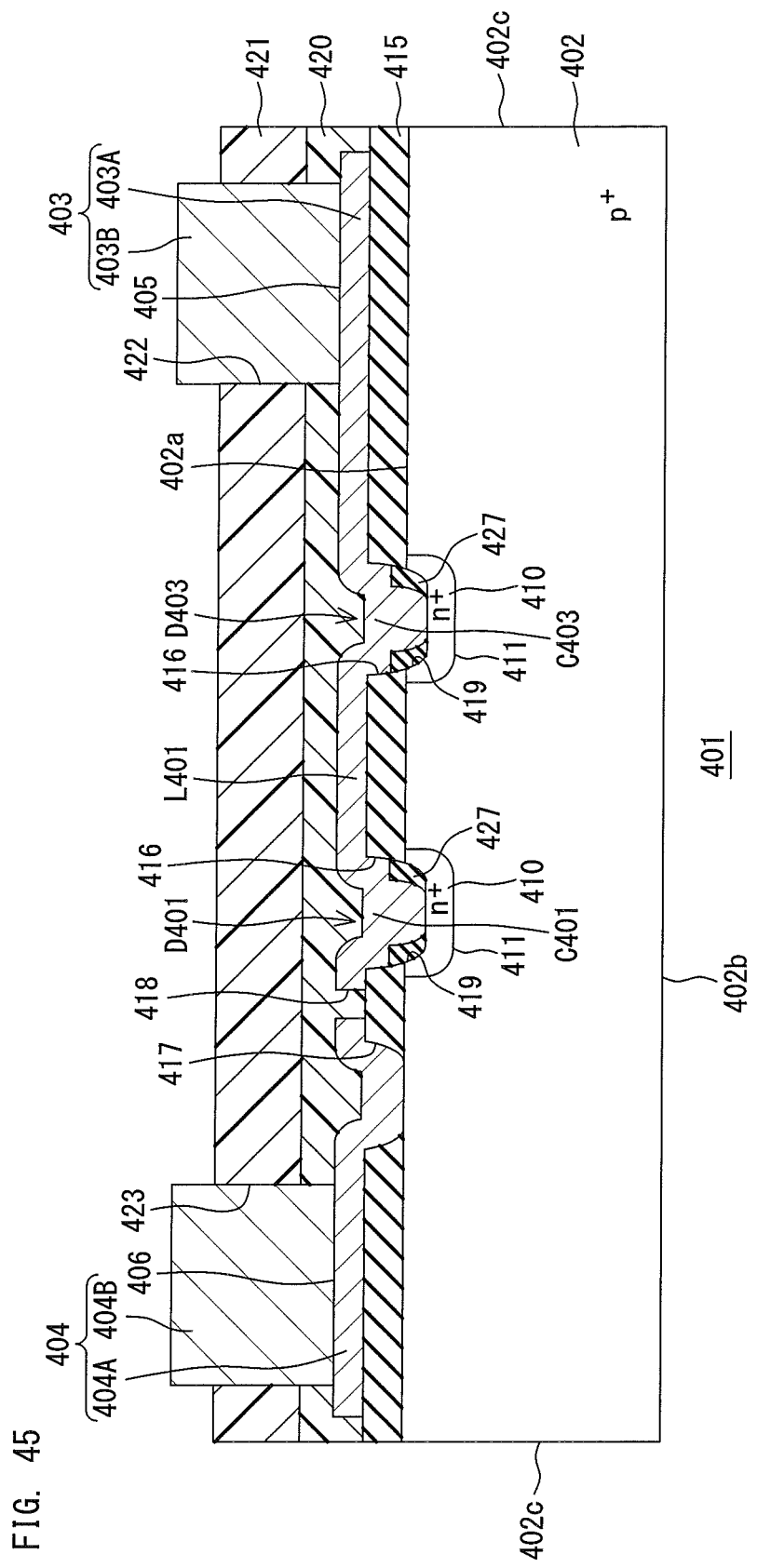
FIG. 45 is a cross-sectional view taken along the line E-E in FIG. 44.
Figure 46:
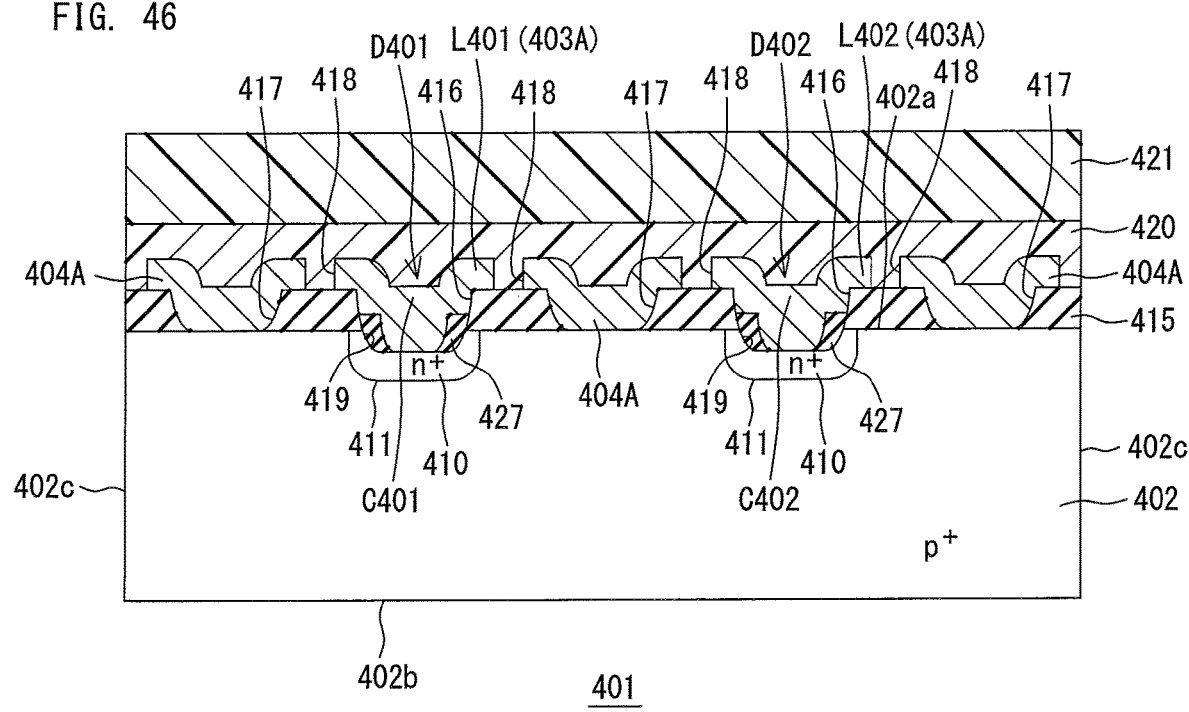
FIG. 46 is a cross-sectional view taken along the line F-F in FIG. 44.

FIG. 43 is a perspective view of a chip diode according to the preferred embodiment of Reference Example 2 of the present invention. FIG. 44 is a plan view of the chip diode. FIG. 45 is a cross-sectional view taken along the line E-E in FIG. 44. Further, FIG. 46 is a cross-sectional view taken along the line F-F in FIG. 44.

The chip diode 401 includes a $p^+$-type semiconductor substrate 402 (silicon substrate, for example), multiple diode cells D401 to D404 formed on the semiconductor substrate 402, and a cathode electrode 403 and an anode electrode 404 connecting the multiple diode cells D401 to D404 in parallel.

The semiconductor substrate 402 has a resistivity of 10 mΩ·cm to 30 mΩ·cm.

The semiconductor substrate 402 includes a pair of principal surfaces 402a, 402b and multiple side surfaces 402c orthogonal to the pair of principal surfaces 402a, 402b, one (principal surface 402a) of the pair of principal surfaces 402a, 402b being a device forming surface. The principal surface 402a will hereinafter be referred to as "device forming surface 402a." The device forming surface 402a is formed in a rectangular shape in a plan view and, for example, the longer sides may have a length L of about 0.4 mm and the shorter sides may have a length W of about 0.2 mm. The chip diode 401 may also have a total thickness T of about 0.1 mm. An external connection electrode 403B of the cathode electrode 403 and an external connection electrode 404B of the anode electrode 404 are disposed, respectively, in end portions of the device forming surface 402a. A diode cell region 407 is provided on the device forming surface 402a between the external connection electrodes 403B, 404B.

A cutout recessed portion 408 extending in the thickness direction of the semiconductor substrate 402 is defined in one of the side surfaces 402c coupled to one short side (closer to the cathode external connection electrode 403B in this preferred embodiment of Reference Example 2) of the device forming surface 402a. The recessed portion 408 extends throughout the thickness of the semiconductor substrate 402 in this preferred embodiment of Reference Example 2. In a plan view, the recessed portion 408 is recessed inward from the short side of the device forming surface 402a and, in this preferred embodiment of Reference Example 2, has a trapezoidal shape tapered toward the interior of the device forming surface 402a. It will be understood that the planar geometry is illustrative only, and a rectangular shape, a triangular shape, or a recessed curved shape such as a partially circular shape (arc shape, for example) may be employed. The recessed portion 408 indicates the orientation of the chip diode 401 (chip orientation). More specifically, the recessed portion 408 provides a cathode mark that indicates the location of the cathode external connection electrode 403B. This provides a structure with which the polarity can be determined based on the appearance when the chip diode 401 is mounted.

The semiconductor substrate 402 has four corner portions 409 at four corners each corresponding to the intersection of a pair of mutually adjacent ones of the four side surfaces 402c. The four corner portions 409 are formed roundly in this preferred embodiment of Reference Example 2. The corner portions 409 each have an outward convex smooth curved surface in a plan view in the normal direction of the device forming surface 402a. This provides a structure with which chipping can be reduced when the chip diode 401 is manufactured and mounted.

The diode cell region 407 is formed in a rectangular shape in this preferred embodiment of Reference Example 2. The multiple diode cells D401 to D404 are disposed within the diode cell region 407. The number of the multiple diode cells D401 to D404 is four in this preferred embodiment of Reference Example 2, which are arranged two-dimensionally at equal spaces in a matrix manner along the longer sides and the shorter sides of the semiconductor substrate 402.

Figure 47:
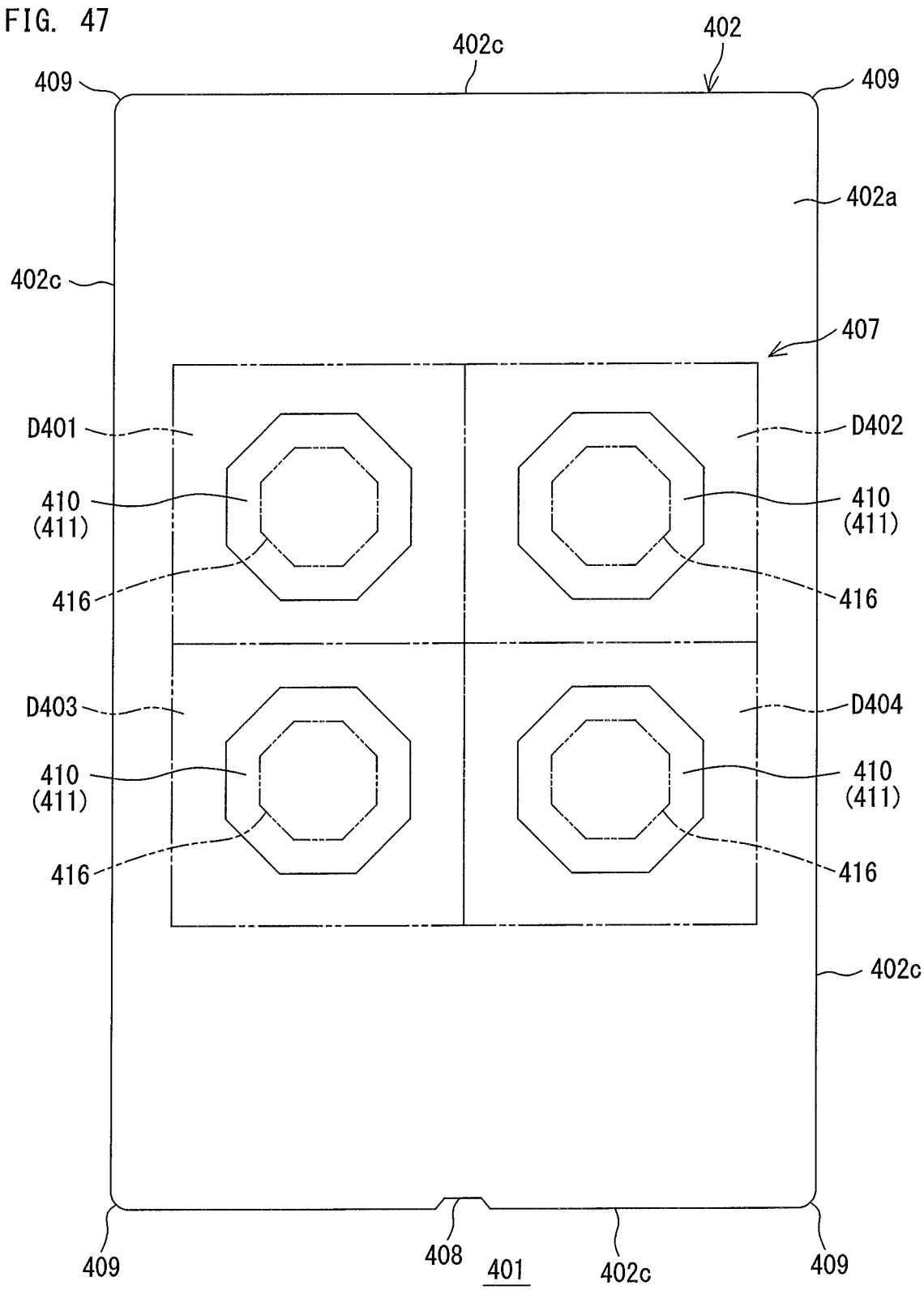
FIG. 47 is a plan view showing the structure of a surface of a semiconductor substrate excluding a cathode electrode, an anode electrode, and components formed thereon in the chip diode according to the preferred embodiment of Reference Example 2.

FIG. 47 is a plan view showing the structure of the surface (device forming surface 402a) of the semiconductor substrate 402 excluding the cathode electrode 403, the anode electrode 404, and the components formed thereon. Within each region of the diode cells D401 to D404, an n$^+$-type region 410 is formed in a surficial region of the p$^+$-type semiconductor substrate 402. The n$^+$-type regions 410 are separated for each diode cell. Accordingly, the diode cells D401 to D404, respectively, have pn junction regions 411 separated for each diode cell.

The multiple diode cells D401 to D404 are formed in the same shape, specifically a rectangular shape of the same size in this preferred embodiment of Reference Example 2 and, within the rectangular region of each diode cell, the n$^+$-type region 410 is formed in a polygonal shape. In this preferred embodiment of Reference Example 2, the n$^+$-type region 410 is formed in a regular octagon having four sides along the respective four sides of the rectangular region of each of the diode cells D401 to D404 and four sides opposed to the respective four corner portions of the rectangular region of each of the diode cells D401 to D404.

As shown in FIGS. 45 and 46, each n$^+$-type region 410 has a depth of 2 μm to 3 μm at its deepest portion from the device forming surface 402a. An insulating film 415 composed of an oxide film (not shown in FIG. 44) is formed on the device forming surface 402a of the semiconductor substrate 402. In the insulating film 415, contact holes 416 (cathode contact holes) for exposure of the surface of the n$^+$-type regions 410 of the respective diode cells D401 to D404 therethrough and contact holes 417 (anode contact holes) for exposure of the device forming surface 402a therethrough are defined. On the surface of each n$^+$-type region 410, a recessed portion 419 is defined in a manner continuing to the corresponding contact hole 416. The entire recessed portion 419 is defined in the interior region of the n$^+$-type region 410 with the side surface continuing smoothly to the side surface of the contact hole 416 with no step. The recessed portion 419 and the contact hole 416 are thus combined to define a hole having a stepless smooth side surface. An insulating film 427 serving as a recessed portion insulating film is formed in the peripheral portion of the hole (peripheral portion of the recessed portion 419). The insulating film 427 is composed of an oxide film and, in this preferred embodiment of Reference Example 2, is formed annularly along the side of the recessed portion 419 so that the center of the bottom of the recessed portion 419 is exposed. The insulating film 427 is also formed across the boundary between the recessed portion 419 and the contact hole 416 and partially (an upper portion thereof) protrudes outward from the device forming surface 402a.

The cathode electrode 403 and the anode electrode 404 are formed on the surface of the insulating film 415. The cathode electrode 403 includes a cathode electrode film 403A formed on the surface of the insulating film 415 and an external connection electrode 403B joined to the cathode electrode film 403A. The cathode electrode film 403A has a lead-out electrode L401 connected to the multiple diode cells D401, D403, a lead-out electrode L402 connected to the multiple diode cells D402, D404, and a cathode pad 405 formed integrally with the lead-out electrodes L401, L402 (cathode lead-out electrodes). The cathode pad 405 is formed in a rectangular shape in one end portion of the device forming surface 402a. The external connection electrode 403B is connected to the cathode pad 405. The external connection electrode 403B is thus connected in common to the lead-out electrodes L401, L402. The cathode pad 405 and the external connection electrode 403B constitute an external connection portion of the cathode electrode 403 (cathode external connection portion).

The anode electrode 404 includes an anode electrode film 404A formed on the surface of the insulating film 415 and an external connection electrode 404B joined to the anode electrode film 404A. The anode electrode film 404A is connected to the p$^+$-type semiconductor substrate 402 and has an anode pad 406 in the vicinity of one end portion of the device forming surface 402a. The anode pad 406 is formed of a region of the anode electrode film 404A disposed in one end portion of the device forming surface 402a. The external connection electrode 404B is connected to the anode pad 406. The anode pad 406 and the external connection electrode 404B constitute an external connection portion of the anode electrode 404 (anode external connection portion). The region of the anode electrode film 404A excluding the anode pad 406 includes anode lead-out electrodes led out through the respective anode contact holes 417.

The lead-out electrode L401 runs on the surface of the insulating film 415 to enter the contact holes 416 and the recessed portions 419 of the respective diode cells D401, D403 and, within the recessed portions 419, come into ohmic contact with the n$^+$-type regions 410 of the respective diode cells D401, D403. The portions of the lead-out electrode L401 connected to the respective diode cells D401, D403 within the contact holes 416 constitute cell connection portions C401, C403, respectively. Similarly, the lead-out electrode L402 runs on the surface of the insulating film 415 to enter the contact holes 416 and the recessed portion 419 of the respective diode cells D402, D404 and, within the recessed portions 419, come into ohmic contact with the n$^+$-type regions 410 of the respective diode cells D402, D404. The portions of the lead-out electrode L402 connected to the respective diode cells D402, D404 within the contact holes 416 constitute cell connection portions C402, C404, respectively. The anode electrode film 404A runs on the surface of the insulating film 415 to extend into the contact holes 417 and, within the contact holes 417, come into ohmic contact with the p$^+$-type semiconductor substrate 402. The cathode electrode film 403A and the anode electrode film 404A are composed of the same material in this preferred embodiment of Reference Example 2.

The electrode films employ an AlSiCu film in this preferred embodiment of Reference Example 2. Thus using the AlSiCu film allows the anode electrode film 404A to come into ohmic contact with the $p^+$-type semiconductor substrate 402 without providing a $p^+$-type region on the surface of the semiconductor substrate 402. That is, the anode electrode film 404A can come into direct contact and therefore ohmic contact with the $p^+$-type semiconductor substrate 402. It is therefore possible to skip the step of forming such a $p^+$-type region.

The cathode electrode film 403A and the anode electrode film 404A are separated with a slit 418 therebetween. The lead-out electrode L401 is formed linearly along the line extending from the diode cell D401 through the diode cell D403 to the cathode pad 405. Similarly, the lead-out electrode L402 is formed linearly along the line extending from the diode cell D402 through the diode cell D404 to the cathode pad 405. The lead-out electrodes L401, L402 have uniform widths W1, W2, respectively, everywhere from the $n^+$-type regions 410 to the cathode pad 405. The widths W1, W2 are greater than the width of the cell connection portions C401, C402, C403, C404. The width of the cell connection portions C401 to C404 is defined by the length of the lead-out electrodes L401, L402 in the direction orthogonal to the lead-out direction. The leading end portions of the lead-out electrodes L401, L402 are shaped to match the planar geometry of the $n^+$-type regions 410. The base end portions of the lead-out electrodes L401, L402 are connected to the cathode pad 405. The slit 418 is formed in a manner following the edges of the lead-out electrodes L401, L402. On the other hand, the anode electrode film 404A is formed on the surface of the insulating film 415 in a manner surrounding the cathode electrode film 403A with spaces provided therein correspondingly to the slit 418 having an approximately constant width. The anode electrode film 404A integrally has a comb-shaped portion extending along the longer sides of the device forming surface 402a and the rectangular anode pad 406.

The cathode electrode film 403A and the anode electrode film 404A are covered with a passivation film 420 composed of, for example, a nitride film (not shown in FIG. 44), and further a resin film 421 such as polyimide is formed on the passivation film 420. A pad opening 422 for exposure of the cathode pad 405 and a pad opening 423 for exposure of the anode pad 406 are formed in a manner penetrating through the passivation film 420 and the resin film 421. The pad openings 422, 423 are filled with the external connection electrodes 403B, 404B. The passivation film 420 and the resin film 421 constitute a protective film that reduces or prevents moisture intrusion into the lead-out electrodes L401, L402 and the pn junction regions 411 as well as absorbs an external shock and the like to contribute to improvement in the durability of the chip diode 401.

The external connection electrodes 403B, 404B may have a surface at a level lower than the surface of the resin film 421 (closer to the semiconductor substrate 402) or may protrude from the surface of the resin film 421, that is, have a surface at a level higher than the resin film 421 (farther from the semiconductor substrate 402). FIG. 45 shows an example of the external connection electrodes 403B, 404B protruding from the surface of the resin film 421. The external connection electrodes 403B, 404B may be composed of, for example, an Ni/Pd/Au laminated film including an Ni film in contact with the electrode films 403A, 404A, a Pd film formed thereon, and an Au film formed thereon. Such a laminated film can be formed by plating.

In each of the diode cells D401 to D404, the pn junction region 411 is defined between the $p^+$-type semiconductor substrate 402 and the $n^+$-type region 410, which accordingly forms a pn junction diode. The $n^+$-type regions 410 of the multiple diode cells D401 to D404 are then connected in common to the cathode electrode 403, and the $p^+$-type semiconductor substrate 402, which is a p-type region common to the diode cells D401 to D404, is connected in common to the anode electrode 404. All the multiple diode cells D401 to D404 formed on the semiconductor substrate 402 are thus connected in parallel.

Figure 48:
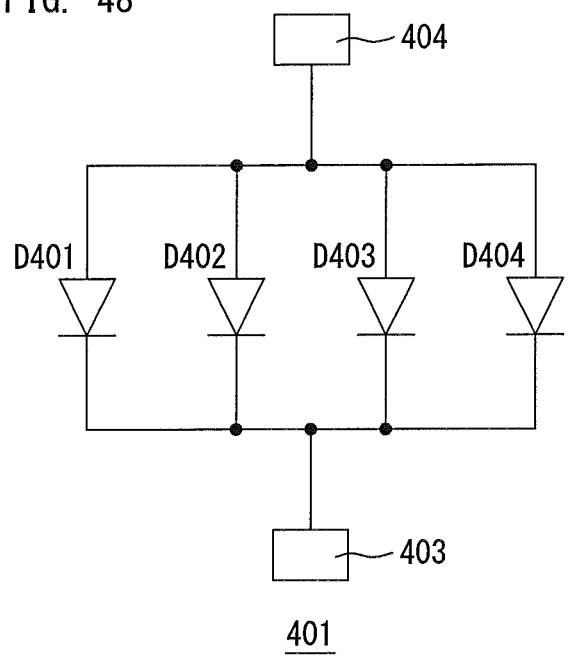
FIG. 48 is an electric circuit diagram showing the electrical structure of the inside of the chip diode according to the preferred embodiment of Reference Example 2.

FIG. 48 is an electric circuit diagram showing the electrical structure of the inside of the chip diode 401. The pn junction diodes configured by the respective diode cells D401 to D404 are connected, in parallel, with the cathodes connected in common with the cathode electrode 403 and the anodes connected in common with the anode electrode 404, thus totally serving as a single diode.

In accordance with the arrangement of this preferred embodiment of Reference Example 2, the chip diode 401 has the multiple diode cells D401 to D404, and each of the diode cells D401 to D404 in turn has the pn junction region 411. The pn junction regions 411 are separated for each of the diode cells D401 to D404. In the chip diode 401, this results in an increase in the perimeters of the pn junction regions 411, that is, the total perimeters (total extensions) of the $n^+$-type regions 410 in the semiconductor substrate 402. The electric field can thereby be dispersed and prevented from concentrating in the vicinities of the pn junction regions 411, and the ESD tolerance can thus be improved. That is, even when the chip diode 401 is to be formed in a small size, the total perimeters of the pn junction regions 411 can be increased, enabling both size reduction of the chip diode 401 and securing of the ESD tolerance.

Figure 49:
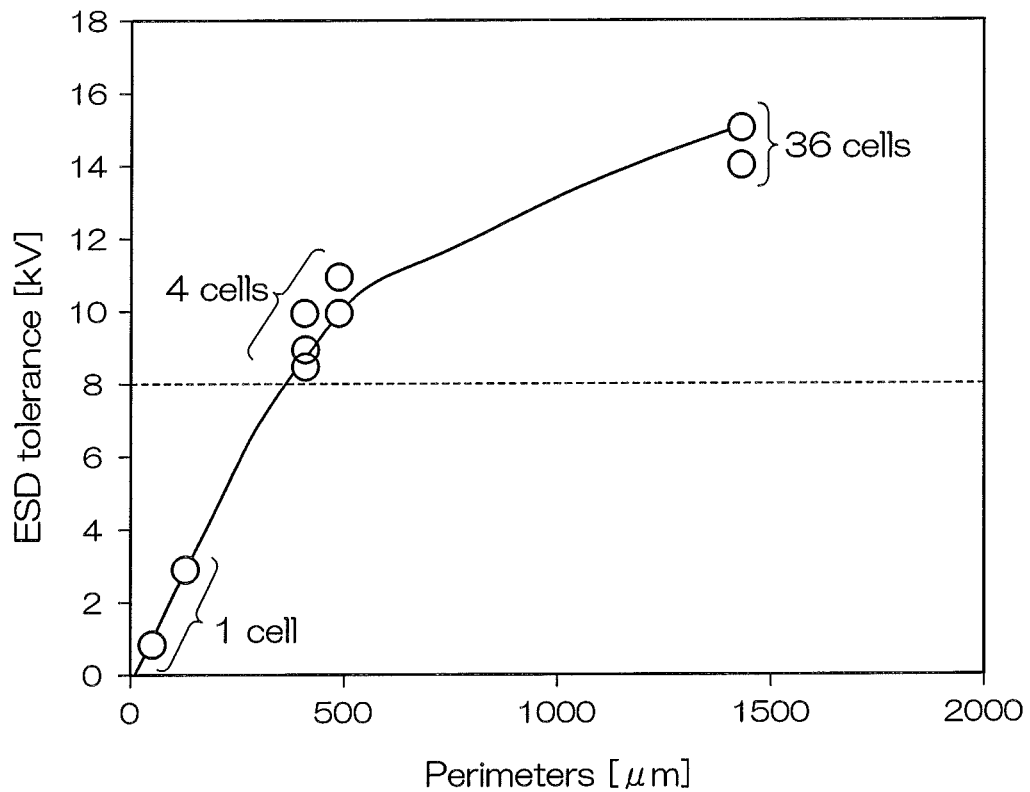
FIG. 49 shows results of an experiment measuring the ESD tolerance of multiple samples having their respective different total perimeters (total extensions) of pn junction regions for various sizes and/or numbers of diode cells formed on a semiconductor substrate of the same area.
Figure 50:
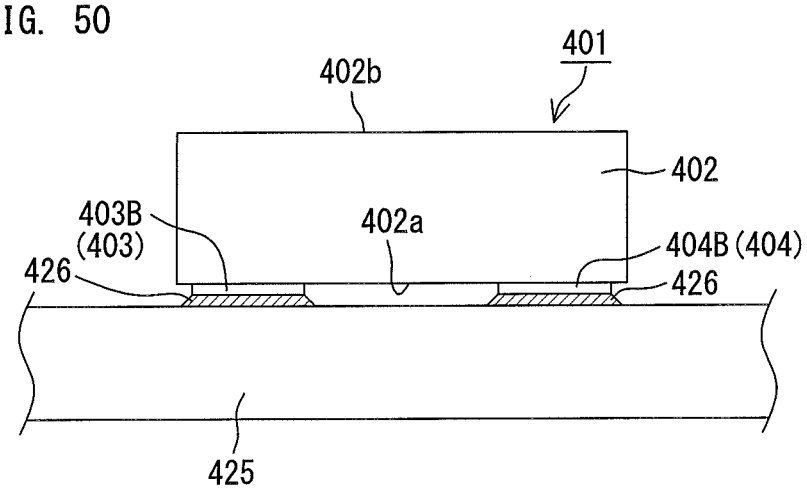
FIG. 50 is a cross-sectional view showing the configuration of a circuit assembly in which the chip diode according to the preferred embodiment of Reference Example 2 is flip-chip connected onto a mounting substrate.

FIG. 49 shows results of an experiment measuring the ESD tolerance of multiple samples having their respective different total perimeters (total extensions) of pn junction regions for various sizes and/or numbers of diode cells formed on a semiconductor substrate of the same area. The experimental results show that the greater the perimeters of the pn junction regions, the higher the ESD tolerance becomes. When four or more diode cells were formed on a semiconductor substrate, an ESD tolerance of higher than 8 kV was achieved.

Further, in this preferred embodiment of Reference Example 2, the widths W1, W2 of the lead-out electrodes L401, L402 are greater than the width of the cell connection portions C401 to C404 everywhere from the cell connection portions C401 to C404 to the cathode pad 405. This allows the allowable amount of current to be enlarged and the electromigration to be reduced to improve the high-current reliability. That is, it is possible to provide a chip diode with a small size having a high ESD tolerance and securing high-current reliability.

Also, in this preferred embodiment of Reference Example 2, the multiple diode cells D401, D403 and D402, D404 arranged linearly toward the cathode pad 405 are connected to the cathode pad 405 through the respective common linear lead-out electrodes L401, L402. This allows the length of the lead-out electrodes from the diode cells D401 to D404 to the cathode pad 405 to be minimized and thereby the electromigration to be reduced more effectively. In addition, since the multiple diode cells D401, D403 and D402, D404 can share the respective lead-out electrodes L401, L402, it is possible to layout the wide lead-out electrodes on the semiconductor substrate 402 while thus forming the multiple diode cells D401 to D404 to increase the perimeters of the diode junction regions (pn junction regions 411). This allows for both further improvement in the ESD tolerance and reduction in the electromigration for further improvement in reliability.

Further, since the end portions of the lead-out electrodes L401, L402 have a partially polygonal shape to match the geometry (polygon) of the n$^+$-type regions 410, the lead-out electrodes L401, L402 with a reduced occupation area can be connected to the n$^+$-type regions 410.

Furthermore, both the cathode and the anode external connection electrodes 403B, 404B are formed on the device forming surface 402a, one of the surfaces of the semiconductor substrate 402. Hence, as shown in FIG. 40, facing the device forming surface 402a toward a mounting substrate 425 and bonding the external connection electrodes 403B, 404B by soldering 426 onto the mounting substrate 425 allows a circuit assembly to be configured in which the chip diode 401 is surface-mounted on the mounting substrate 425. That is, the chip diode 401 of a flip-chip connection type can be provided and connected by wireless bonding to the mounting substrate 425, specifically by face-down bonding in which the device forming surface 402a is faced toward the mounting surface of the mounting substrate 425. This can reduce the occupation space of the chip diode 401 on the mounting substrate 425. It is particularly possible to achieve a reduction in the height of the chip diode 401 on the mounting substrate 425. As a result, it is possible to make use of the space in the casing of a small electronic device or the like, contributing to high-density mounting and size reduction.

Also, in this preferred embodiment of Reference Example 2, the insulating film 415 is formed on the semiconductor substrate 402, and the cell connection portions C401 to C404 of the lead-out electrodes L401, L402 are connected to the respective diode cells D401 to D404 via the contact holes 416 formed in the insulating film 415. The cathode pad 405 is then disposed on the insulating film 415 in a region outside the contact holes 416. That is, the cathode pad 405 is provided at a position distant from the regions immediately above the pn junction regions 411. The anode electrode film 404A is also connected to the semiconductor substrate 402 via the contact holes 417 formed in the insulating film 415, and the anode pad 406 is disposed on the insulating film 415 in a region outside the contact holes 417. The anode pad 406 is also provided at a position distant from the regions immediately above the pn junction regions 411. This can prevent a large shock acting on the pn junction regions 411 when the chip diode 401 is mounted on the mounting substrate 425. It is therefore possible to prevent the pn junction regions 411 from being damaged and thereby to achieve a chip diode having good durability against an external force. Another arrangement may be employed in which the cathode pad 405 and the anode pad 406 are provided, respectively, as a cathode external connection portion and an anode connection portion without providing the external connection electrodes 403B, 404B and bonding wires are connected to the cathode pad 405 and the anode pad 406. Also in this case, it is possible to prevent the pn junction regions 411 from being damaged due to a shock during the wire bonding.

Also, in this preferred embodiment of Reference Example 2, the anode electrode film 404A is composed of an AlSiCu film. An AlSiCu film has a work function approximate to that of a p-type semiconductor (particularly a p-type silicon semiconductor) and therefore can come into good ohmic contact with the p$^+$-type semiconductor substrate 402. It is therefore not necessary to form a diffusion layer of a high impurity concentration for ohmic contact on the p$^+$-type semiconductor substrate 402. This can simplify the manufacturing process and productivity can be improved and production costs can be reduced accordingly. Alternatively, an AlSi electrode film material may be applied to an electrode film that can come into ohmic contact with a p-type semiconductor, but the AlSiCu electrode film can lead to a further improvement in reliability compared to the AlSi electrode film.

Further, in this preferred embodiment of Reference Example 2, the semiconductor substrate 402 has a rectangular shape with round corner portions 409. This can reduce or prevent chipping of the corner portions of the chip diode 401 and thereby can provide a chip diode 401 with less possibility of poor appearance.

Furthermore, in this preferred embodiment of Reference Example 2, since the recessed portion 408 indicating the cathode side is defined in the short side of the semiconductor substrate 402 closer to the cathode external connection electrode 403B, there is no need to define a cathode mark on the other surface (principal surface opposite to the device forming surface 402a) of the semiconductor substrate 402. The recessed portion 408 may be defined at the same time during the process of cutting the chip diode 401 out of a wafer (original substrate), and also can be defined to indicate the cathode side even if the chip diode 401 may have a small size and marking is difficult. It is therefore possible to skip the step of marking and provide a cathode mark even in a small-sized chip diode 401.

Figure 51:
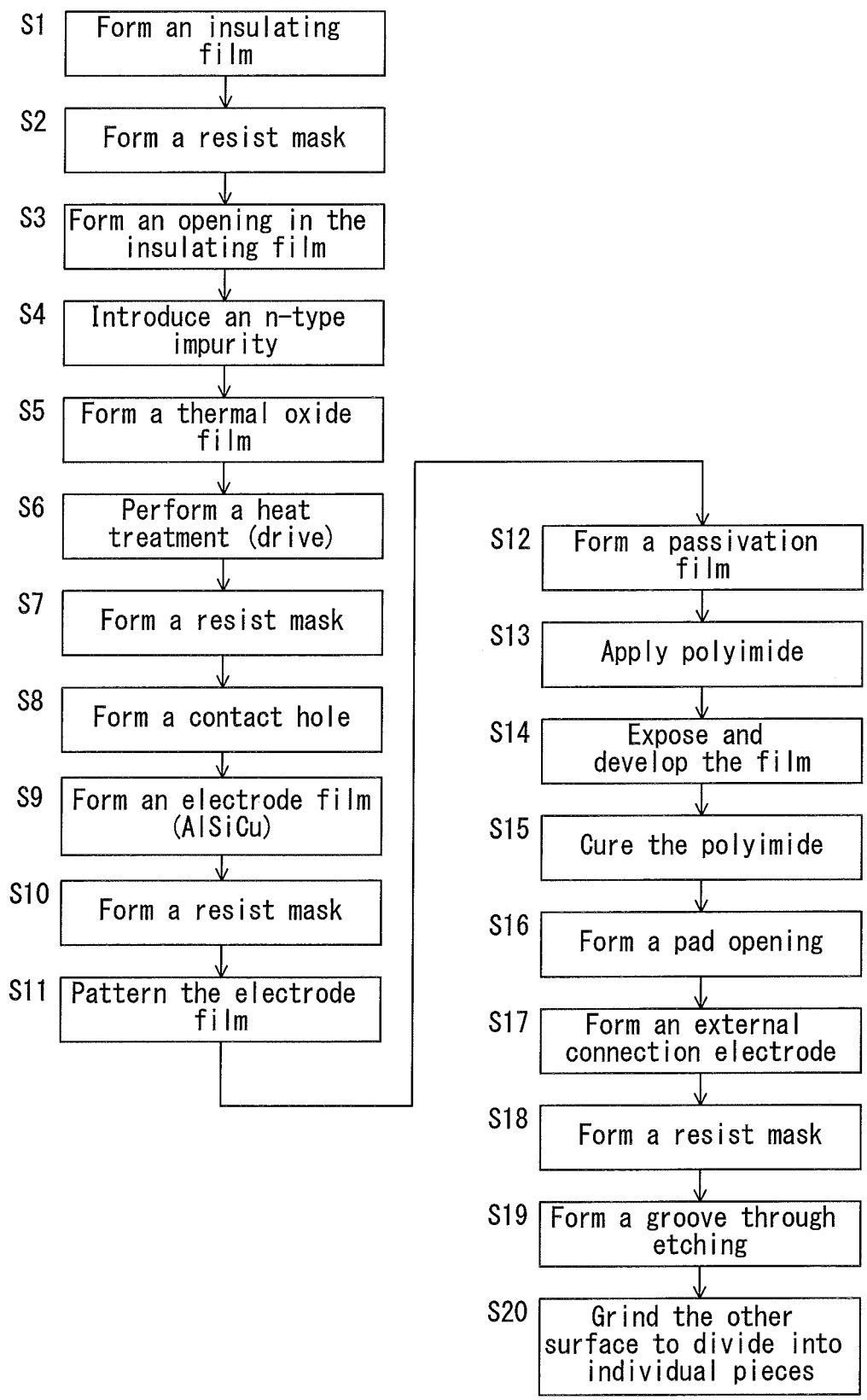
FIG. 51 is a process chart for illustrating an exemplary process of manufacturing the chip diode according to the preferred embodiment of Reference Example 2.
Figure 52A:
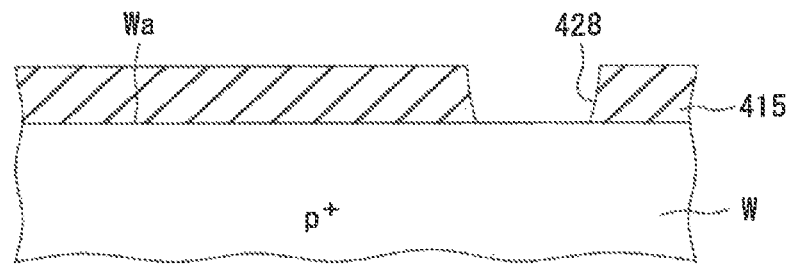
FIGS. 52A to 52D are cross-sectional views showing the configuration of the chip diode according to the preferred embodiment of Reference Example 2 at steps during the manufacturing process.
Figure 52B:
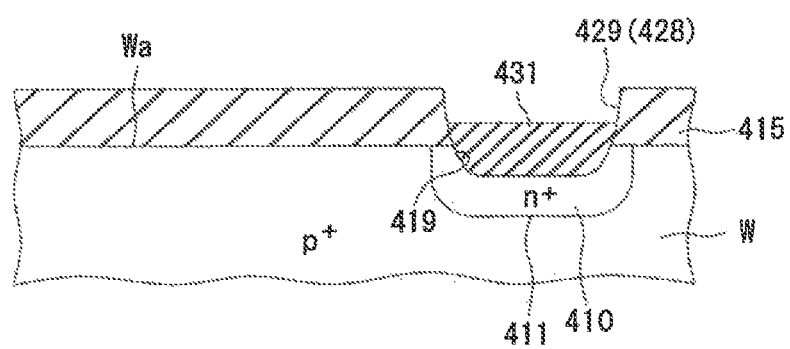
Figure 52C:
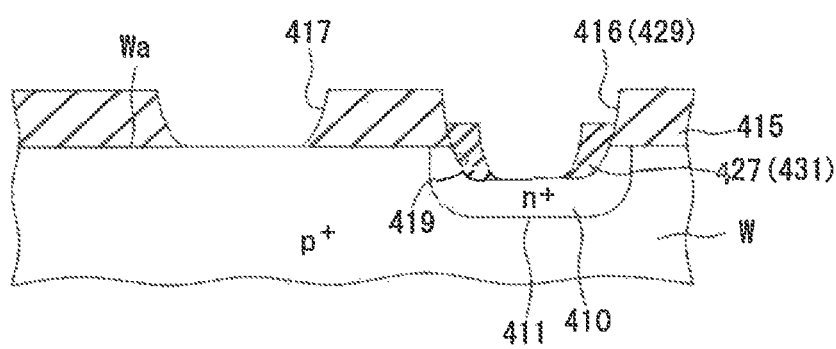
Figure 52D:
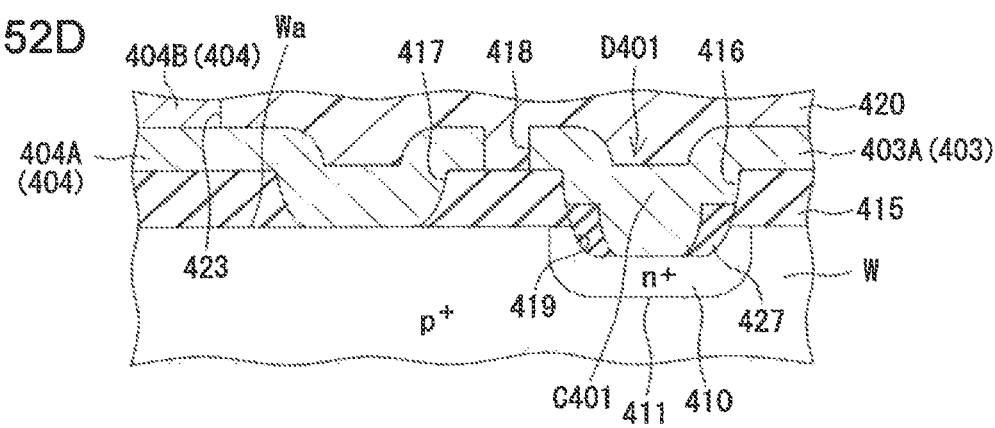
Figure 53B:
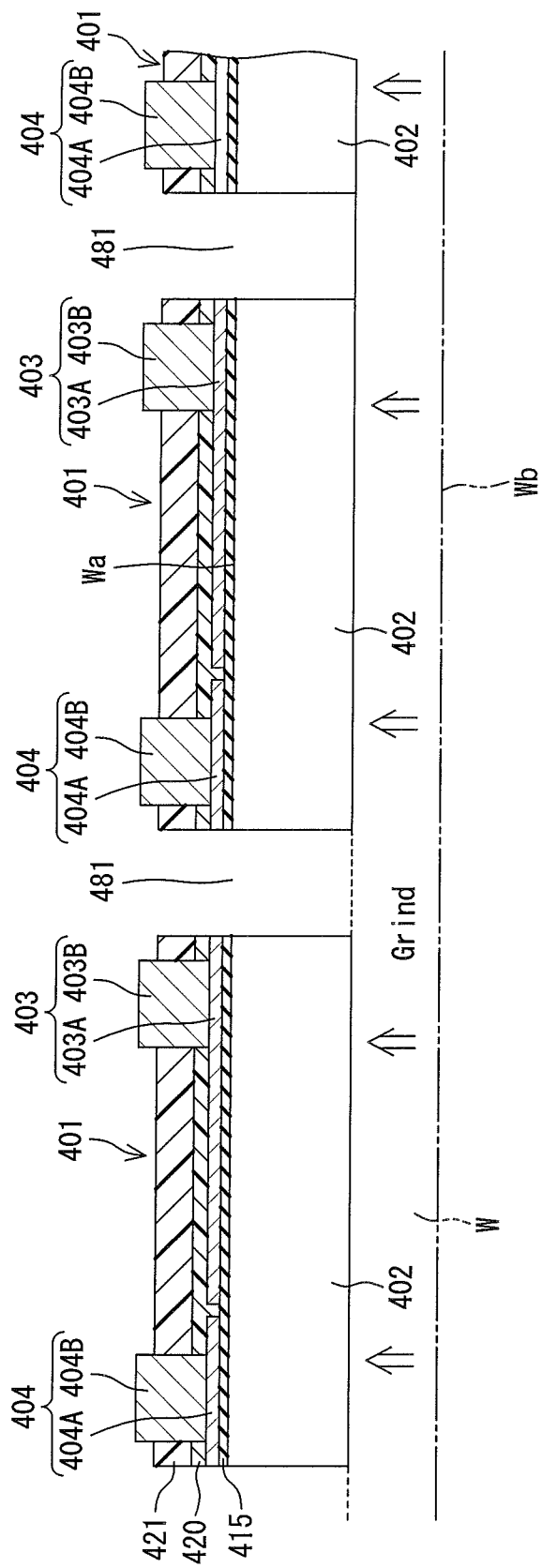
FIG. 53B is a cross-sectional view showing the configuration at a step following the step of FIG. 53A.
Figure 54:
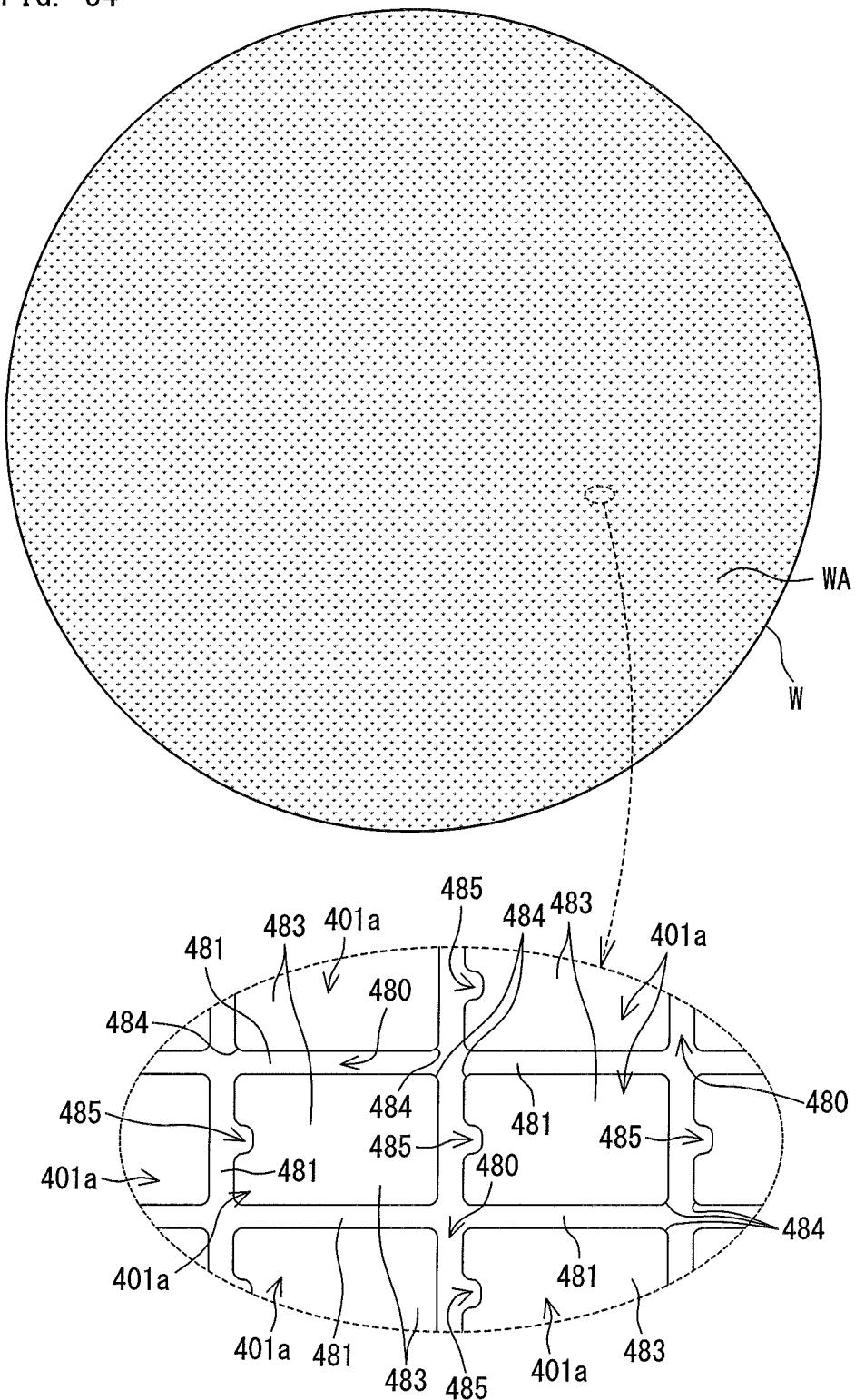
FIG. 54 is a plan view of a semiconductor wafer serving as an original substrate for the semiconductor substrate of the chip diode, partially showing a region in an enlarged manner.

FIG. 51 is a process chart for illustrating an exemplary process of manufacturing the chip diode 401. FIGS. 52 (*a*) to 52 (*d*) are cross-sectional views showing the configuration of the chip diode according to the preferred embodiment of Reference Example 2 at steps during the manufacturing process. FIGS. 53A and 53B are cross-sectional views showing the configuration at steps during the manufacturing process in FIG. 51, showing sections corresponding to FIG. 45. FIG. 54 is a plan view of a p$^+$-type semiconductor wafer W serving as an original substrate for the semiconductor substrate 502, partially showing a region in an enlarged manner.

First, a p$^+$-type semiconductor wafer W is provided as an original substrate for the semiconductor substrate 402. One of the surfaces of the semiconductor wafer W is a device forming surface Wa corresponding to the device forming surface 402a of the semiconductor substrate 402. On the device forming surface Wa, multiple chip diode regions 401a corresponding to multiple chip diodes 401 are arranged and set in a matrix manner. A boundary region 480 is provided between adjacent ones of the chip diode regions 401a. The boundary region 480 is a band-shaped region having an approximately constant width and extends in two orthogonal directions to form a grid. After performing necessary steps on the semiconductor wafer W, the semiconductor wafer W is cut apart along the boundary region 480 to obtain multiple chip diodes 401.

Exemplary steps to be performed on the semiconductor wafer W are as follows.

First, as shown in FIG. 52 (*a*), an insulating film 415 composed of a thermal oxide film is formed on the device forming surface Wa of the p$^+$-type semiconductor wafer W (S1), and a resist mask (not shown) is formed on the film (S2). Through etching using the resist mask, an opening 428 corresponding to the n$^+$-type region 410 is formed in the insulating film 415 (S3). Further, the resist mask is peeled off, an n-type impurity is introduced into a surficial portion of the semiconductor wafer W that are exposed through the opening 428 formed in the insulating film 415 (S4). The introduction of the n-type impurity is performed in the step of depositing phosphor as the n-type impurity on the surface (so-called phosphorous deposition). Phosphorous deposition is a process of depositing phosphor on the surface of the semiconductor wafer W conveyed into a diffusion furnace and exposed within the opening 428 in the insulating film 415 during a heat treatment with POCl$_3$ gas flowing inside a diffusion passage.

Next, as shown in FIG. 52 (b), another resist mask having an opening corresponding to an opening 429 with a width greater than that of the opening 428 is formed on the insulating film 415 as necessary. Through etching using the resist mask, the opening 428 is widened to be the opening 429. Within the opening 429, the device forming surface Wa is then thermally oxidized selectively to form a thermal oxide film 431 (S5). The thermal oxide film 431 transforms silicon in the vicinity of the device forming surface Wa of the semiconductor wafer W into oxide silicon to grow not on the device forming surface Wa but also toward the other surface so that a recessed portion 419 continuing to the opening 429 is formed in the device forming surface Wa. Thereafter, a heat treatment (drive-in process) for activation of the impurity ions introduced into the semiconductor wafer W is performed (S6). The conditions (temperature and duration) of the drive-in process can be selected according to a targeted depth of the n$^+$-type region 410. The n$^+$-type region 410 is thus formed in the surficial portion of the semiconductor wafer W.

Next, as shown in FIG. 52 (c), a further resist mask having openings corresponding to the contact holes 416, 417 is formed on the insulating film 415 (S7). Through etching using the resist mask, the contact holes 416, 417 are formed in the insulating film 415 (S8). At the same time, the thermal oxide film 431 is partially and selectively removed and the remaining portion is formed as an insulating film 427. Thereafter, the resist mask is peeled off.

Next, as shown in FIG. 52 (d), an electrode film for the cathode electrode 403 and the anode electrode 404 is formed by, for example, sputtering on the insulating film 415 (S9). In this preferred embodiment of Reference Example 2, an electrode film composed of AlSiCu (having a thickness of 10000 Å, for example) is formed. Another resist mask having an opening pattern corresponding to the slit 418 is then formed on the electrode film (S10) and, through etching (reactive ion etching, for example) using the resist mask, the slit 418 is formed in the electrode film (S11). The slit 418 may have a width of about 3 μm. The electrode film is thus divided into the cathode electrode film 403A and the anode electrode film 404A.

Next, after the resist film is peeled off, a passivation film 420 such as a nitride film is formed by, for example, a CVD method (S12), and further a resin film 421 is formed by application of polyimide or the like (S13). For example, photosensitive polyimide is applied and exposed with a pattern corresponding to the pad openings 422, 423, and then the polyimide film is developed (S14). This causes openings corresponding to the pad openings 422, 423 to be formed in the resin film 421. Thereafter, a heat treatment is performed to cure the resin film as necessary (S15). Subsequently, through dry etching (reactive ion etching, for example) using the resin film 421 as a mask, the pad openings 422, 423 are formed in the passivation film 420 (S16). Thereafter, the external connection electrodes 403B, 404B are formed within the respective pad openings 422, 423 (S17). The external connection electrodes 403B, 404B can be formed by plating (preferably electroless plating).

Next, a resist mask 483 (see FIG. 53A) having a grid-shaped opening corresponding to the boundary region 480 (see FIG. 54) is formed (S18). Through plasma etching using the resist mask 483, the semiconductor wafer W is etched to a predetermined depth from the device forming surface Wa as shown in FIG. 53A. As a result, a groove 481 for cutting is formed along the boundary region 480 (S19). After the resist mask 483 is peeled off, the semiconductor wafer W is ground from the other surface Wb to the bottom of the groove 481 as shown in FIG. 53B (S20). As a result, the multiple chip diode regions 401a are divided into individual pieces and the chip diodes 401 of the above-described structure can be obtained.

As shown in FIG. 54, the resist mask 483 used to form the groove 481 in the boundary region 480 has outward convex curved and round-shaped portions 484 at positions in contact with the four corners of each chip diode region 401a. The round-shaped portions 484 are each formed to connect two adjacent ones of the sides of the chip diode region 401a with a smooth curve. The resist mask 483 used to form the groove 481 in the boundary region 480 further has a recessed portion 485 recessed toward the interior of each chip diode region 401a at a position in contact with one of the short sides of the chip diode region 401a. Accordingly, the groove 481, when formed through plasma etching using the resist mask 483 as a mask, has outward convex curved and round-shaped portions at positions in contact with the four corners of each chip diode region 401a and a recessed portion recessed toward the interior of each chip diode region 401a at a position in contact with one of the short sides of the chip diode region 401a. Thus, during the step of forming the groove 481 to cut the chip diode regions 401a out of the semiconductor wafer W, the four corner portions 409 of each chip diode 401 can be formed in a round shape and the recessed portion 408 can be defined in one of the short sides (closer to the cathode) as a cathode mark. That is, the corner portions 409 can be formed in a round shape and the recessed portion 408 can be formed as a cathode mark without adding a dedicated step.

In this preferred embodiment of Reference Example 2, since the semiconductor substrate 402 is composed of a p-type semiconductor, it is possible to achieve stable characteristics without forming an epitaxial layer on the semiconductor substrate 402. That is, in the case of using an n-type semiconductor wafer, which has large in-plane resistivity variation, it is necessary to form an epitaxial layer, which has small in-plane resistivity variation on the surface and form an impurity diffusion layer on the epitaxial layer to define a pn junction. This is for the reason that since the n-type impurity has a low segregation coefficient, when an ingot (silicon ingot, for example) causing a semiconductor wafer is formed, there is a great difference in the resistivity between the center and the periphery of the wafer. On the other hand, in the case of using a p-type semiconductor wafer, which has small in-plane resistivity variation because the p-type impurity has a relatively high segregation coefficient, it is possible to cut a diode with stable characteristics out of any site of the wafer without forming an epitaxial layer. Thus using the p$^+$-type semiconductor substrate 402 can simplify the manufacturing process and reduce the manufacturing cost.

Figure 55:
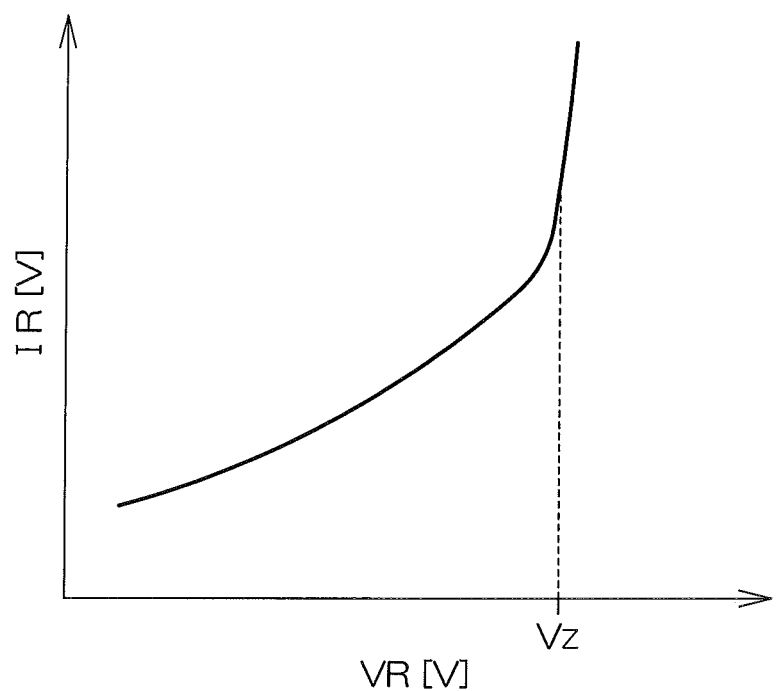
FIG. 55 illustrates the Zener voltage (Vz) of the chip diode.

Also, in accordance with this preferred embodiment of Reference Example 2, since the thermal oxide film 431 is formed before the drive-in process (see FIG. 52 (b)), the p-type impurity concentration in the surface portion of the semiconductor wafer W can be reduced utilizing the heat during the thermal oxidation. In addition, the semiconductor wafer W used has a resistivity of 10 mΩ·cm to 30 mΩ·cm. Thus, since the drive-in process is performed such that the n-type impurity ions are diffused to a depth of 2 μm to 3 μm and the heat during the drive-in process is applied to the semiconductor wafer W, it is possible to precisely control the Zener voltage of the chip diode 401 to be from 6.5 V to 9.0 V. It is noted that the Zener voltage is a voltage Vz at which the current rises rapidly in the reverse I-V curve of the chip diode 401 shown in FIG. 55, for example.

Figure 56:
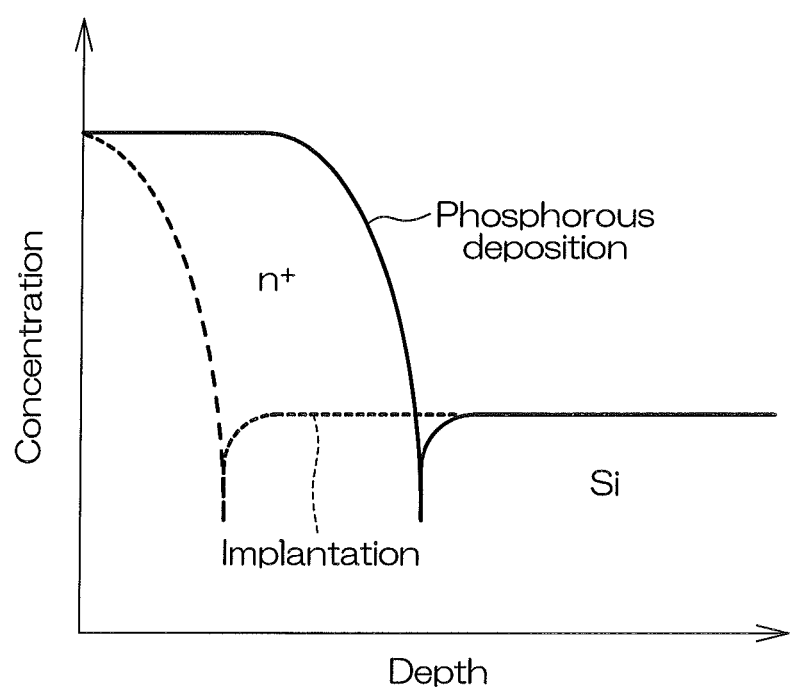
FIG. 56 shows a concentration profile in an $n^+$-type region.

Further, in this preferred embodiment of Reference Example 2, since the introduction of the n-type impurity is performed through phosphorous deposition, the manufacturing cost can be reduced compared to the case of the introduction of the n-type impurity through ion implantation. Also, utilizing the method, the $n^+$-type region 410 of the chip diode 401 can have a constant concentration profile to a predetermined depth from the device forming surface 402a of the semiconductor substrate 402 as shown in FIG. 56. In contrast, in the case of the introduction of the n-type impurity through ion implantation, the concentration profile decreases continuously to a predetermined depth from the device forming surface 402a.

Figure 57:
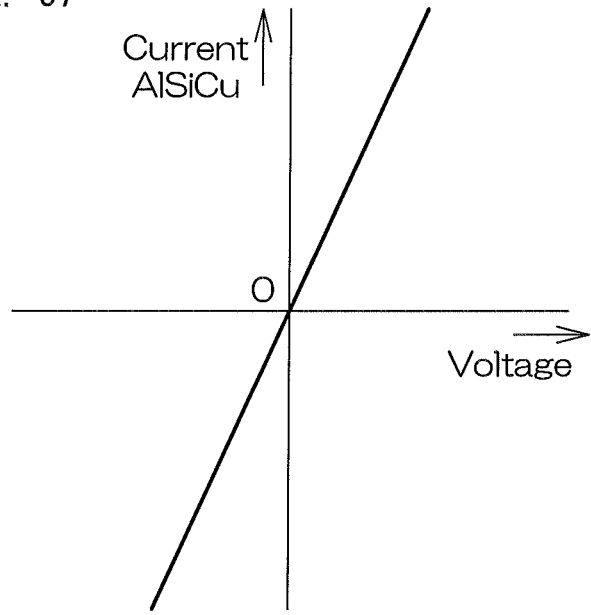
FIG. 57 illustrates the ohmic contact between an AlSiCu electrode film and a $p^+$-type semiconductor substrate.

FIG. 57 illustrates the ohmic contact between an AlSiCu electrode film and a $p^+$-type semiconductor substrate, showing the voltage-current characteristic between a $p^+$-type silicon substrate and an AlSiCu film formed on the $p^+$-type silicon substrate. The current is proportional to the applied voltage, showing that a good ohmic contact is provided.

Figure 58:
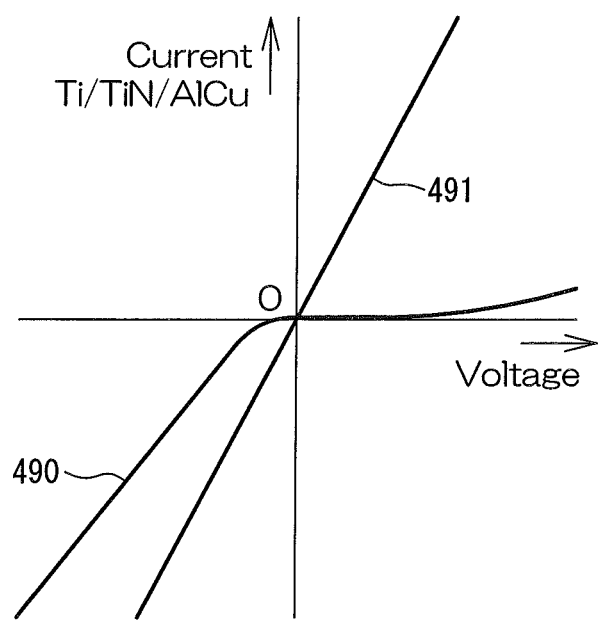
FIG. 58 illustrates the ohmic contact between a Ti/TiN/AlCu electrode film and a $p^+$-type semiconductor substrate.

FIG. 58 illustrates the ohmic contact between a Ti/TiN/AlCu electrode film and a $p^+$-type semiconductor substrate. In FIG. 58, the same characteristic is indicated by the curve 490 for comparison in the case where an electrode film formed on a $p^+$-type silicon substrate is composed of a laminated film in which a Ti film, a TiN film, and an AlCu film are laminated in this order on the surface of the substrate. The voltage-current characteristic is not linear, showing that no ohmic contact is provided. On the other hand, the voltage-current characteristic is indicated by the curve 491 in the case where a high-concentration region in which the p-type impurity is introduced at a higher concentration is formed on the surface of a $p^+$-type silicon substrate and an electrode film composed of a laminated film in which a Ti film, a TiN film, and an AlCu film are laminated in this order on the surface of the substrate is brought into contact with the high-concentration region. In this case, the voltage-current characteristic is linear, showing that a good ohmic contact is provided. These show that using an AlSiCu film as an electrode film can form a cathode electrode film and an anode electrode film in ohmic contact with the $p^+$-type semiconductor substrate without forming a high-concentration region on the $p^+$-type semiconductor substrate and thereby simplify the manufacturing process.

Figure 59:
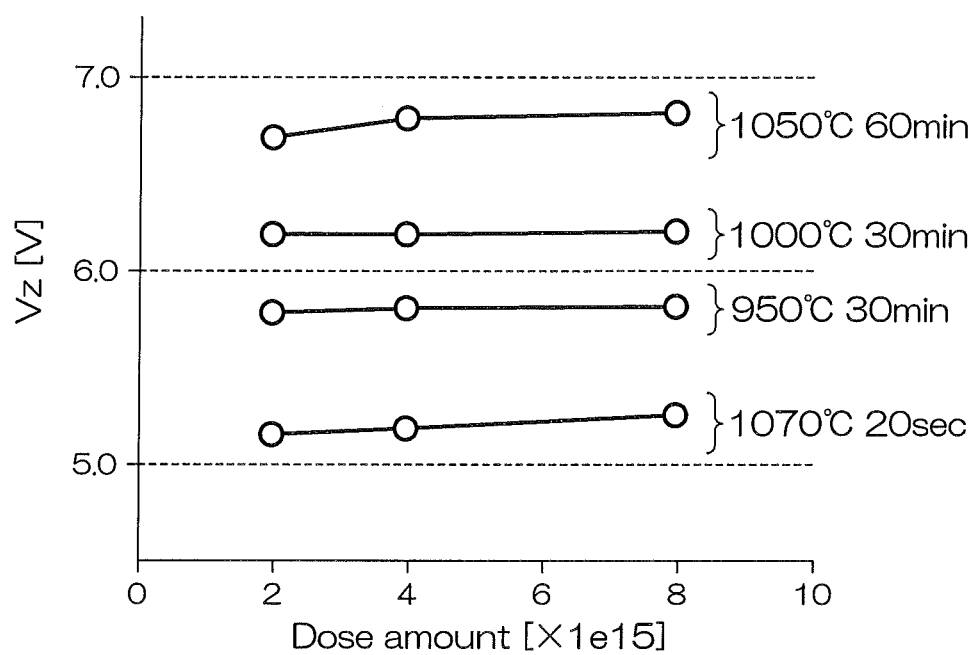
FIG. 59 illustrates a feature for the adjustment of the Zener voltage (Vz) of the chip diode.

FIG. 59 illustrates a feature for the adjustment of the Zener voltage (Vz) of the chip diode 401, that is, a feature for the adjustment of the Zener voltage when the chip diode 401 is configured as a Zener diode. To describe more specifically, after the n-type impurity (phosphor, for example) is introduced into the surficial portion of the semiconductor substrate 402 to form the $n^+$-type region 410, a heat treatment (drive-in process) for activation of the introduced impurity is performed (FIG. 52 (b)). The Zener voltage varies depending on the temperature and duration of the heat treatment. Specifically, the Zener voltage tends to increase with an increase in the amount of heat applied to the semiconductor substrate 402 during the heat treatment. The Zener voltage can be adjusted using this tendency. As can be understood from FIG. 59, the Zener voltage is more strongly dependent on the amount of heat during the heat treatment than the dose amount of the impurity.

Figure 60:
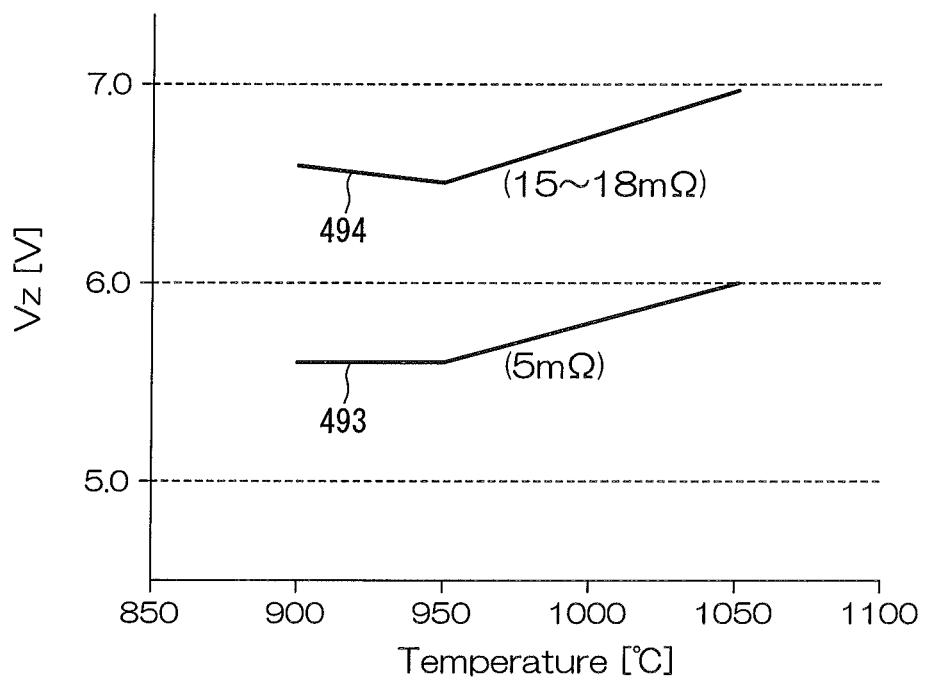
FIG. 60 illustrates another feature for the adjustment of the Zener voltage (Vz).

FIG. 60 illustrates another feature for the adjustment of the Zener voltage (Vz), and specifically shows the change in the Zener voltage with respect to the temperature of the heat treatment for activation of the n-type impurity introduced in the semiconductor substrate 402. The curve 493 indicates the Zener voltage in the case of using a semiconductor substrate with a relatively low resistivity (5 mΩ, for example), while the curve 494 indicates the Zener voltage in the case of using a semiconductor substrate with a relatively high resistivity (15 to 18 mΩ, for example). Comparing the curves 493, 494, it is shown that the Zener voltage is dependent on the resistivity of the semiconductor substrate. Accordingly, by applying a semiconductor substrate having an appropriate resistivity depending on a targeted Zener voltage, it is possible to control the Zener voltage to be a designed value.

Figure 61:
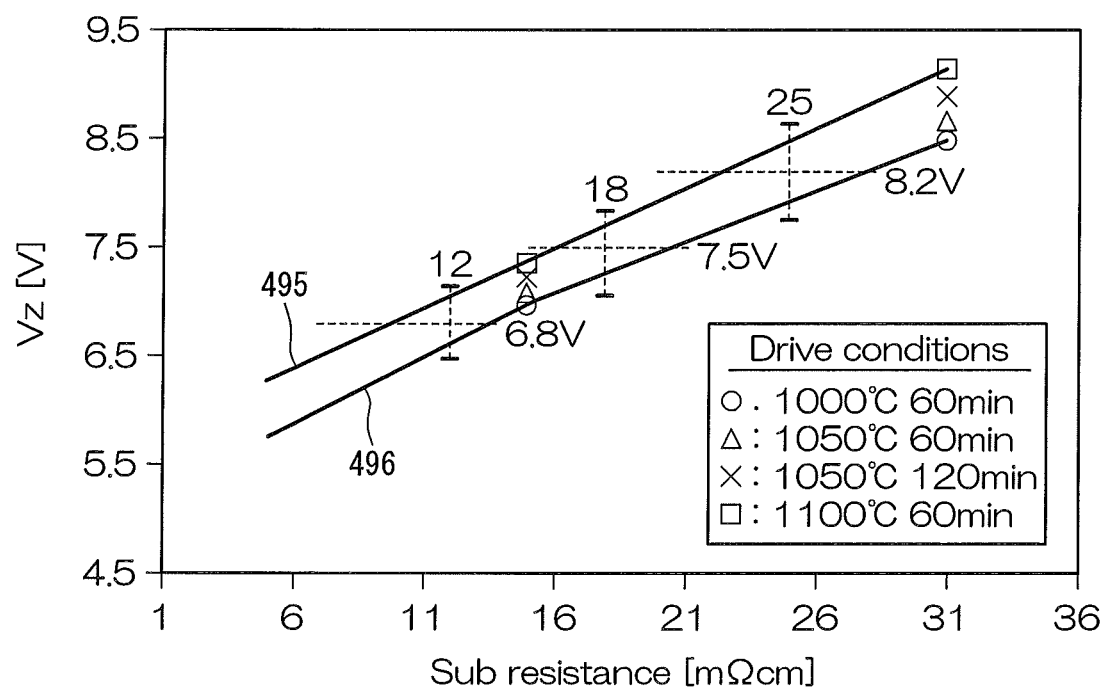
FIG. 61 illustrates a further feature for the adjustment of the Zener voltage (Vz).

FIG. 61 illustrates a further feature for the adjustment of the Zener voltage (Vz), and specifically shows the change in the Zener voltage with respect to the resistivity of the semiconductor substrate 402 (Sub resistivity). The upper curve 495 indicates the Zener voltage in the case where a relatively large amount of heat is applied during the heat treatment (drive conditions: 1100 degrees C. and 60 min.), while the lower curve 496 indicates the Zener voltage in the case where a relatively small amount of heat is applied (drive conditions: 1000 degrees C. and 60 min.). Referring to the curves 495, 496 and the results under the other drive conditions, it is shown that using a semiconductor substrate with a resistivity of 10 mΩ·cm or higher can lead to a Zener voltage of 6.5 V or higher. It is particularly shown that using a semiconductor substrate with a resistivity of 25 mΩ·cm can lead to a Zener voltage of as high as 8.2 V. It is therefore possible to precisely control the Zener voltage Vz of the chip diode to be from 6.5 V to 9.0 V by using a semiconductor substrate with a resistivity of 10 mΩ·cm to 30 mΩ·cm and performing a drive-in process under the conditions under which the n-type impurity is diffused to a depth of 2 μm to 3 μm.

Figure 62:
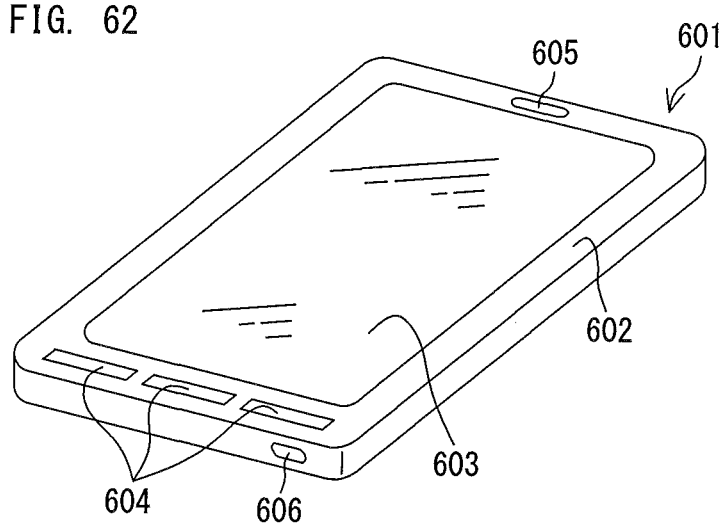
FIG. 62 is a perspective view showing the appearance of a smartphone as an exemplary electronic device in which the chip diode is used.

FIG. 62 is a perspective view showing the appearance of a smartphone as an exemplary electronic device in which the chip diode is used. The smartphone 601 is arranged by housing electronic parts inside a flat rectangular parallelepiped casing 602. The casing 602 has a pair of rectangular principal surfaces at its front side and rear side, and the pair of principal surfaces are joined by four side surfaces. A display surface of a display panel 603 composed of a liquid crystal panel, an organic EL panel, or the like is exposed on one of the principal surfaces of the casing 602. The display surface of the display panel 603 constitutes a touch panel and provides an input interface for the user.

The display panel 603 is formed in a rectangular shape that occupies most of the one principal surface of the casing 602. Operation buttons 604 are disposed along one of the short sides of the display panel 603. In this preferred embodiment of Reference Example 2, multiple (three) operation buttons 604 are arranged along the short side of the display panel 603. The user can operate the operation buttons 604 and the touch panel to perform operations on the smartphone 610 and thereby call and execute necessary functions.

A speaker 605 is disposed in the vicinity of the other short side of the display panel 603. The speaker 605 provides an earpiece for a telephone function and is also used as an acoustic conversion unit for reproduction of music data and the like. On the other hand, near the operation buttons 604, a microphone 606 is disposed in one of the side surfaces of the casing 602. The microphone 606 provides a mouthpiece for the telephone function and may also be used as a microphone for sound recording.

Figure 63:
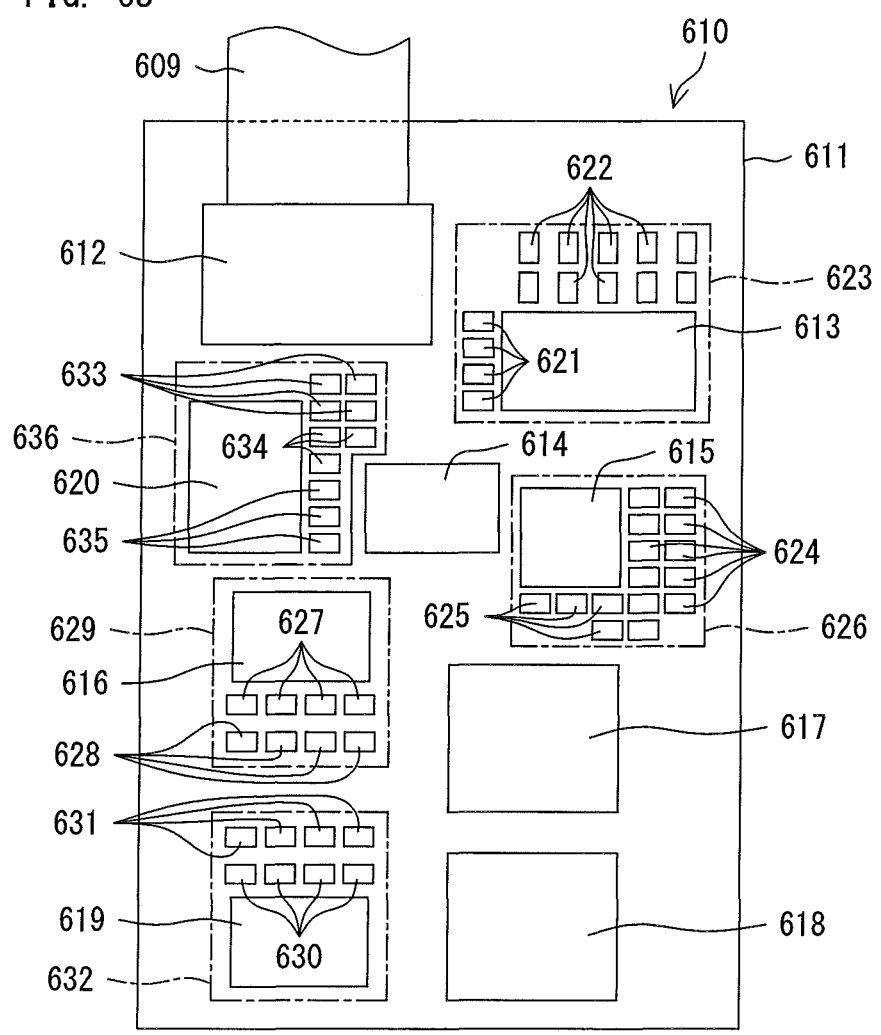
FIG. 63 is an illustrative plan view showing the configuration of an electronic circuit assembly housed in the casing of the smartphone.

FIG. 63 is an illustrative plan view showing the configuration of an electronic circuit assembly 610 housed inside the casing 602. The electronic circuit assembly 610 includes a wiring substrate 611 and circuit parts mounted on a mounting surface of the wiring substrate 611. The multiple circuit parts include multiple integrated circuit elements (ICs) 612 to 620 and multiple chip parts. The multiple ICs include a transmission processing IC 612, a one-segment TV receiving IC 613, a GPS receiving IC 614, an FM tuner IC 615, a power supply IC 616, a flash memory 617, a microcomputer 618, a power supply IC 619, and a baseband IC 620. The multiple chip parts include chip inductors 621, 625, 635, chip resistors 622, 624, 633, chip capacitors 627, 630, 634, and chip diodes 628, 631. The chip parts are mounted on the mounting surface of the wiring substrate 611 by, for example, flip-chip bonding. The chip diodes according to the above-described preferred embodiment of Reference Example 2 may be applied as the chip diodes 628, 631.

The transmission processing IC 612 has incorporated therein an electronic circuit arranged to generate display control signals for the display panel 603 and receive input signals through the touch panel on the surface of the display panel 603. For connection with the display panel 603, the transmission processing IC 612 is connected to a flexible wiring 609.

The one-segment TV receiving IC 613 has incorporated therein an electronic circuit that constitutes a receiver arranged to receive one-segment broadcast (digital terrestrial television broadcast targeted for reception by mobile devices) radio waves. Multiple chip inductors 621 and multiple chip resistors 622 are disposed in the vicinity of the one-segment TV receiving IC 613. The one-segment TV receiving IC 613, the chip inductors 621, and the chip resistors 622 constitute a one-segment broadcast receiving circuit 623. The chip inductors 621 and the chip resistors 622 have accurately adjusted inductances and resistances, respectively, and provide circuit constants of high precision to the one-segment broadcast receiving circuit 623.

The GPS receiving IC 614 has incorporated therein an electronic circuit arranged to receive radio waves from GPS satellites and output positional information of the smartphone 601.

The FM tuner IC 615 constitutes, together with multiple chip resistors 624 and multiple chip inductors 625 mounted on the wiring substrate 611 in the vicinity thereof, an FM broadcast receiving circuit 626. The chip resistors 624 and the chip inductors 625 have accurately adjusted resistances and inductances, respectively, and provide circuit constants of high precision to the FM broadcast receiving circuit 626.

Multiple chip capacitors 627 and multiple chip diodes 628 are mounted on the mounting surface of the wiring substrate 611 in the vicinity of the power supply IC 616. Together with the chip capacitors 627 and the chip diodes 628, the power supply IC 616 constitutes a power supply circuit 629.

The flash memory 617 is a storage device arranged to record operating system programs, data generated inside the smartphone 601, and data and programs acquired externally by communication functions, etc.

The microcomputer 618 is an operational processing circuit that has incorporated therein a CPU, a ROM, and a RAM and realizes multiple functions of the smartphone 601 by performing various types of operational processing. More specifically, operational processing for image processing and various application programs are realized through the operation of the microcomputer 618.

Near the power supply IC 619, multiple chip capacitors 630 and multiple chip diodes 631 are mounted on the mounting surface of the wiring substrate 611. Together with the chip capacitors 630 and the chip diodes 631, the power supply IC 619 constitutes a power supply circuit 632.

Near the baseband IC 620, multiple chip resistors 633, multiple chip capacitors 634, and multiple chip inductors 635 are mounted on the mounting surface of the wiring substrate 611. Together with the chip resistors 633, the chip capacitors 634, and the chip inductors 635, the baseband IC 620 constitutes a baseband communication circuit 636. The baseband communication circuit 636 provides communication functions for telephone communication and data communication.

With the arrangement above, electric power adjusted appropriately by the power supply circuits 629, 632 is supplied to the transmission processing IC 612, the GPS receiving IC 614, the one-segment broadcast receiving circuit 623, the FM broadcast receiving circuit 626, the baseband communication circuit 636, the flash memory 617, and the microcomputer 618. The microcomputer 618 performs operational processing in response to input signals input via the transmission processing IC 612 and causes display control signals to be output from the transmission processing IC 612 to the display panel 603 to make the display panel 603 perform various displays.

When the touch panel or the operation buttons 604 are operated for reception of a one-segment broadcast, the one-segment broadcast is received through the operation of the one-segment broadcast receiving circuit 623. The microcomputer 618 then performs operational processing for outputting received images to the display panel 603 and acoustically converting received sounds through the speaker 605.

Also, when positional information of the smartphone 601 is required, the microcomputer 618 acquires the positional information output from the GPS receiving IC 614 and performs operational processing using the positional information.

Further, when the touch panel or the operation buttons 604 are operated and an FM broadcast receiving command is input, the microcomputer 618 starts up the FM broadcast receiving circuit 626 and performs operational processing for outputting received sounds through the speaker 605.

The flash memory 617 is used to store data acquired through communications and to store data prepared by operations of the microcomputer 618 and inputs through the touch panel. The microcomputer 618 writes data into the flash memory 617 and reads data out of the flash memory 617 as necessary.

The telephone communication or data communication function is realized by the baseband communication circuit 636. The microcomputer 618 controls the baseband communication circuit 636 to perform processing for sending and receiving sounds or data.

Although the preferred embodiment of Reference Example 2 of the present invention has heretofore been described, the present invention may be implemented in yet other modes as well. For example, although the above-described preferred embodiment of Reference Example 2 describes an example in which four diode cells are formed on the semiconductor substrate, two or three diode cells may be formed or four or more diode cells may be formed on the semiconductor substrate. Alternatively, only one diode cell may be formed.

Although the above-described preferred embodiment of Reference Example 2 describes an example in which the pn junction regions are formed in a regular octagon in a plan view, the pn junction regions may be formed in any polygonal shape with three or more sides, and the planar geometry thereof may be circular or elliptical. The pn junction regions, if having a polygonal shape, may not necessarily have a regular polygonal shape and may be formed in a polygon with two or more types of side length. Yet further, there is no need to form the pn junction regions in the same size, and multiple diode cells having their respective junction regions of different sizes may be mixed on the semiconductor substrate. Moreover, the shape of the pn junction regions formed on the semiconductor substrate may not necessarily be of one type, and pn junction regions of two or more geometry types may be mixed on the semiconductor substrate.

It is noted that besides the inventions set forth in the claims, the following features can be extracted from the details of this preferred embodiment of Reference Example 2.

(Aspect 1) A chip diode with a Zener voltage Vz of 6.5 V to 9.0 V, including a semiconductor substrate having a resistivity of 10 mΩ·cm to 30 mΩ·cm and a diffusion layer formed on a surface of the semiconductor substrate and defining a diode junction region with the semiconductor substrate therebetween, in which the diffusion layer has a depth of 2 μm to 3 μm from the surface of the semiconductor substrate.

(Aspect 2) The chip diode according to aspect 1, in which the diode junction region is a pn junction region.

With the arrangement above, it is possible to provide a chip diode of a pn junction type.

(Aspect 3) The chip diode according to aspect 2, in which the semiconductor substrate is composed of a p-type semiconductor substrate, and in which the diffusion layer is an n-type diffusion layer defining the pn junction region with the p-type semiconductor substrate therebetween.

In accordance with the arrangement above, since the semiconductor substrate is composed of a p-type semiconductor substrate, it is possible to achieve stable characteristics without forming an epitaxial layer on the semiconductor substrate. That is, in the case of n-type semiconductor wafers, which have large in-plane resistivity variation, it is necessary to form an epitaxial layer, which has small in-plane resistivity variation on the surface and form an impurity diffusion layer on the epitaxial layer to define a pn junction. On the other hand, in the case of p-type semiconductor wafers, which have small in-plane variation, it is possible to cut a diode with stable characteristics out of any site of such a wafer without forming an epitaxial layer. Thus using a p-type semiconductor substrate can simplify the manufacturing process and reduce the manufacturing cost.

(Aspect 4) The chip diode according to aspect 3, further including a cathode electrode electrically connected to the n-type diffusion layer and an anode electrode electrically connected to the p-type semiconductor substrate, in which the anode electrode includes an electrode film composed of AlSiCu which is in contact with the p-type semiconductor substrate.

AlSiCu has a work function approximate to that of a p-type semiconductor (particularly a p-type silicon semiconductor), and therefore an AlSiCu electrode film can come into good ohmic contact with a p-type semiconductor. It is therefore not necessary to form a diffusion layer of a high impurity concentration for ohmic contact on the p-type semiconductor substrate. This can further simplify the manufacturing process and productivity can be improved and production costs can be reduced accordingly. An AlSi electrode film material may also be applied to an electrode film that can come into ohmic contact with a p-type semiconductor, but the AlSiCu electrode film can lead to a further improvement in reliability compared to the AlSi electrode film.

(Aspect 5) The chip diode according to any one of aspects 1 to 4, further including an insulating film covering the surface of the semiconductor substrate and formed with a contact hole for selective exposure of the diffusion layer, in which a recessed portion continuing to the contact hole is defined in the diffusion layer.

(Aspect 6) The chip diode according to aspect 5, further including a recessed portion insulating film formed selectively in a peripheral portion of the recessed portion.

(Aspect 7) The chip diode according to aspect 6, in which the recessed portion insulating film is formed across the boundary between the recessed portion and the contact hole.

(Aspect 8) The chip diode according to any one of aspects 1 to 7, in which the diffusion layer has a constant concentration profile to a predetermined depth from the surface of the semiconductor substrate.

(Aspect 9) The chip diode according to any one of aspects 1 to 8, in which the surface of the semiconductor substrate has a rectangular shape with round corner portions.

The arrangement above can reduce or prevent chipping of the corner portions of the chip diode and thereby can provide a chip diode with less possibility of poor appearance.

(Aspect 10) The chip diode according to aspect 9, in which a recessed portion indicating the cathode side is defined in a middle portion of one of the sides of the rectangular shape.

In accordance with the arrangement above, since a recessed portion indicating the cathode side is defined in one of the sides of the rectangular semiconductor substrate, it is not necessary to define a mark indicating the cathode side (cathode mark) by, for example, marking on the surface of the semiconductor substrate. The recessed portion may be defined at the same time during the process of cutting the chip diode out of a wafer (original substrate), and also can be defined even if the chip diode may have a small size and marking is difficult. It is therefore possible to skip the step of marking and provide a sign indicating the cathode side even in a small-sized chip diode.

(Aspect 11) A circuit assembly including a mounting substrate and a chip diode according to any one of aspects 1 to 10 mounted on the mounting substrate.

The arrangement above allows for providing a circuit assembly including a chip diode with a Zener voltage Vz controlled precisely to be from 6.5 V to 9.0 V.

(Aspect 12) The circuit assembly according to aspect 11, in which the chip diode is connected to the mounting substrate by wireless bonding.

The arrangement above can reduce the occupation space of the chip diode on the mounting substrate, contributing to high-density mounting of electronic parts.

(Aspect 13) An electronic device including a circuit assembly according to aspect 11 or 12 and a casing housing the circuit assembly therein.

The arrangement above allows for providing an electronic device including a chip diode with a Zener voltage Vz controlled precisely to be from 6.5 V to 9.0 V.

(Aspect 14) A method for manufacturing a chip diode with a Zener voltage Vz of 6.5 V to 9.0 V, including the steps of selectively introducing an impurity into a surface of a semiconductor substrate having a resistivity of 10 mΩ·cm to 30 mΩ·cm, forming a thermal oxide film on the surface of the semiconductor substrate in a manner covering at least the region in which the impurity is introduced, and, with the thermal oxide film covering the surface of the semiconductor substrate, performing a drive-in process to diffuse the impurity to thereby form a diffusion layer defining a diode junction region with the semiconductor substrate therebetween and having a depth of 2 μm to 3 μm from the surface of the semiconductor substrate.

With the method above, it is possible to manufacture a chip diode according to aspect 1. In accordance with the method above, since the thermal oxide film is formed before the drive-in process, the impurity (n-type impurity or p-type impurity) concentration in the surface portion of the semiconductor substrate can be reduced. In addition, the semiconductor substrate used has a resistivity of 10 mΩ·cm to 30 mΩ·cm. Thus, since the drive-in process is performed such that the impurity is diffused to a depth of 2 μm to 3 μm and the heat during the drive-in process is applied to the semiconductor substrate, it is possible to precisely control the Zener voltage Vz of the chip diode to be from 6.5 V to 9.0 V.

(Aspect 15) The method for manufacturing a chip diode according to aspect 14, in which the step of introducing the impurity includes the step of forming, on the surface of the semiconductor substrate, an insulating film formed with a contact hole for selective exposure of the surface and introducing the impurity via the contact hole, and in which the step of forming the thermal oxide film includes the step of selectively and thermally oxidizing the surface of the semiconductor substrate within the contact hole and causing the thermal oxide film to grow toward the other surface of the semiconductor substrate to define a recessed portion continuing to the contact hole in the semiconductor substrate.

(Aspect 16) The method for manufacturing a chip diode according to aspect 14 or 15, in which the semiconductor substrate is composed of a p-type semiconductor substrate, and in which the step of introducing the impurity includes the step of depositing an n-type impurity on the surface of the semiconductor substrate.

With the method above, the manufacturing cost can be reduced compared to the case of the introduction of the n-type impurity through ion implantation.

While the preferred embodiments of the present invention and the preferred embodiments of Reference Examples 1 and 2 of the present invention have heretofore been described, these are merely specific examples used to clarify the technical details of the present invention, and the present invention should not be construed as being limited only to these specific examples, and the spirit and scope of the present invention shall be limited only by the appended claims.

DESCRIPTION OF THE SYMBOLS

W semiconductor wafer
Wa device forming surface
1 chip diode
2 semiconductor substrate
2a device forming surface
4 anode electrode
4a anode electrode film
8 recessed portion (cathode mark)
9 corner portion
10 $n^+$-type region
11 pn junction region
25 mounting substrate
201 smartphone
202 casing
210 electronic circuit assembly
228 chip diode
231 chip diode

The invention claimed is:
1. A chip diode with a Zener voltage Vz of 5.5 V to 7.0 V, comprising:
a semiconductor substrate having a resistivity of 5 mΩ·cm to 20 mΩ·cm;
a diffusion layer formed on a surface of the semiconductor substrate;
a diode junction region formed between the diffusion layer and the semiconductor substrate;
an insulating film formed on the semiconductor substrate;
a first electrode layer formed on the insulating film, and being connected to the diffusion layer, the first electrode layer having a first pad, the first electrode layer further having a first extending electrode portion and a second extending electrode portion, both of which extend parallel to each other from the first pad and are rimmed with a slit;
a second electrode layer formed on the insulating film, and being connected to the semiconductor substrate, the second electrode layer being electrically disconnected from the first electrode layer by the slit, the second electrode layer having a second pad, the second electrode layer further having a third extending electrode portion, a fourth extending electrode portion, and a fifth extending electrode portion;
a passivation film covering the first electrode layer and the second electrode layer such that the first pad and the second pad are exposed from the passivation film;
a first electrode connected to the first pad through the passivation film; and
a second electrode connected to the second pad through the passivation film, wherein
the third extending electrode portion extends inside the slit such that the third extending electrode portion is sandwiched between the first extending electrode portion and the second extending electrode portion,
the fourth extending electrode portion extends along the first extending electrode portion on an opposite side to the slit,
the fifth extending electrode portion extends along the second extending electrode portion on the opposite side to the slit,
the first pad has a first edge and a second edge which face each other in a first direction intersecting a direction of the extension of the first extending electrode portion and the second extending electrode portion,
the fourth extending electrode portion has a first side formed on a same line as the first edge of the first pad,
the fifth extending electrode portion has a second side formed on a same line as the second edge of the first pad,
the insulating film has a contact hole for selectively exposing a surface of the diffusion layer,
the chip diode further comprises:
a first recessed portion continuing to the contact hole and being defined in the diffusion layer, and a recessed portion insulating film selectively formed in a peripheral portion of the first recessed portion, wherein the recessed portion insulating film is formed across a boundary between the first recessed portion and the contact hole such that the recessed portion insulating film has an upper end surface positioned at a lower level than an upper surface of the insulating film.

2. The chip diode according to claim 1, wherein the diode junction region is a pn junction region.

3. The chip diode according to claim 2, wherein
the semiconductor substrate is composed of a p-type semiconductor substrate,
the diffusion layer is an n-type diffusion layer, and
the diode junction region includes the pn junction region formed between the n-type diffusion layer and the p-type semiconductor substrate.

4. The chip diode according to claim 3, wherein
the first electrode is a cathode electrode electrically connected to the n-type diffusion layer; and
the second electrode is an anode electrode electrically connected to the p-type semiconductor substrate, wherein
the n-type diffusion layer has a depth of 0.7 µm to 3.0 µm and the second electrode layer includes an electrode film composed of AlSiCu which is in contact with the p-type semiconductor substrate.

5. The chip diode according to claim 3, wherein
the first electrode is a cathode electrode electrically connected to the n-type diffusion layer; and
the second electrode is an anode electrode electrically connected to the p-type semiconductor substrate, wherein
the n-type diffusion layer has a depth of 0.2 µm to 0.7 µm, and
the second electrode layer includes an electrode film composed of a Ti/Al laminated film or a Ti/TiN/AlCu laminated film which is in contact with the p-type semiconductor substrate.

6. The chip diode according to claim 1, wherein the diffusion layer has a concentration profile of an impurity, the concentration profile continuously decreasing from the surface to a predetermined depth of the semiconductor substrate.

7. The chip diode according to claim 1, wherein the semiconductor substrate has a rectangular shape with round corner portions in a plan view.

8. The chip diode according to claim 7, wherein a second recessed portion indicating a cathode side is disposed in a middle portion of one of sides of the rectangular shape.

9. A circuit assembly comprising a mounting substrate and the chip diode according to claim 1 mounted on the mounting substrate.

10. The circuit assembly according to claim 9, wherein the chip diode is connected to the mounting substrate by wireless bonding.

11. An electronic device comprising the circuit assembly according to claim 9 and a casing housing the circuit assembly therein.

12. The chip diode according to claim 1, wherein
a step portion is formed inside the contact hole such that the step portion is defined by the upper end surface of the recessed portion insulating film and a side surface of the contact hole,
at least one of a part of the first extending electrode portion and a part of the second extending electrode portion is disposed in the step portion such that the one of the part of the first extending electrode portion and the part of the second extending electrode portion is in contact with the upper end surface of the recessed portion insulating film and a side surface of the contact hole.

13. The chip diode according to claim 1, wherein the second electrode layer formed on the insulating film has a direct ohmic connection to the semiconductor substrate.

14. A method for manufacturing a chip diode with a Zener voltage Vz of 5.5 V to 7.0 V comprising the steps of:
selectively introducing an impurity into a surface of a semiconductor substrate having a resistivity of 5 mΩ·cm to 20 mΩ·cm;
forming an insulating film having a contact hole for selectively exposing the surface of the semiconductor substrate on the semiconductor substrate;
forming a thermal oxide film on the surface of the semiconductor substrate in a manner covering at least a region exposed from the contact hole;
introducing the impurity via the contact hole into the semiconductor substrate;
with the thermal oxide film covering the surface of the semiconductor substrate, performing a heat treatment to diffuse the impurity to thereby form a diffusion layer on the surface of the semiconductor substrate and form a diode junction region between the diffusion layer and the semiconductor substrate;
forming a first electrode layer on the insulating film so as to be connected to the diffusion layer, the first electrode layer having a first pad, the first electrode layer further having a first extending electrode portion and a second extending electrode portion, both of which extend parallel to each other from the first pad and are rimmed with a slit;
forming a second electrode layer on the insulating film so as to be connected to the semiconductor substrate and to be electrically disconnected from the first electrode layer by the slit, the second electrode layer having a second pad, the second electrode layer further having a third extending electrode portion, a fourth extending electrode portion, and a fifth extending electrode portion;
forming a passivation film so as to cover the first electrode layer and the second electrode layer and so as to expose the first pad and the second pad from the passivation film;
forming a first electrode so as to be connected to the first pad through the passivation film; and
forming a second electrode so as to be connected to the second pad through the passivation film, wherein
the third extending electrode portion extends inside the slit such that the third extending electrode portion is sandwiched between the first extending electrode portion and the second extending electrode portion,
the fourth extending electrode portion extends along the first extending electrode portion on an opposite side to the slit,
the fifth extending electrode portion extends along the second extending electrode portion on the opposite side to the slit,
the first pad has a first edge and a second edge which face each other in a first direction intersecting a direction of the extension of the first extending electrode portion and the second extending electrode portion,
the fourth extending electrode portion has a first side formed on a same line as the first edge of the first pad,
the fifth extending electrode portion has a second side formed on a same line as the second edge of the first pad, the forming the thermal oxide film includes selectively and thermally oxidizing the surface of the semiconductor substrate within the contact hole and causing the thermal oxide film to grow toward another surface of the semiconductor substrate to define a recessed portion continuing to the contact hole in the semiconductor substrate, and the method for manufacturing the chip diode further comprises the step of forming a recessed portion insulating film in a peripheral portion of the recessed portion so as to be across a boundary between the recessed portion and the contact hole and to have an upper end surface positioned at a lower level than an upper surface of the insulating film.

15. The method for manufacturing the chip diode according to claim 14, wherein the semiconductor substrate is composed of a p-type semiconductor substrate, and the introducing the impurity includes ion-implanting an n-type impurity into the surface of the semiconductor substrate.

16. The method for manufacturing the chip diode according to claim 14, wherein the forming of the diffusion layer includes performing a drive-in process on the semiconductor substrate such that the diffusion layer has a depth of 0.7 μm to 3.0 μm.

17. The method for manufacturing the chip diode according to claim 14, wherein the forming the diffusion layer includes performing an RTA (Rapid Thermal Annealing) process on the semiconductor substrate such that the diffusion layer has a depth of 0.2 μm to 0.7 μm.

18. The method for manufacturing the chip diode according to claim 14, wherein the step of forming a second electrode layer further comprises forming the second electrode layer on the insulating film to have a direct ohmic connection to the semiconductor substrate.

\* \* \* \* \*